United States Patent [19]
Kajiwara et al.

[11] Patent Number: 5,788,513
[45] Date of Patent: Aug. 4, 1998

[54] IC SOCKET

[75] Inventors: Yasushi Kajiwara; Kazuhisa Ozawa, both of Kawaguchi, Japan

[73] Assignee: Enplas Corporation, Kawaguchi, Japan

[21] Appl. No.: 585,300

[22] Filed: Jan. 11, 1996

[30] Foreign Application Priority Data

| Jan. 11, 1995 | [JP] | Japan | 7-002766 |
| Jan. 13, 1995 | [JP] | Japan | 7-004370 |
| Jan. 17, 1995 | [JP] | Japan | 7-022241 |
| Mar. 2, 1995 | [JP] | Japan | 7-043067 |
| Mar. 7, 1995 | [JP] | Japan | 7-046921 |

[51] Int. Cl.$^6$ .............................. H01R 9/09; H01R 23/72
[52] U.S. Cl. .............................. 439/72; 439/487; 439/331
[58] Field of Search .............................. 439/70, 71, 72, 439/73, 479, 331

[56] References Cited

U.S. PATENT DOCUMENTS

| 4,887,969 | 12/1989 | Abe ............................ 439/73 |
| 4,984,991 | 1/1991 | Nishimoto ................. 439/72 |
| 5,240,421 | 8/1993 | Uratsuji ...................... 439/72 |
| 5,389,819 | 2/1995 | Matsuoka ................... 439/71 |
| 5,407,361 | 4/1995 | Ikeya .......................... 439/72 |
| 5,647,750 | 7/1997 | Tran et al. ................. 439/72 |

FOREIGN PATENT DOCUMENTS 6-188339   7/1994   Japan .

*Primary Examiner*—Neil Abrams
*Attorney, Agent, or Firm*—Cushman Darby & Cushman IP Group of Pillsbury Madison & Sutro LLP

[57] ABSTRACT

An IC socket (FIGS. 2, 14) is provided with a core block (9) for supporting a multitude of contact pins (13, 14). A TAB package including a chip (T) and a film (PCB) having lead terminals arranged at a fine pitch is to be placed into the socket for engagement with upper ends of the contacts (13, 14) and is to be pressed downwardly by a cover (2). Inner and outer floating and vertically displaceable members (10, 11) are spring biased upwardly against the TAB package and separating members (12) are located along each side of the socket and are floatably supported by upper ends of the contact pins (13, 14). The separating members (12) include series of ribs (12e, 12f) on opposite sides for maintaining alignment of the upper ends of the contact pins. The socket also includes heat transfer pins (8). The core plate (9) includes ribs (9f, 9g, 9h, 9i, 9j) for positioning central sections of the contact pins (13, 14). In another embodiment (FIGS. 21, 33, 34) an inner floating member (17) and an outer floating member (18) are each formed with series of ribs (17f, 18c) for alignment of upper ends (21d, 21f) of the contacts (20, 21). The floating members (17, 18) may be integrally joined by pins (19). In other embodiments, (FIGS. 52, 54, 58, 60, 61) a floating member (46) biased upwardly by a spring (23) and a group of floatably supported separating members (47, 48) are each formed with series of ribs for alignment of upper ends of the contacts.

18 Claims, 41 Drawing Sheets

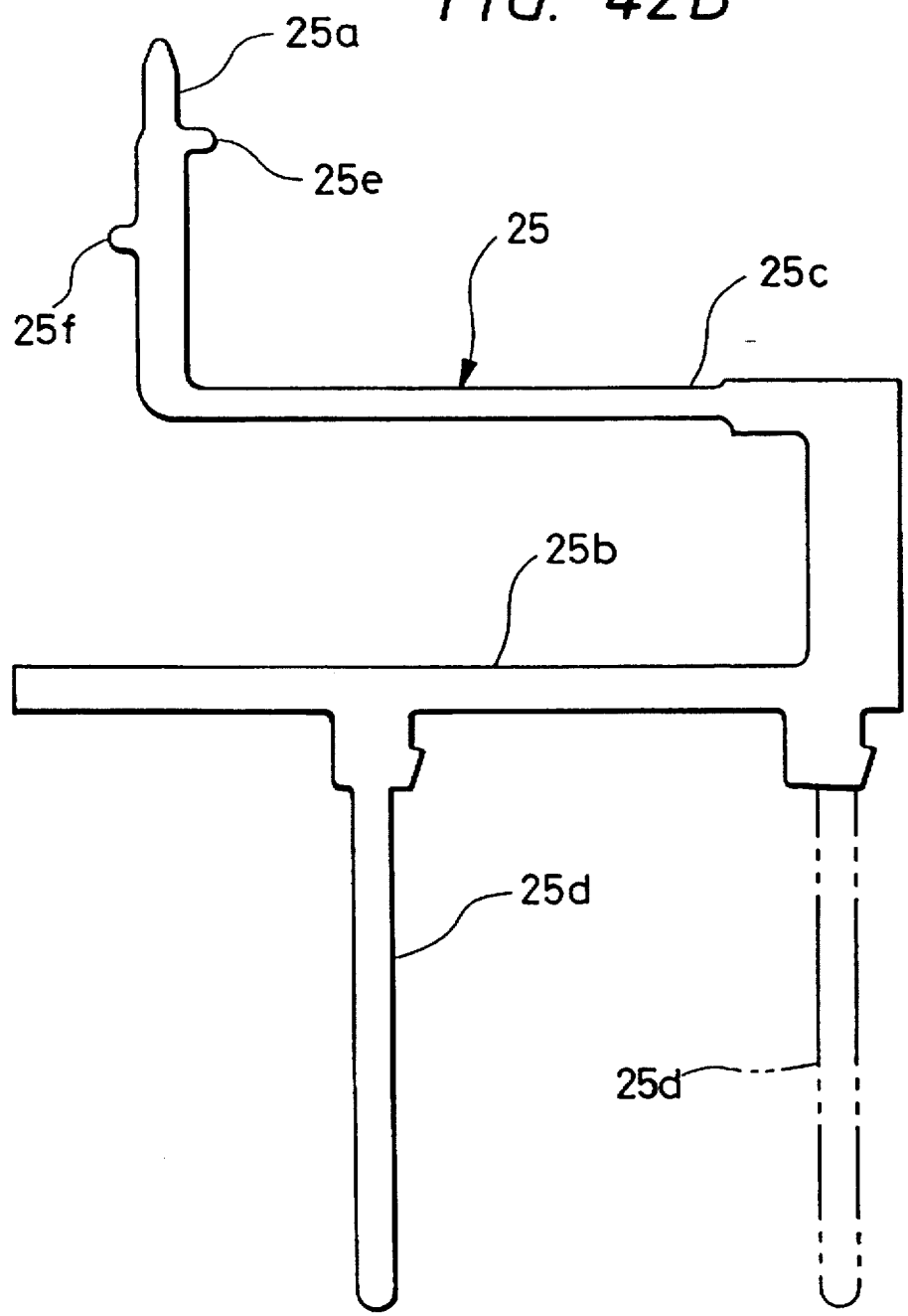

IC SOCKET

BACKGROUND OF THE INVENTION a) Field of the Invention

The present invention relates to an IC socket used for inspection of IC devices' such as IC packages, and specifically to an IC socket usable for inspection of IC packages having a plurality of lead terminals arranged at a fine pitch.

b) Description of the Prior Art

An IC socket has a number of contact members, known as contact pins, arranged at the same pitch as that of a lead terminal array of an IC device to be tested. Each contact pin is formed to be brought into contact, at one end thereof, with a lead terminal of an IC device, while the other end of the contact pin is made to be electrically connected with a printed circuit board on which the IC socket is to be mounted. In order to assure steady contact of the IC device end of a contact pin with a lead terminal of the IC device loaded in the IC socket, there is formed a spring section between the IC-device end and the circuit-board end of the contact pin to allow the IC-device end to be movable. The contact pin usually is made to have a thickness of more than 0.1 mm, because a thinner contact pin would have difficulty in creating sufficient elastic force in the spring section. Usually, a thin division wall (hereinafter refered to as a rib) is provided near the IC-device end of each contact pin so that adjacent contact pins do not contact one another. In some cases, these ribs are integrally formed with the IC socket body out of synthetic resin. In recent years, however, a separate assembly of synthetic resin, in which a plurality of ribs are arranged, is joined to the IC socket body. Such an assembly is called a floating member, for it is reciprocated in a direction of insertion/removal of IC devices each time one IC device is replaced by another. When ribs having approximately 3 mm height are to be formed in one row, 0.2-0.3 mm is usually considered as a lower limit thickness of the ribs. There are, however, many problems to be solved in manufacturing ribs having thickness and inter-rib size less than this limit value and thus prior attempts to provide an inexpensive IC socket have been unsuccessful.

On the other hand, IC devices have been developed so as to be further integrated and further reduced in size, thus rapidly making their lead terminals arranged at more and more fine pitch. At the present stage, development of IC sockets cannot keep pace with the rapid compact-sizing of IC devices as to provide practical and inexpensive IC sockets for inspecting the IC devices. Therefore, in order to ease adaptation of an IC socket, solutions have been proposed in which lead terminals, specifically those of TAB (Tape Automated Bonding) packages are extended to have otherwise unnecessary length and are arranged zigzag in two rows around four sides of the IC chip, as disclosed by Japanese Patent Preliminary Publication No. Hei 6-188339, thereby making interterminal pitch per row less fine. Such an arrangement, however, does not provide a satisfactory solution, thus TAB packages in which lead terminals are arranged zigzag in three or four rows are under consideration.

A primary cause which prevents development of a practical and inexpensive IC socket for inspection is that it is difficult to form practical ribs to be used as mentioned above out of synthetic resin. Recent IC devices may have, at finest, the interterminal pitch of 0.2-0.25 mm, with lead terminals of 0.1-0.15 mm width, which size substantially coincides with the thickness of the contact pins of the IC socket above mentioned. Accordingly, the airspace between adjacent lead terminals becomes 0.1-0.15 mm. Therefore, it is physically impossible to form the ribs having the above mentioned thickness so that they are accomodated in these airspaces.

To measures to enable an IC socket to cope with the fine interterminal pitch of IC devices, two typical methods are conventionally known. According to one method, contact pins themselves are processed so that an insulating film is locally formed on one side or both sides thereof, while no member intervenes between the contact pins. According to another method, a thin metal plate of 0.6 mm thickness having a polyimide film glued on one or both surfaces thereof, is arranged between contact pins.

To apply the former method, in the first process, pieces shaped as contact pins are stamped by a press machine out of a hoop material on which an insulating film locally formed, in such a manner that the pieces are not completely cut away off the hoop material. Then a plated layer is formed without break over a predetermined portion of the pieces as contact pins by plating. In the last process, the pieces are completely cut away off the hoop material to form individual unit devices. As described above, this method involves a considerable number of manufacturing processes. Moreover, process control of this method for assuring uniform thickness over an entire contact pin is very difficult, because the insulating film is liable to bend off. On the other hand, since the latter method requires the thin minute metal plates to be fixed one by one manually, assembly costs can increase dramatically.

SUMMARY OF THE INVENTION

A primary object of the present invention is to provide an IC socket which allows contact pins to be steadily attached thereto in an array of less than 0.2 mm pitch width, upon taking the processing fineness and the strength of ribs formed of synthetic resin into consideration.

Another object of the present invention is to provide a reliable IC socket free from erroneous operation, in spite of contact pins thereof arranged at a fine pitch.

Still another object of the present invention is to provide an IC socket which can be manufactured at relatively low cost, in spite of contact pins thereof arranged at a fine pitch.

In order to attain the above mentioned objects, an IC socket according to the present invention includes: a separator member having a first ribs-row formed on one side face thereof and a second ribs-row formed on the opposite side face thereof, ribs in the first ribs-row and ribs in the second ribs-row being arranged to keep an alternate positional relationship; a plurality of first contact pins with elasticity, each having its free end section, which forms a contact portion at an end, engaged between the ribs in the first ribs-row; a plurality of second contact pins with elasticity, each having its free end section, which forms a contact portion at an end, engaged between the ribs in the second ribs-row, wherein the separator member is floatingly held by the first contact pins and the second contact pins.

Also according to the present invention, an IC socket comprises: a separator member having a first ribs-row formed on one side face thereof and a second ribs-row formed on the opposite side face thereof, ribs in the first ribs-row and ribs in the second ribs-row being arranged to keep an alternate positional relationship; a core plate member fixed to a socket body and having a third ribs-row and a fourth ribs-row formed on each of surfaces thereof opposite to each other so that ribs in the third ribs-row and ribs in the fourth ribs-row are arranged to keep an alternate positional relationship; a plurality of first contact pins each being substantially U-shaped as having two legs, the two legs having respective engagement portions to be engaged between the ribs in the third ribs-row on the respective surfaces of the core plate member, one of the legs forming a contact portion at a free end section thereof, and the other leg having a connecting terminal; a plurality of second contact pins each being substantially U-shaped as having two legs, the two legs having respective engagement portions to be engaged between the ribs in fourth ribs-row on the respective surfaces of the core plate member, one of the legs forming a contact portion at a free end section thereof, and the other leg having a connecting terminal, wherein the free end sections of the first contact pins and the free end sections of the second contact pins are engaged respectively between the ribs in the first ribs-row and between the ribs in the second ribs-row of the separator member so as to hold the separator member.

Also in an IC socket according to the present invention, the first contact pins and the second contact pins are arranged on the socket body so as to lie on their lateral side of U shape, the separator member is located so that each rib included in the first and second ribs-rows runs vertically, each free end section of the first and second contact pins is provided with abutting portions which are allowed to meet the separator member respectively from the upper side and from the lower side of the separator member.

Also in an IC socket according to the present invention, the substantial U shape of the first contact pins is formed larger than that of the second contact pins, the first ribs-row and the second ribs-row formed on each of the surfaces of the core plate member are located close to each other, the connecting terminals of the first contact pins and the second contact pins are formed at such positions as to avoid side-by-side arrangement of connecting terminals of adjacent contact pins, and an escape section is formed on one of the lower side leg of the first contact pin and the connecting terminal of the second contact pin so as to avoid mutual contact.

Also in an IC socket according to the present invention, the contact portions of the first contact pins and the contact portions of the second contact pins are arranged in two separate rows to form a zigzag array as a whole.

In order to attain the above mentioned objects, an IC socket according to the present invention includes: a floating member mounted to a socket body so as to be vertically displaceable relative thereto and provided with a first ribs-row and a second ribs-row which include a plurality of ribs arranged to keep an alternate positional relationship between the two rows; a core block fixed to the socket body at a position under the floating member and having a first mount face and a second mount face; a plurality of first contact pins each forming a spring section between a free end section having a contact portion and a base section having a connecting terminal, the free end section of the first contact pin being fitted between the ribs in the first ribs-row, and the base section of the first contact pin being mounted on the first mount face of the core block; a plurality of second contact pins each forming a spring section between a free end section having a contact portion and a base section having a connecting terminal, the free end section of the second contact pin being fitted between the ribs in the second ribs-row, and the base section of the second contact pin being mounted on the second mount face of the core block.

Also in an IC socket according to the present invention, a plurality of the core blocks are arranged on the circumference of a body of an IC device loaded, each of the core blocks being constructed as a member forming its longer side in each direction along the ribs-rows of the floating member with the first mount face and the second mount face being formed on surfaces thereof opposite to each other, and the floating member comprises a first floating member having the first ribs-row and a second floating member having the second ribs-row, the first floating member being mounted to the socket body so as to be vertically displaceable relative thereto and the second floating member being integrally fixed to the first floating member.

In order to attain the above mentioned objects, an IC socket according to the present invention includes: a floating member mounted to the socket body so as to be vertically displaceable relative thereto and having an opening corresponding to a region where lead terminals of an IC device are arranged zigzag in three or more rows; a plurality of contact pins, each of which forms a spring section between a free end section having a contact portion to be brought into contact with a lead terminal of the IC device through the opening of the floating member and a base section having a connecting terminal, arranged so that the contact portions thereof form a zigzag array in three or more rows; and a core block mounted on the socket body at a position under the floating member, wherein the core block includes a plurality of plate pieces layered, and a plurality of ribs are formed on each of selected surfaces of the plate pieces, which are selected to correspond to respective rows of the zigzag array of the contact pins, for regulating intervals between base sections of contact pins arranged in a same row.

Also in an IC socket according to the present invention, phases of pitch of the ribs are orderly shifted among the selected surfaces of the plate pieces by a pitch width of the entire array of the contact pins in accordance with the order of zigzag arrangement of the contact pins.

Also in an IC socket according to the present invention, the core block comprises layers of a plate piece forming the ribs on its upper and lower surfaces and a plate piece forming the ribs on its upper or lower surface, or comprises layers of plate pieces each forming the ribs on upper or lower surface of the same, or alternatively, comprises layers of plate pieces each froming the ribs on upper and lower surfaces of the same. On an outer side face of each of the plate pieces, a plurality of vertical ribs are formed for regulating intervals between spring sections of contact pins in one row, which row is held to the outer side face of the plate piece.

Also in an IC socket according to the present invention, the socket body includes a base plate mounting the core block and an enclosure wall enclosing the outer side of the core block, inside face of the enclosure wall being provided with a plurality of vertical ribs for regulating intervals between spring sections of contact pins in one row held to the enclosure wall.

In order to attain the above mentioned objects, an IC socket according to the present invention includes: a floating member forming a ribs-row along at least one longitudinal side edge of its slot and mounted to a socket body so as to be displaceable relative thereto; a plurality of contact pins, each of which has a free end section having a contact portion, a base section having a connecting terminal for an external circuit and a spring section formed between the free end section and the base section, arranged so that the contact portions thereof are arranged in separate rows to form a plurality of pins-rows; and at least one separator member having a first ribs-row and a second ribs-row arranged with their phases being mutually shifted and respectively engaged with two of the pins-row so that the separator member is held thereby and therebetween, wherein the contact portions of contact pins in at least one of the two pins-rows holding the separator member therebetween are engaged with the ribs-row of the floating member and the contact portions of at least one of the remaining pins-rows are inserted in the slot of the floating member.

Also, an IC socket according to the present invention includes: a floating member forming a ribs-row along one side edge of its slot and mounted to a socket body so as to be displaceable relative thereto; a plurality of contact pins, each of which has a free end section having a contact portion, a base section having a connecting terminal for an external circuit and a spring section formed between the free end section and the base section, arranged so that the contact portions thereof are arranged in separate rows to form a first pins-row and a second pins-row; and a separator member having a first ribs-row and a second ribs-row arranged with their phases being mutually shifted and respectively engaged with the first pins-row and the second pins-row so that the separator member is held thereby and therebetween, wherein the contact portions of the contact pins in the first pins-row are engaged with the ribs-row of the floating member and the contact portions of the contact pins in the second pins-row are inserted in the slot of the floating member.

Also, an IC socket according to the present invention includes: a floating member having a first ribs-row and a second ribs-row formed respectively along respective side edges of its slot with their phases being mutually shifted, and mounted to a socket body so as to be displaceable relative thereto; a plurality of contact pins, each of which has a free end section having a contact portion, a base section having a connecting terminal for an external circuit and a spring section formed between the free end section and the base section, arranged so that the contact portions thereof are arranged in separate rows to form a first, second and third pins-rows; and a separator member having a third ribs-row and a fourth ribs-row arranged with their phases mutually shifted and respectively engaged with one of the first pins-row and the third pins-row and the second pins-row so that the separator member is held thereby and therebetween, wherein the contact portions of the contact pins in the first pins-row are engaged with the first ribs-row of the floating member, the contact portions of the contact pins in the second pins-row are inserted in the slot of the floating member, and the contact portions of the contact pins in the third pins-row are engaged with the row of the second ribs-row of the floating member.

In order to attain the above mentioned objects, an IC socket according to the present invention includes a plurality of contact pins, each of which is approximately U shaped as having a first leg provided with a contact portion to be brought into contact with electronic devices, a second leg provided with a connecting terminal for an external circuit and a spring section provided between the first leg and the second leg, arranged so that the contact portions thereof are arranged in separate rows to form a plurality of pins-rows, wherein the first leg of the plurality of contact pins are shiftedly located among the pins-rows in a direction substantially parallel to each of the rows. Even if torsion is applied to the contact pins in accordance with loading of an electronic device, this configuration prevents the contact pins from mutual contact.

Also in an IC socket according to the present invention, the plurality of contact pins are shaped so that an interval between the first leg and the second leg of each contact pin in at least one pins-row is equal to or different from that of each contact pin in another one of the pins-rows, and contact pins in at least one of the plurality of pins-rows and contact pins in another one of the pins-rows are allowed to be mounted to the core block, which is to be fixed to the socket body, with their respective second legs fitted respectively between a plurality of ribs formed on one surface of the core block and between a plurality of ribs formed on another surface of the core block. This configuration allows the plurality of contact pins to be mounted to the socket body after being mounted to the core block, thus the assembling work is reduced to be simple.

These and other objects as well as features and advantages of the present invention will become apparent in the following description of the preferred embodiments when taken in conjunction with the accompanying drawings.

BRIEF DESCRIPTION OF THE DRAWINGS

FIGS. 42A–42C are side views of types of contact pins used for the FIG. 37 embodiment to show their shapes.

DESCRIPTION OF THE PREFERRED EMBODIMENTS

Through the following description of embodiments, identical symbols will denote substantially identical or similar members.

One embodiment of the present invention will be described using FIG. 1 through FIG. 20.

Figure 2:
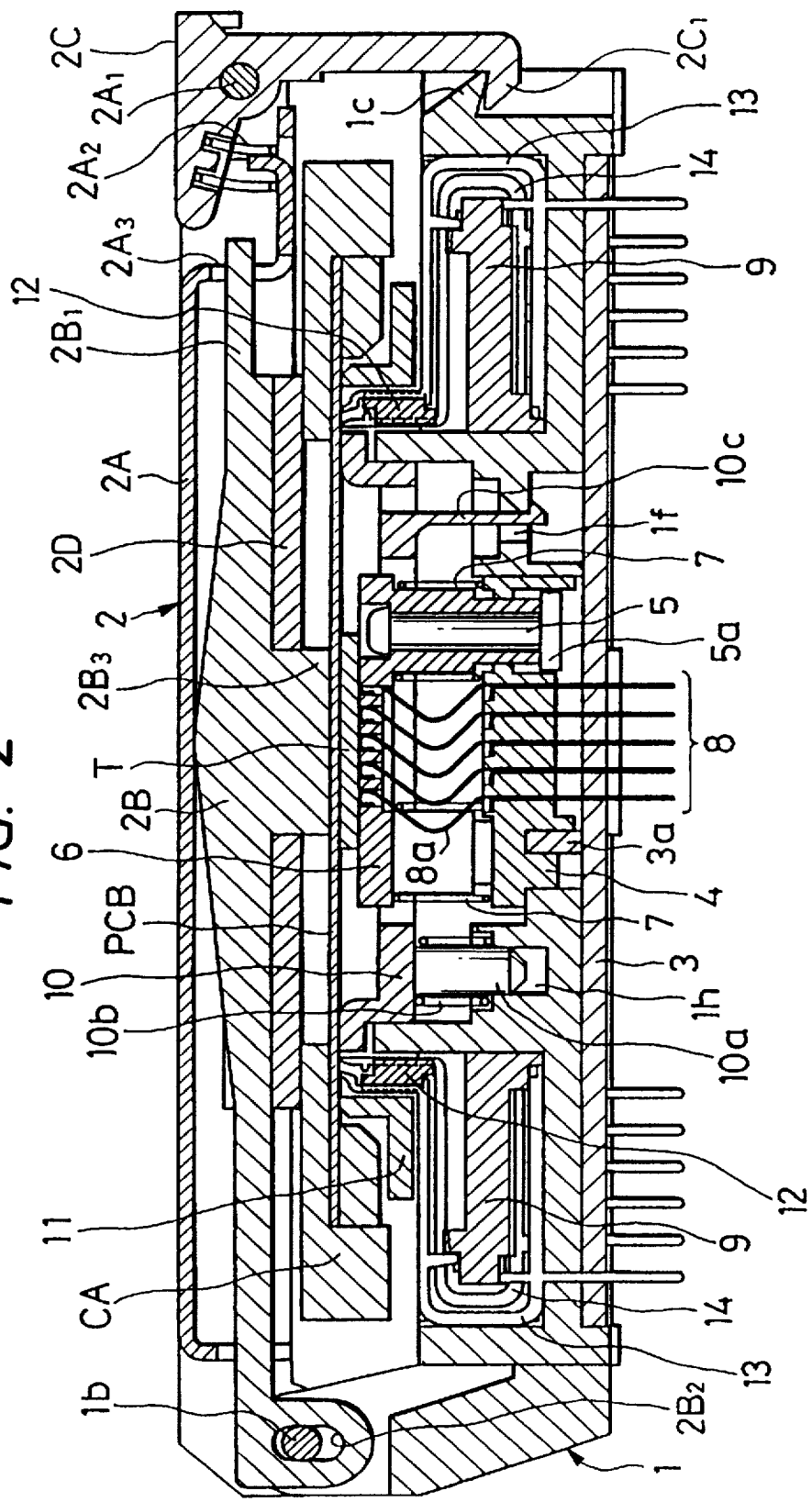
FIG. 2 is a sectional view of the IC socket of the FIG. 1 embodiment taken along the line 2—2 of FIG. 1, illustrating a state where the cover is closed upon loading of an IC device.

This embodiment is shown as an IC socket for abovementioned TAB packages. Although the TAB package is so well known as to need no detailed explanation, its configuration is roughly described as follows. In the TAB package, as shown in FIG. 2, a square IC chip T is located in the center of a printed wiring film PCB which is provided with a plurality of lead terminals arranged along four sides thereof, and the TAB package has a frame CA which is denominated "carrier" on the four sides of the film for convenience in handling during manufacturing.

The lead terminals of the TAB package, not apparently seen in the drawing, are arranged in two rows along each side of the frame CA so as to be alternately positioned to form a zigzag array. At positions on the periphery of the frame CA, three notches not shown in the drawing are formed for allowing the package to be loaded in an IC socket in a predetermined posture without erronous positioning. The printed wiring film PCB has reference holes formed in four substantial corners near the frame CA, for limiting its position when loaded.

According to the embodiment, for the loading of such a TAB package, a cover 2 is attached to a socket body 1 in such a manner as allows opening-closing operation. Specifically, the socket body 1 is provided with a shaft 1b shown in FIG. 2 which is fitted in two holes 1a shown in FIG. 1, and a cover frame 2A and a pressing plate 2B are mounted to the shaft 1b to be enabled to swing. The cover frame 2A is urged by a spring not shown in the drawings in a counterclockwise direction on the figure surface of FIG. 2. A hook member 2C is mounted to a shaft 2A1, which is provided at an end section of the cover frame 2A, to be enabled to swing and is urged by a spring 2A2 in a crockwise direction. While FIG. 2 shows a state where the loading condition is maintained by engagement of a hook portion 2C1 of the hook member 2C with a hook portion 1c of the socket body 1, the engangement is released and the cover 2 is opened when the hook member 2C is pushed from upside against the spring 2A2.

The pressing plate 2B is mounted to the shaft 1b at its slots 2B2, and its end section 2B1 is loosely inserted in a hole 2A3 of the cover frame 2A. In an substantial center of the pressing plate 2B, a pressing section 2B3 is formed for pressing downward the IC chip T of the TAB package. To the pressing plate 2B, an auxiliary pressing plate 2D having a through section for the pressing section 2B3 is fitted, for pressing downward the frame CA of the TAB package. This structure of the cover frame 2A and the pressing plate 2B is designed to moderate force which is obliquely applied to the TAB package by the swing of the cover 2 during the loading operation of the TAB package, thereby the pressing force being applied substantially in a vertical direction.

As shown in FIG. 2, on the lower side of the socket body 1, a locating board 3 is mounted to a middle plate 4, which is fixed to the socket body, so as to be vertically displaceable relative thereto using pins 3a as guides. To the middle plate 4, a movable stage 6 is attached so as to be vertically movable via four shafts 5 fixed by caulking. The movable stage 6 is urged upward by springs 7 wound around the shafts 5, with its upper limit position regulated by flanges 5a of the shafts 5. Twenty-five high heat transfer pins 8 are fixed to the middle plate 4, with ends of bending sections on the upper part thereof being fitted in twenty-five holes 6a shown in FIG. 1 formed in the movable stage 6, while Lower ends thereof piercing through the locating board 3 to be connected with a printed circuit board not shown, thereby the ends of the bending sections being brought into contact with the IC chip T as the TAB package is loaded so that heat generated at the IC chip T is transferred to the printed circuit board.

Figure 3:
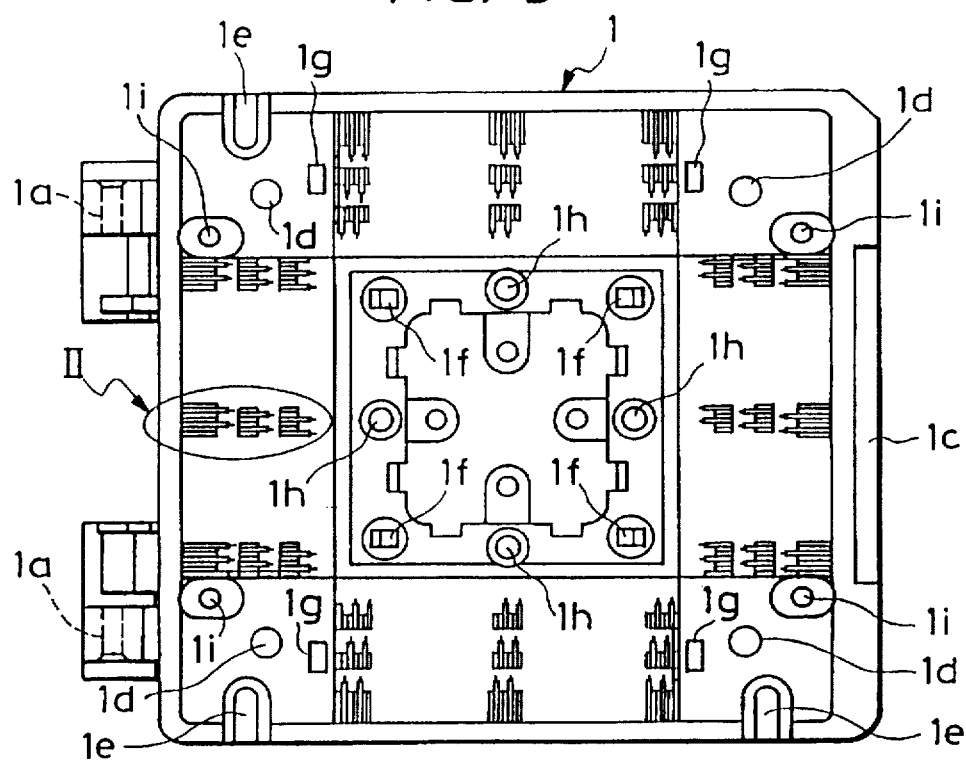
FIG. 3 is a plan view of a socket body according to the FIG. 1 embodiment.

The top side of the socket body 1 is shown in FIG. 3, where four holes 1d are to be used for mounting to the printed circuit board. D type pins 1e are to be fitted in the notches, which are formed on the frame CA of the TAB package for preventing the TAB package from erroneous loading as mentioned before. Holes 1f and holes 1g each arranged at four positions are to be engaged with respective hook portions of an inner floating member 10 and an outer floating member 11 described later herewith. Four non-through holes, or recesses 1h are formed on the socket body 1 to act as guide holes by receiving pins of the later described inner floating member 10 to allow vertical movement of the inner floating member 10. Along four sides of the socket body 1, a number of ribs to be engaged with contact pins and a number of perforations to allow the connecting terminals of the contact pins to pierce the socket body are formed. Their patterns of arrangement will be described later. Four holes 1i are to be used for fixing a core plate, which will be described below, by caulking.

Figure 4:
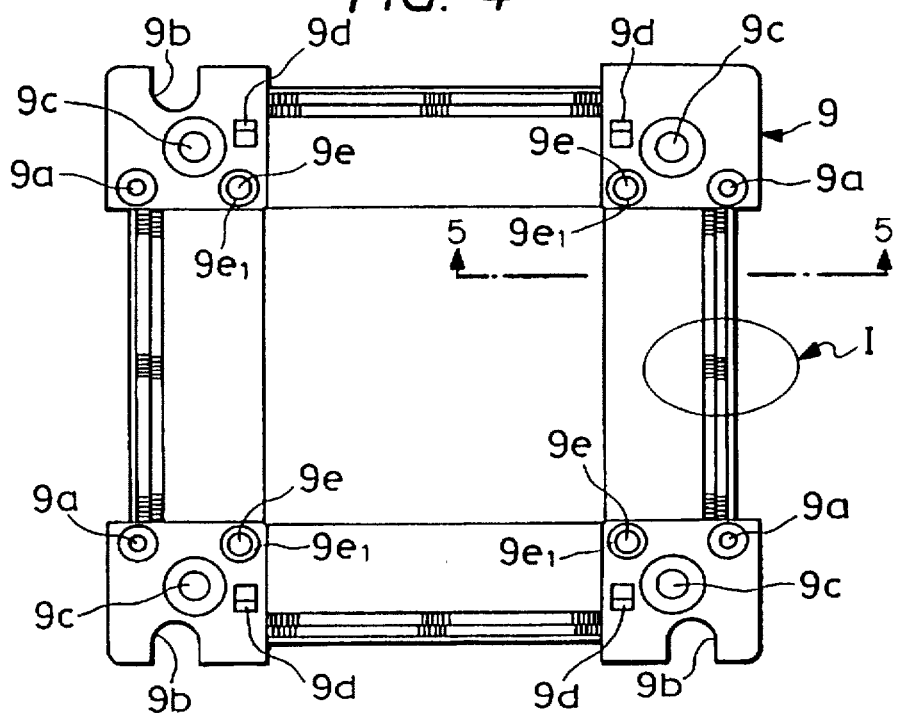
FIG. 4 is a plan view of a core plate according to the FIG. 1 embodiment.
Figure 5:
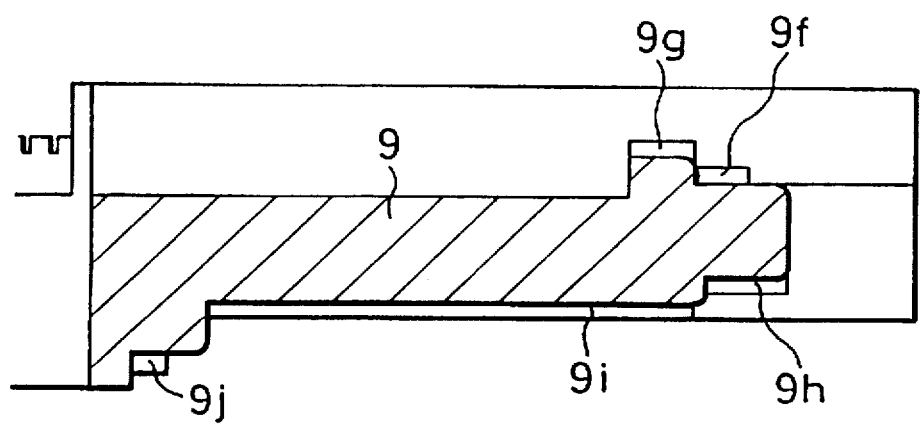
FIG. 5 is a sectional view taken along the line 5—5 of FIG. 4.
Figure 6:
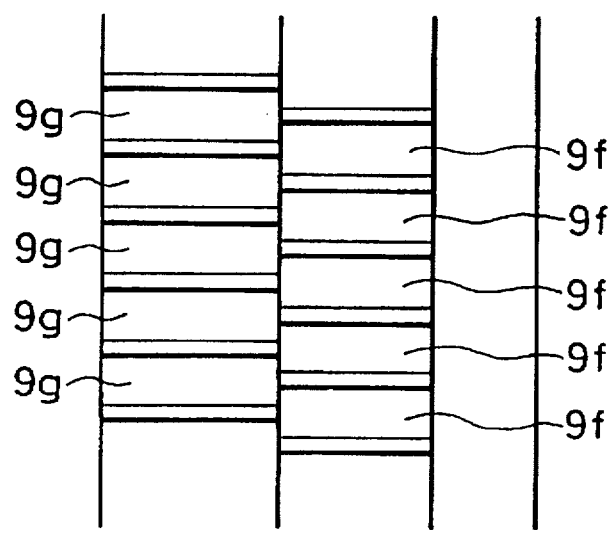
FIG. 6 is an enlarged view of the part enclosed in the ellipse I of FIG. 4.

FIG. 4 shows a top plan view of a core plate 9, FIG. 5 is a sectional view taken along the line 5—5 of FIG. 4, and FIG. 6 is an enlarged view of a part indicated by the ellipse I of FIG. 4. The core plate 9 is fixed to the socket body 1 by caulking upon its four holes 9a being aligned to the above mentioned four holes 1i of the socket body 1. In the core plate 9, three notches 9b for avoiding the pins 1e of the socket body 1 and four holes 9c to be used for mounting to the printed circuit board are formed. Also, four holes 9d for insertion of hook portions of the outer floating member 11, which will be described later, therethrough, and guide holes 9e for insertion of guide pins of the outer floating member 11, which also will be described later, therethrough are formed in the core plate 9. In the guide holes 9e, outer sections 9e1 are formed so that coil springs not shown are fitted therein to urge the outer floating member 11 upward in the state shown in FIG. 2.

As shown in the enlarged views of FIG. 5 and FIG. 6, on a top surface of the core plate 9, a plurality of ribs 9f and a plurality of ribs 9g are formed each in one row so that the ribs 9f and the ribs 9g are alternately located. In the similar manner, on a bottom surface of the core plate 9, a plurality of ribs 9h and a plurality of ribs 9i are formed at respective locations opposite to the ribs 9f and the ribs 9g. Moreover, on the bottom surface of the core plate 9, ribs 9j are formed to correspond to the ribs 9h. Such array of ribs 9f, 9g, 9i, 9j is formed on each of four sides of the core plate 9.

Figure 7:
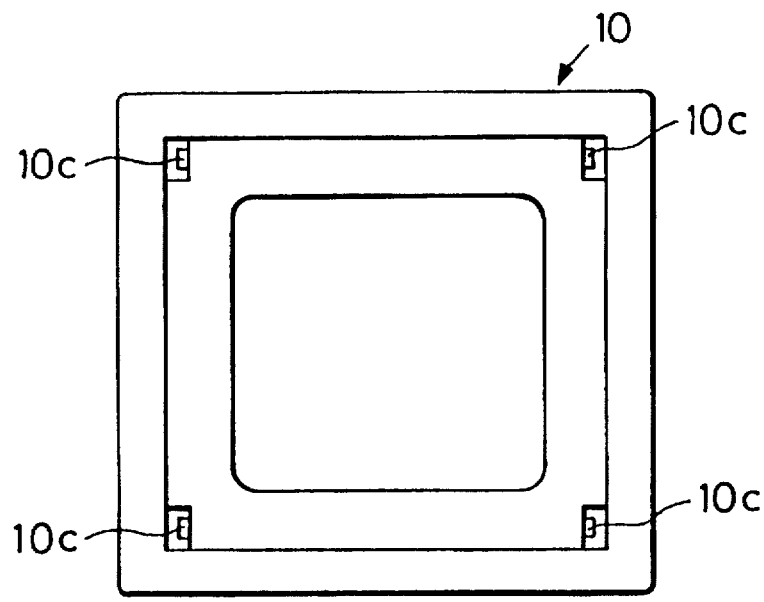
FIG. 7 is a plan view of an inner floating member according to the FIG. 1 embodiment.
Figure 8:
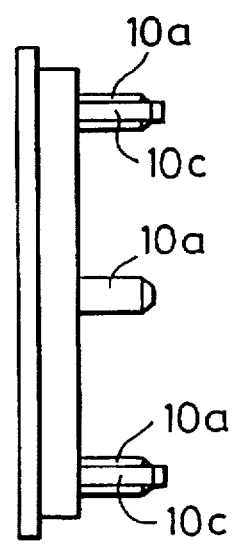
FIG. 8 is a right-side view of the inner floating member shown in FIG. 7.

Now, description will be made on the inner floating member 10 mainly using FIG. 7 and FIG. 8. FIG. 7 is a plan view of the inner floating member 10, and FIG. 8 is a right-side view of the same. The inner floating member 10 is provided with guide pins 10a which are located at four positions on a lower section thereof and are fitted in the holes 1h of the socket body 1, so as to be urged upward by springs 10b shown in FIG. 2. Upward movement of the inner floating member 10 is limited by hook portions 10c located at another four positions on the lower section and having their ends fitted in and locked by the holes 1f of the socket body 1.

Figure 9:
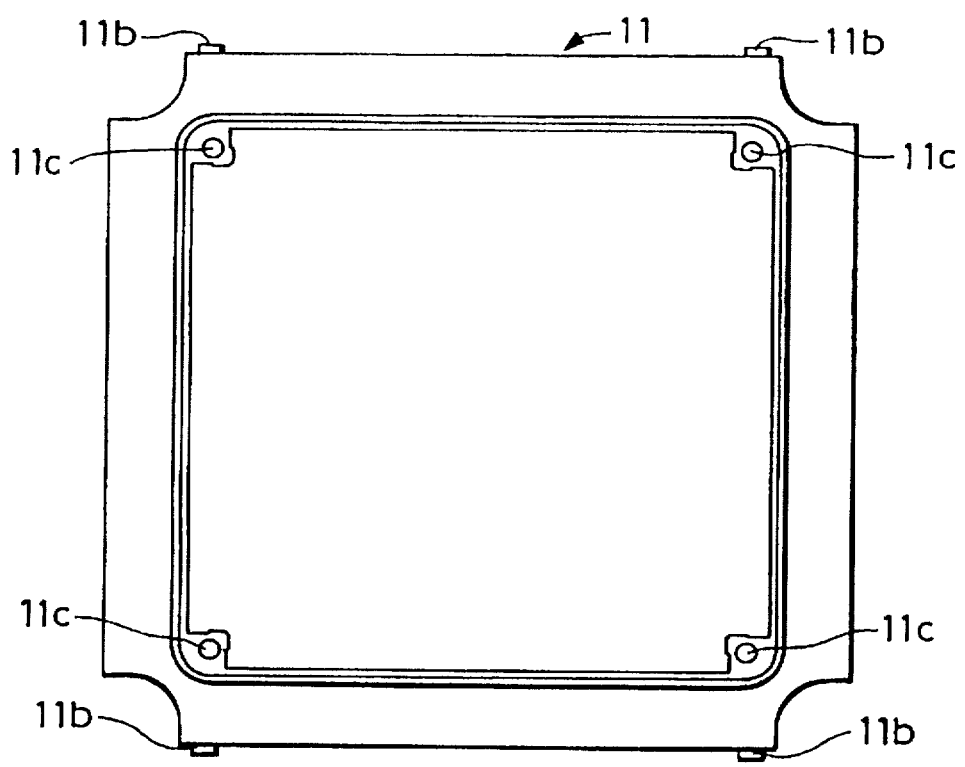
FIG. 9 is a plan view of an outer floating member according to the FIG. 1 embodiment.
Figure 10:
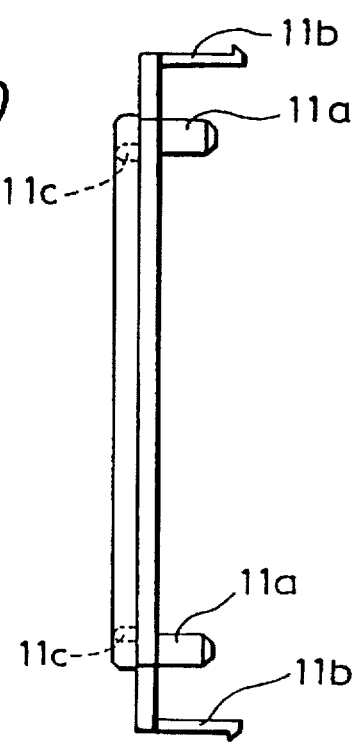
FIG. 10 is a right-side view of the outer floating member shown in FIG. 9.

The outer floating member 11 is shown in FIG. 9 and FIG. 10. On the lower side of four substantial corners of the outer floating member 11, guide pins 11a are provided to be fitted in the holes 9e of the core plate 9 and urged upward by springs not shown in the drawings in the state of FIG. 2. Upward movement of the outer floating member 11 which should be caused by the above mentioned springs is limited by hook portions 11b located at another four positions on the lower side of the outer floating member 11 and having their ends fitted in and locked by the holes 1g of the socket body 1. On the upper side of the four substantial corners of the outer floating member 11, reference pins 11c are provided to be fitted in the above-mentioned reference holes formed in the printed wiring film PCB of the IC package.

Figure 1:
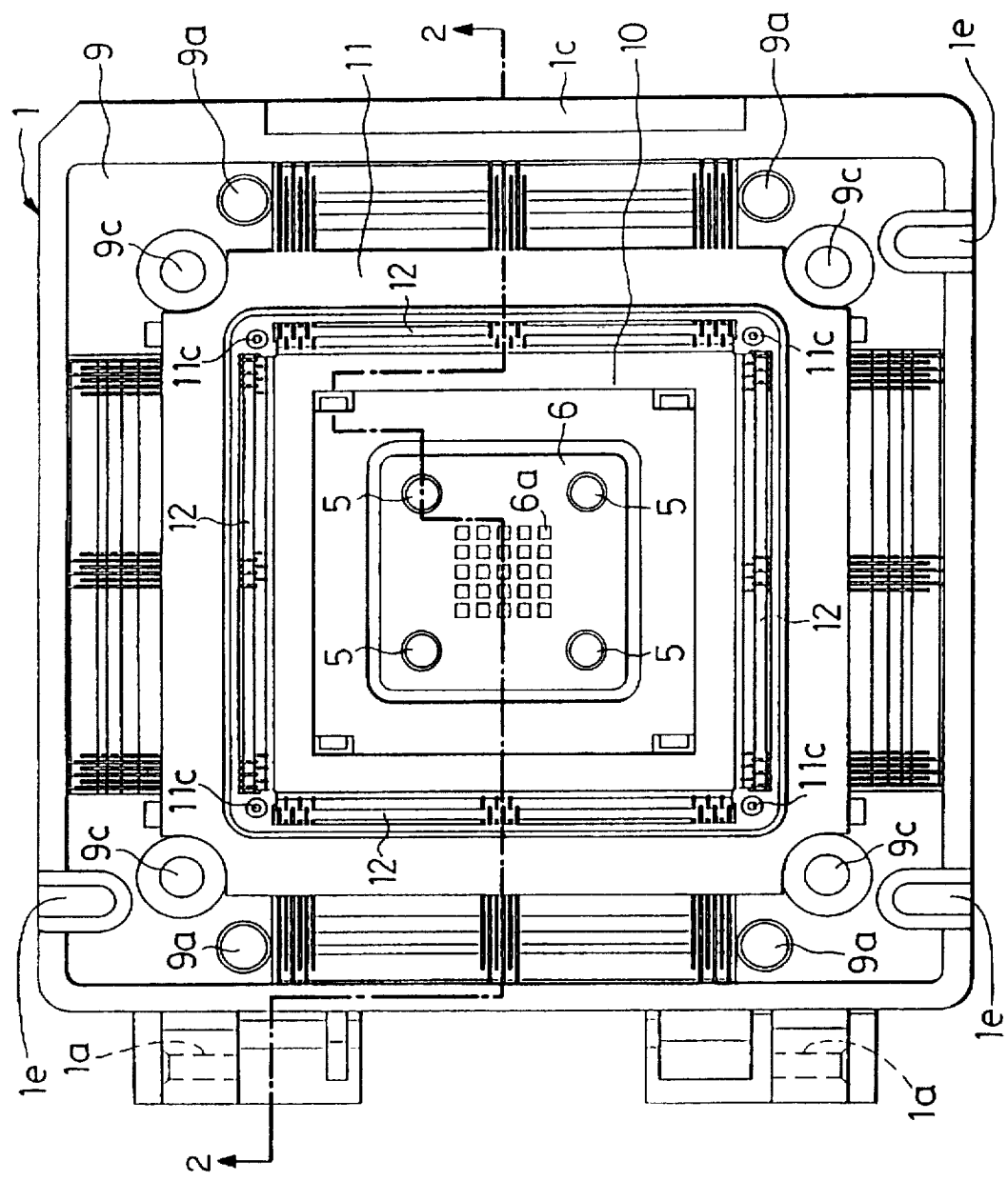
FIG. 1 is a plan view of an IC socket according to one embodiment of the present invention with its cover removed.
Figure 11:
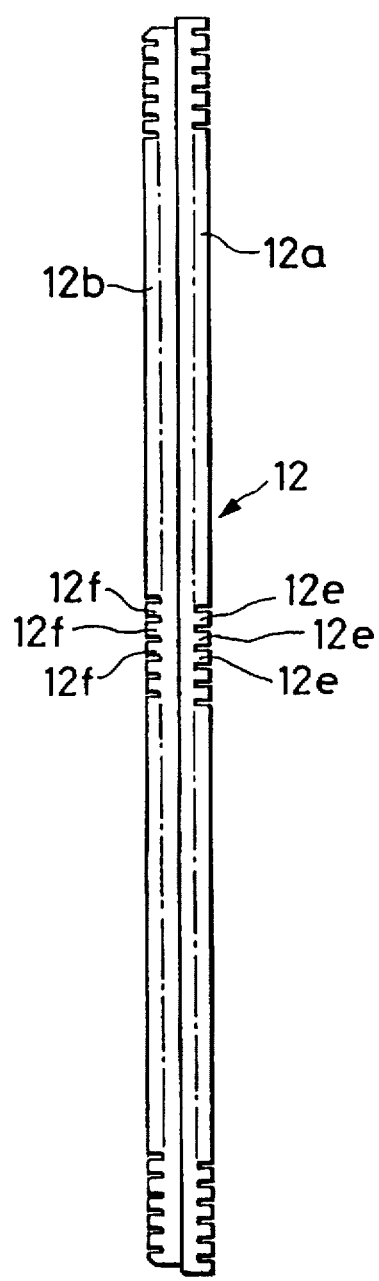
FIG. 11 is a plan view of a separator member according to the FIG. 1 embodiment.
Figure 12:
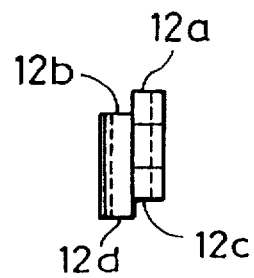
FIG. 12 is an end-side view of the separator member shown in FIG. 11.

In FIG. 1, four separator members 12 are shown between the inner floating member 10 and the outer floating member 11. FIG. 11 is a plan view of one sparator member 12 arranged along a right side in FIG. 1, and FIG. 12 is an end-side view of the separator member 12. As shown in FIG. 12, a top surface of the separator member is broken into a higher level face 12a and a lower level face 12b. Similarly, a bottom surface of the separator member 12 is broken into a higher level face 12c and a lower level face 12d a plurality of ribs 12e and a plurality of ribs 12f are respectively formed on a right side face and a left side face of the separator member 12 each in their respective single rows substantially from end to end of the separator member in such a manner that the ribs 12e and the ribs 12f are alternately located. The separator member 12 is held by and between a plurality of first contact pins 13 and a plurality of first contact pins 14, which will be described next.

Figure 13:
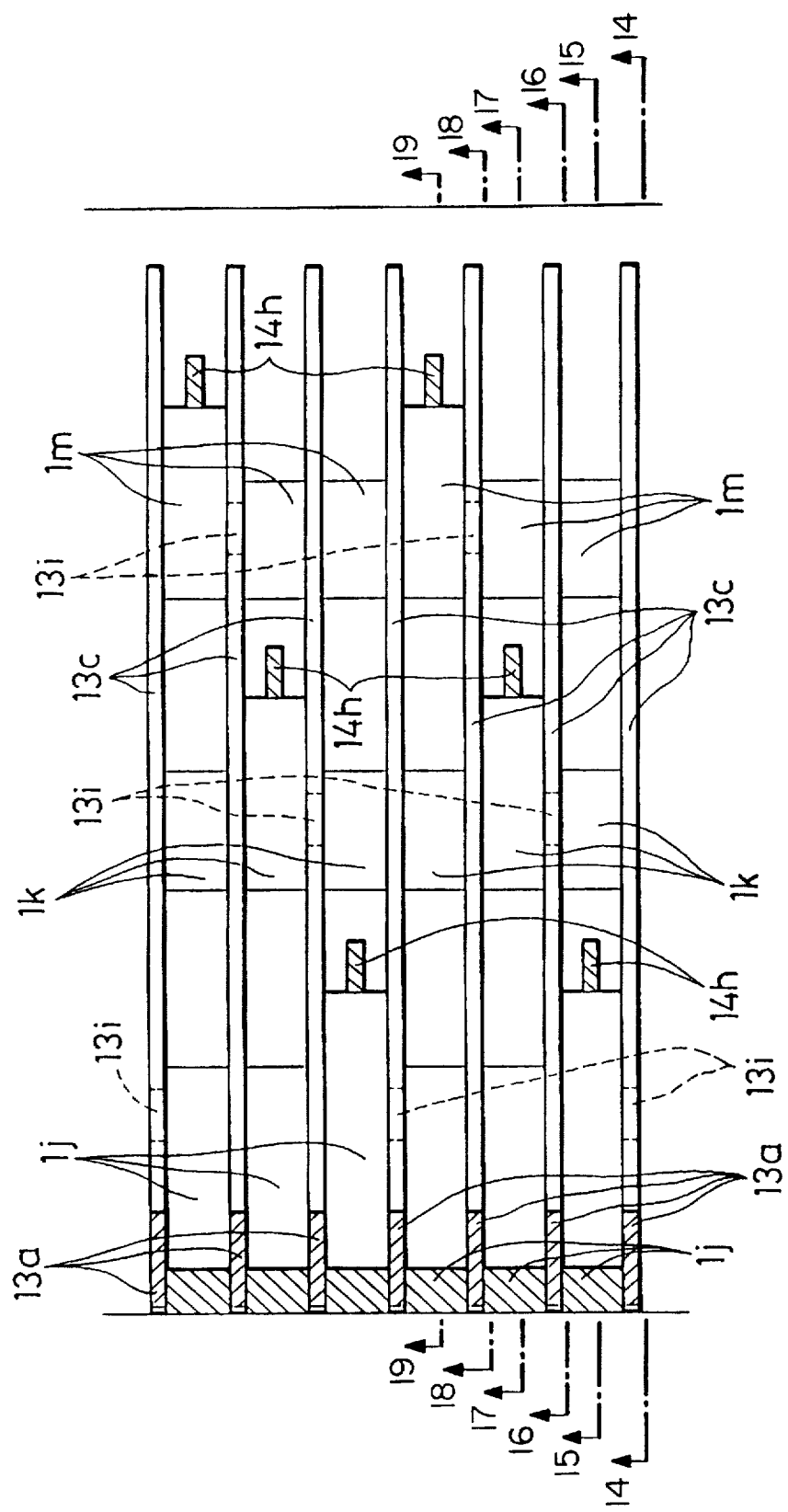
FIG. 13 is an enlarged view of the part enclosed in the ellipse II of FIG. 3, showing contact pins mounted to the socket body also.

Now, shapes of the contact pins and engagement relationship between these contact pins and respective ribs will be detailed. In FIG. 13, a part of the rib section (indicated by the ellipse II) of the socket body 1 roughly illustrated in FIG. 3 is enlarged to show the state where the plurality of first contact pins 13 and the plurality of second contact pins 14 are alternatedly engaged between the ribs. FIGS. 14–19 are sectional views respectively taken along the lines 14—14 through 19—19 of FIG. 13, drawn in the manner similar to FIG. 2. As shown in FIG. 2, the first contact pins 13 and the second contact pins 14 are substantially U-shaped and arranged in the socket body so as to lie on their lateral side of U shape.

Figure 14:
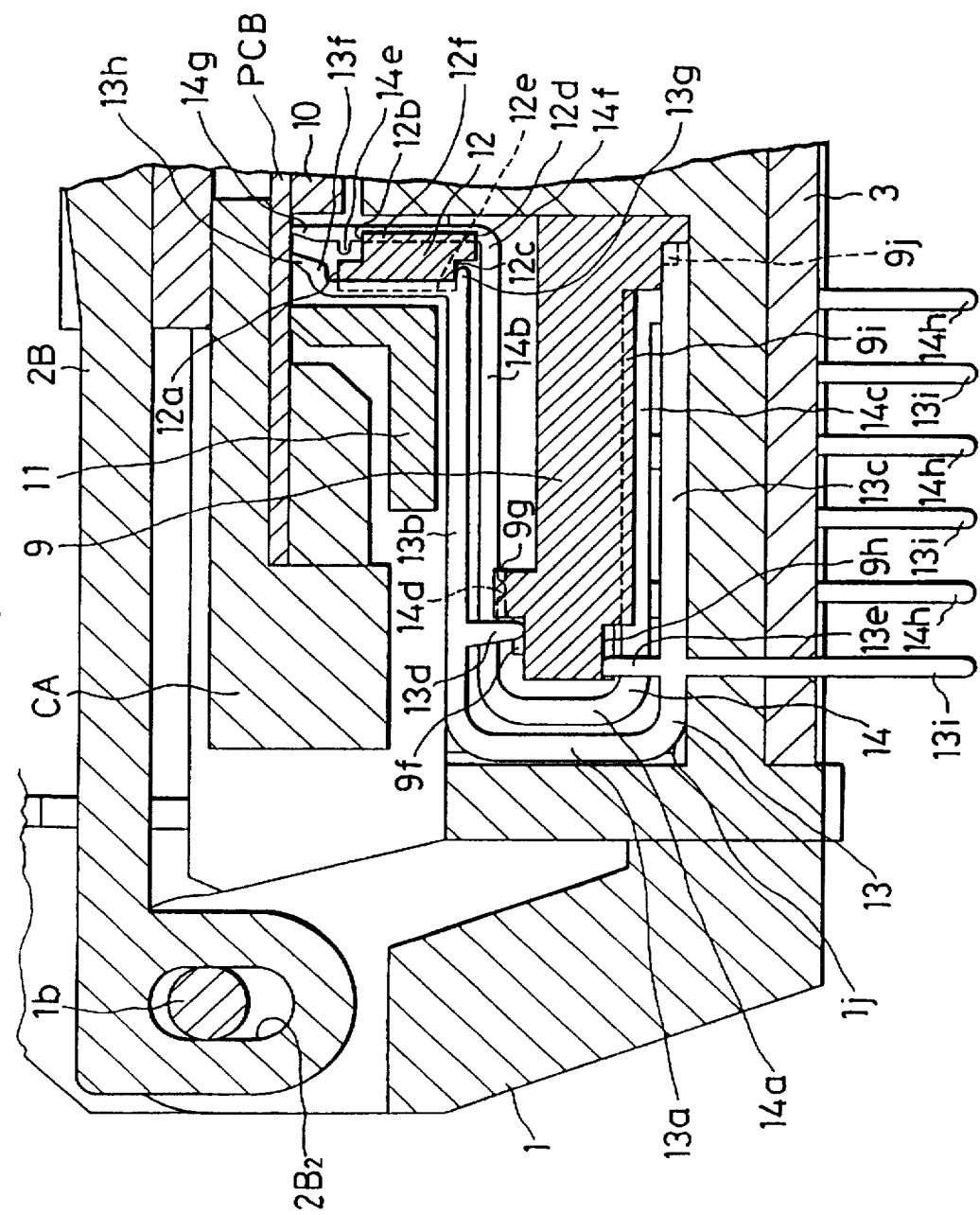
FIG. 14 is a sectional view, as an analogue of FIG. 2, of the IC socket according to the FIG. 1 embodiment when taken along the line 14—14 of FIG. 13.

A part of FIG. 2 is enlarged to appear in detail in FIG. 14. Thus, structure of the first contact pins 13 and the second contact pins 14 will be described mainly using FIG. 14. Each of the first contact pins 13 has a spring section 13a urging engagement portions 13d and 13e, which are respectively formed on two legs 13b and 13c, to hold the core plate 9 therebetween. The spring sections 13a are engaged between a plurality of L-shaped ribs 1j formed on the socket body. As shown in FIG. 13, every third ribs 1j have their horizontal sections formed longer than the remainings of the ribs 1j. On the other hand, the engagement portions 13d and 13e are engaged respectively between the ribs 9f and between the ribs 9h formed on the core plate 9. The structure including the spring section 13a is advantageous where the core plate 9 is set into the socket body 1 upon the contact pins 13 preliminarily being attached to the core plate 9.

Free end sections of the legs 13b are shaped to rise vertically to be engaged between the ribs 12e of the separator member 12. On each leg 13b, formed are an abutting portion 13f and an abutting portion 13g which are allowed to meet an upwardly directed face 12a and a downwardly directed face 12c of the separator member 12 respectively, and at an end of the leg 13b, a contact portion 13h is formed to be brought into contact with a lead terminal formed on the printed wiring film PCB. As shown in FIG. 13, the other legs 13c of the first contact pins 13 are engaged between a plurality of ribs 1k and between a plurality of ribs 1j formed on the socket body 1, with their ends engaged between the ribs 9j of the core plate 9. Every third ribs 1k and every third ribs 1m are respectively made longer than the respective remainings of the ribs 1k and the ribs 1m. As shown in FIG. 13, phases of repititive appearence of the longer horizontal sections of the ribs 1j, the longer ribs 1k, and the longer ribs 1m are shifted among rows formed by these ribs.

Figure 16:
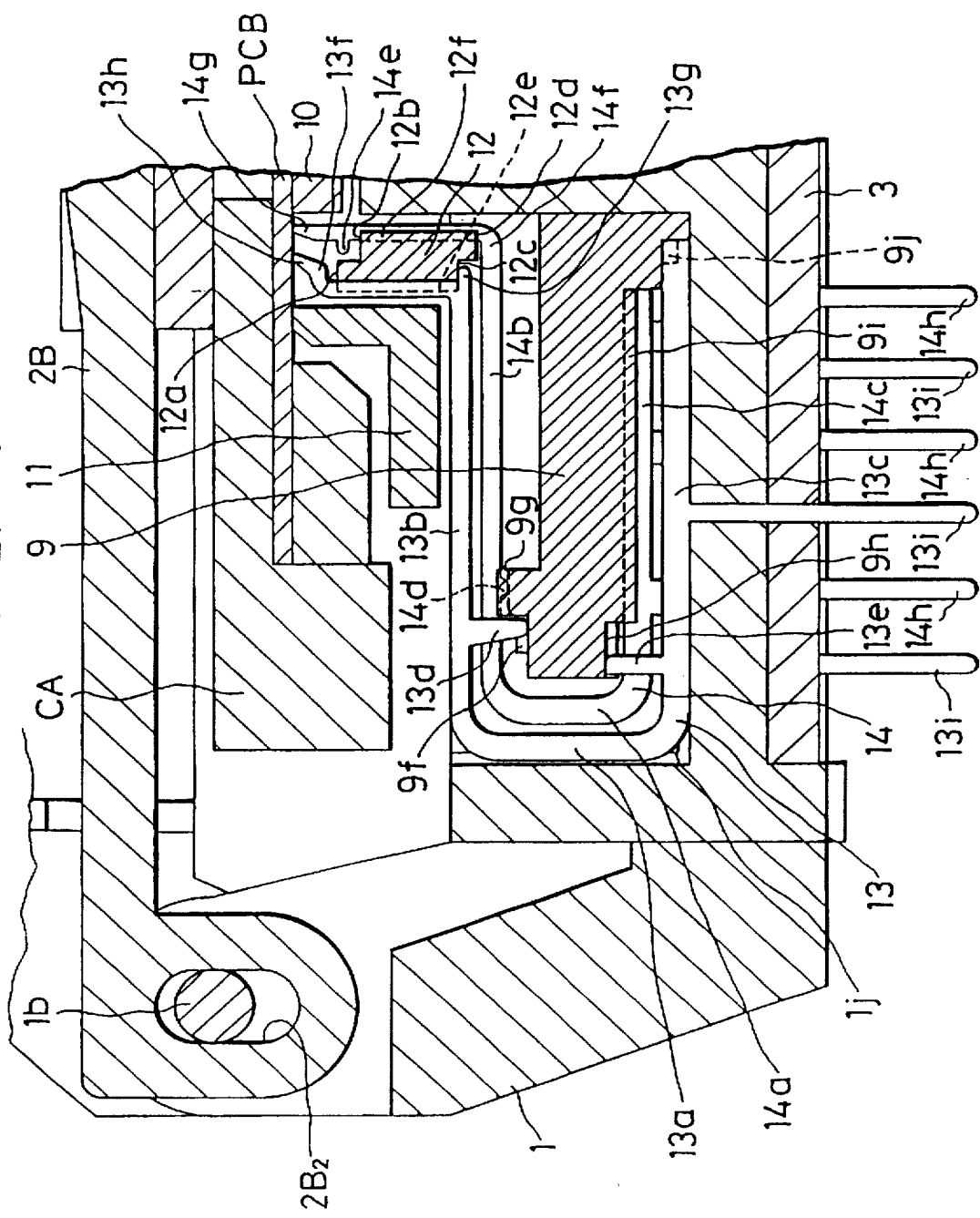
FIG. 16 is a sectional view, as an analogue of FIG. 2, of the IC socket according to the FIG. 1 embodiment when taken along the line 16—16 of FIG. 13.
Figure 18:
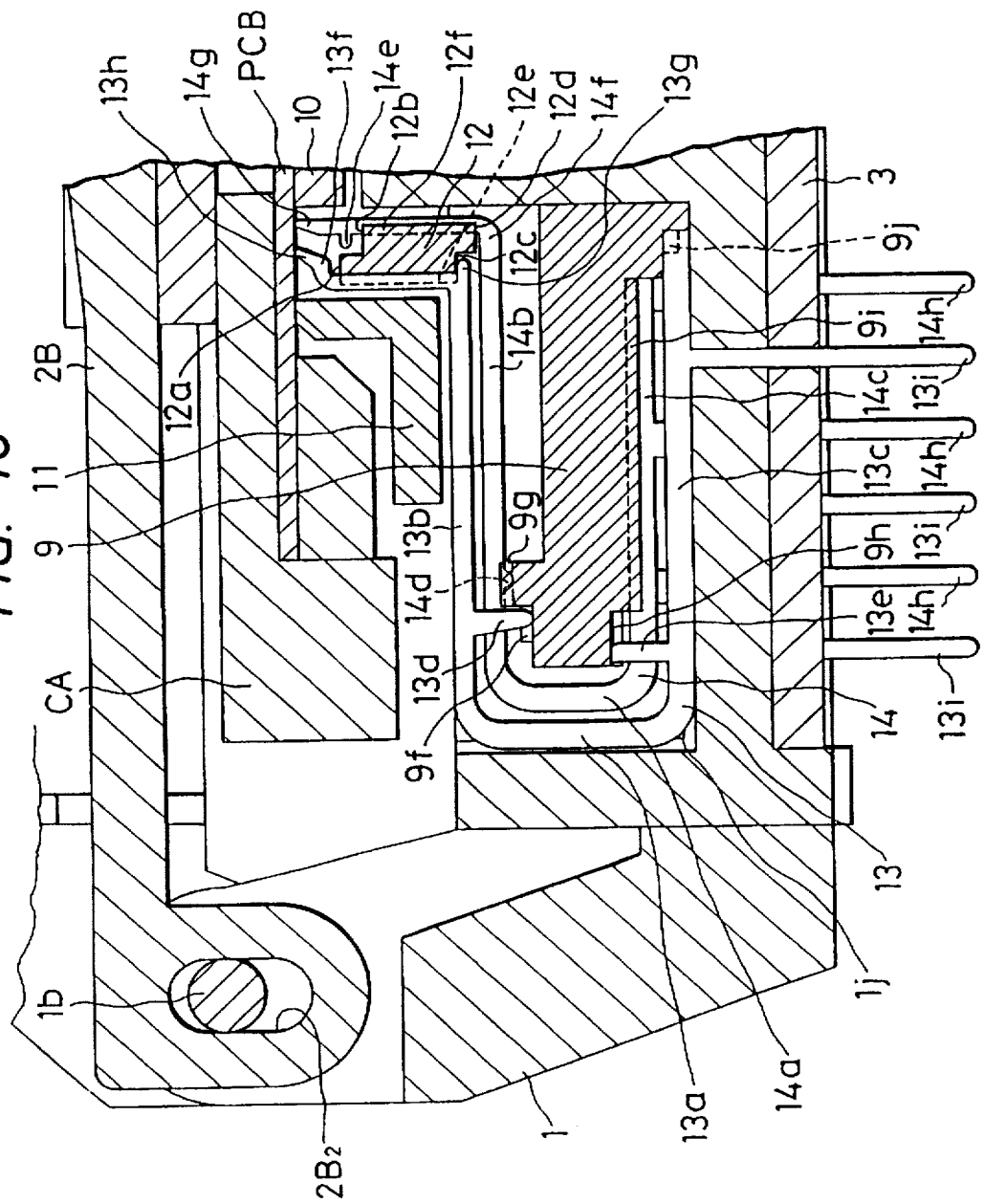
FIG. 18 is a sectional view, as an analogue of FIG. 2, of the IC socket according to the FIG. 1 embodiment when taken along the line 18—18 of FIG. 13.

Furthermore, on each of the legs 13c of the first contact pins 13, a connecting terminal 13i is formed. The connecting terminals 13i pierce the socket body 1 and the locating board 3, to be electrically connected to connecting terminals (land) formed on a printed circuit board on which the IC socket of this embodiment is mounted. According to this embodiment, three types of the first contact pins 13 having different shapes are used. They are different in the position where the connecting terminal 13i is formed. The first contact pin 13 showing its entire shape in FIG. 14 corresponds to the pin 13 drawn nearest from the bottom of the figure in FIG. 13. As seen from the FIG. 13, the connecting terminals 13i of the contact pins 13 are arranged so as to be orderly shifted in a longitudinal direction of the legs 13c with appearence of the three types of the contact pins 13 as one cycle of repetition. Entire shapes of the three types of the first contact pins 13 are shown in FIGS. 14, 16, 18.

Next, description will be made on the second contact pins 14. As shown in FIG. 14, the second contact pins 14 are formed to have U shape smaller than that of the first contact pins 13. This configuration is adopted, upon the narrow intervals between the contact pins corresponding to the fine pitch arrangement of the lead terminals of the TAB package being taken into consideration, for the purpose of avoiding mutual contact of adjacent contact pins bent during the loading of the TAB package. Each of the second contact pins 14 has a spring section 14a urging two legs 14b, 14c to hold the core plate 9 therebetween, where an engagement portion 14d formed on the leg 14b is engaged between the ribs 9g formed on the core plate 9. The structure including the spring section 14a also is so advantageous for assembling work as the equivalent structure of the first contact pins 13 is.

Free end sections of the legs 14b are shaped to rise vertically to be engaged between the ribs 12f of the separator member 12. On each leg 14b, formed are an abutting portion 14e and an abutting portion 14f which are allowed to meet an upwardly directed face 12b and a downwardly directed face 12d of the separator member 12 respectively, and at an end of the leg 14b, a contact portion 14g is formed to be brought into contact with a lead terminal formed on the printed wiring film PCB. Even when the TAB package is loaded and the contact pins are bent, the leg 14b can surely avoid contact with the engagement portions 13b of adjacent contact pins 13, because the ribs 9f and the ribs 9g are very closely located. The other legs 14c of the second contact pins 14 are engaged between the ribs 9i formed on the core plate 9.

Furthermore, on each of the legs 14c of the second contact pins 14, a connecting terminal 14h is formed. The connecting terminals 14h pierce the socket body 1 and the locating board 3, similar to the connecting terminals 13i, to be electrically connected to connecting terminals (land) formed on the printed circuit board. As the second contact pins 14 also, used are three types of contact pins different in the position where the connecting terminal 14h is formed. The second contact pins 14 are arranged between the first contact pins 13. Arrangement pattern of the connecting terminals 14h of the second contact pins 14 is shown in the sectional view FIG. 13.

Figure 15:
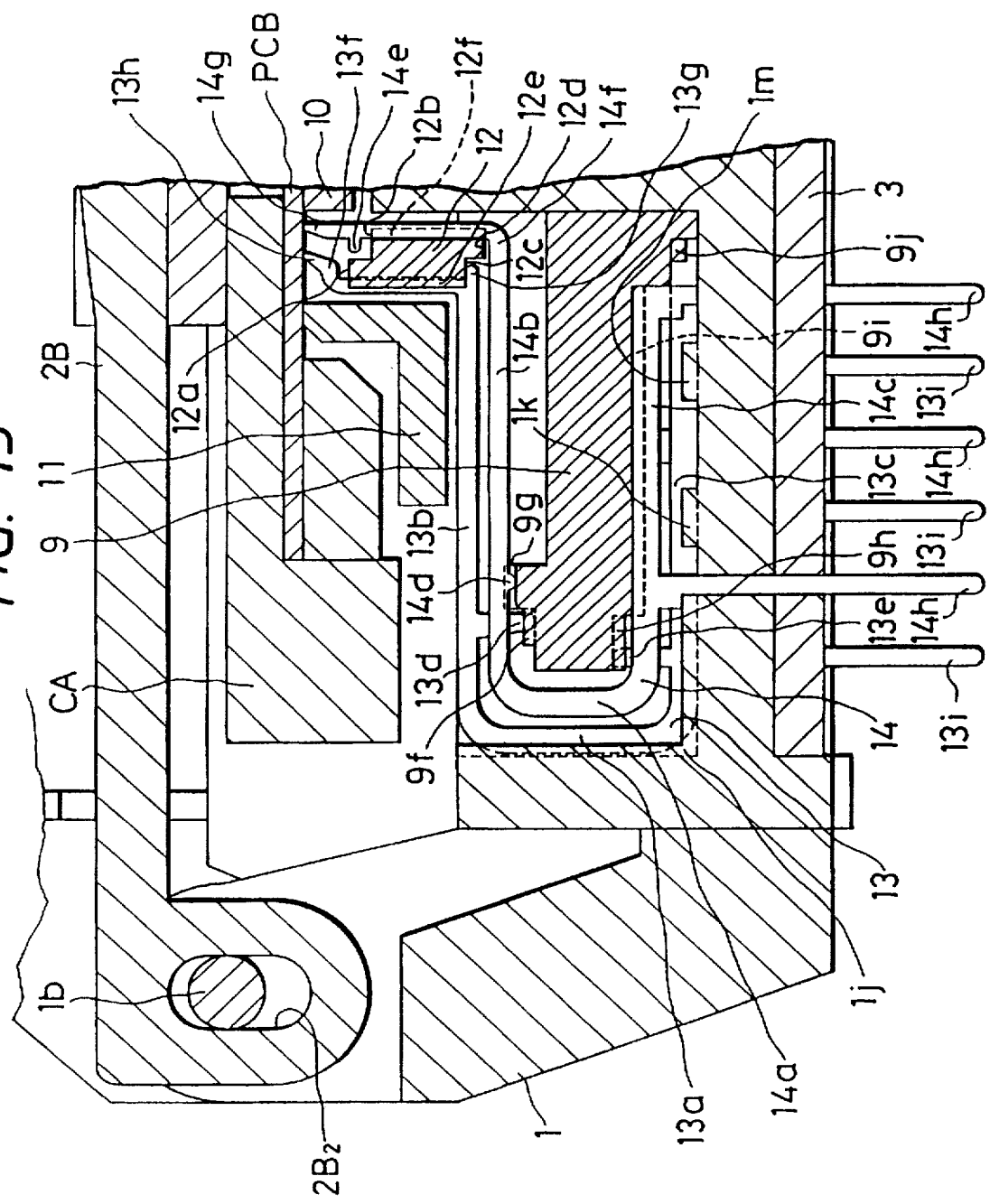
FIG. 15 is a sectional view, as an analogue of FIG. 2, of the IC socket according to the FIG. 1 embodiment when taken along the line 15—15 of FIG. 13.
Figure 17:
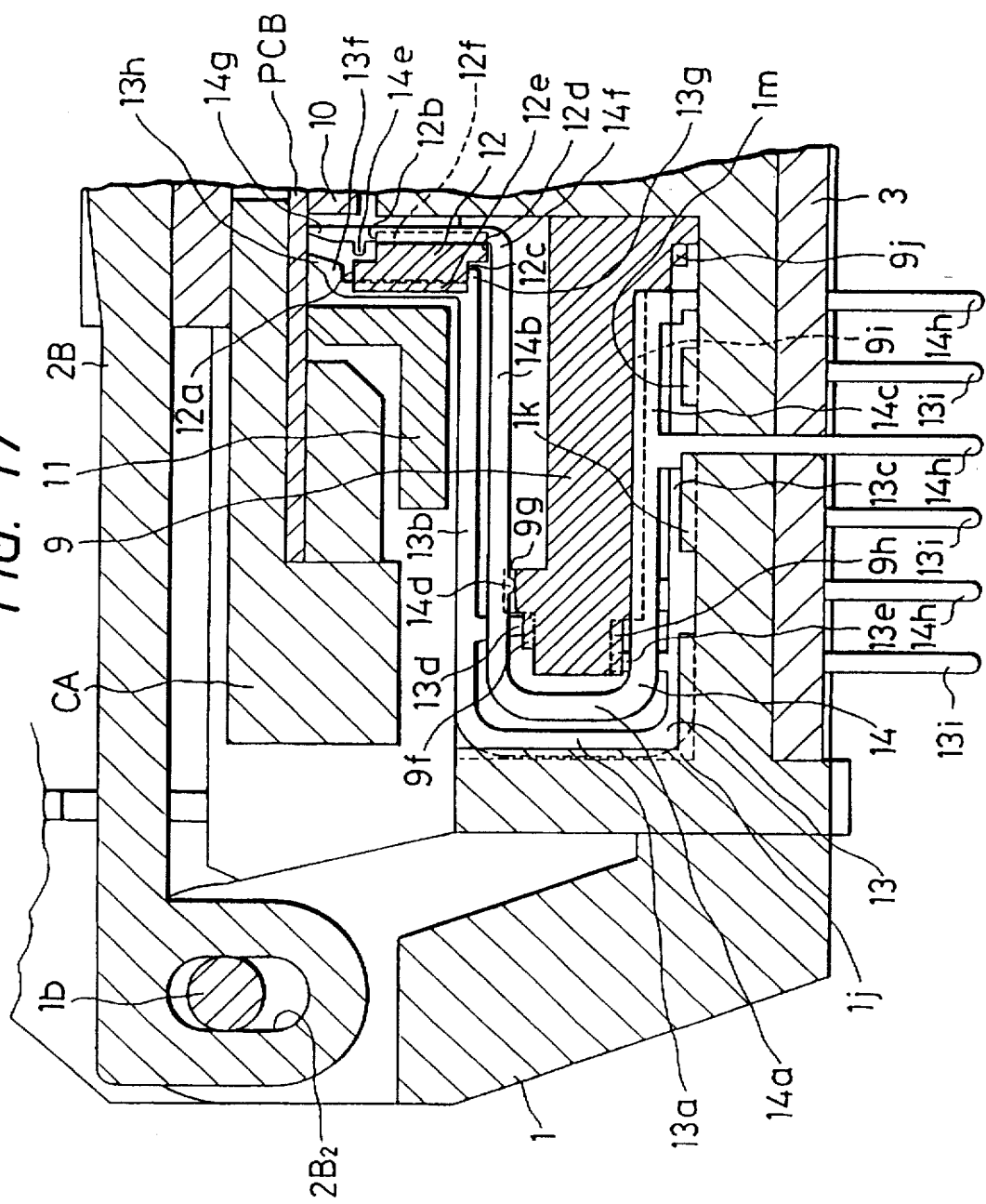
FIG. 17 is a sectional view, as an analogue of FIG. 2, of the IC socket according to the FIG. 1 embodiment when taken along the line 17—17 of FIG. 13.
Figure 19:
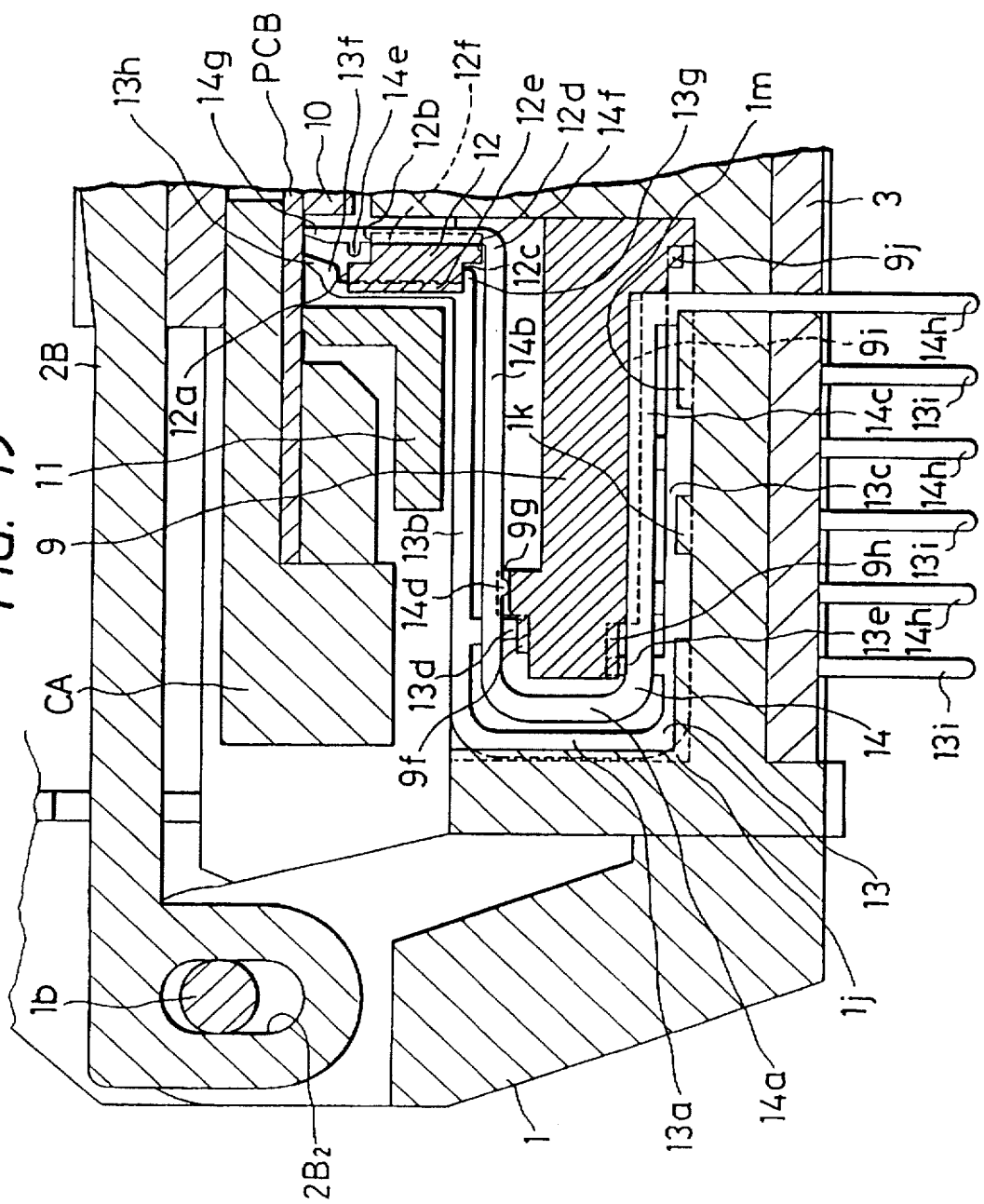
FIG. 19 is a sectional view, as an analogue of FIG. 2, of the IC socket according to the FIG. 1 embodiment when taken along the line 19—19 of FIG. 13.

As shown in FIG. 13, the connecting terminals 14h of the contact pins 14 also are arranged so as to be orderly shifted in a longitudinal direction of the legs 14c with appearence of the three types of the contact pins 14 as one cycle of repetition. Entire shapes of the three types of the second contact pins 14 are shown in FIGS. 15, 17, 19. Bending action of the second contact pins 14 accompanying loading of the TAB package is made stabilized upon the respective types of connecting terminals 14h being held to the long ribs on the socket body 1 and ends of the legs 14c shown in FIGS. 15, 17 being held to the socket body 1.

Figure 20:
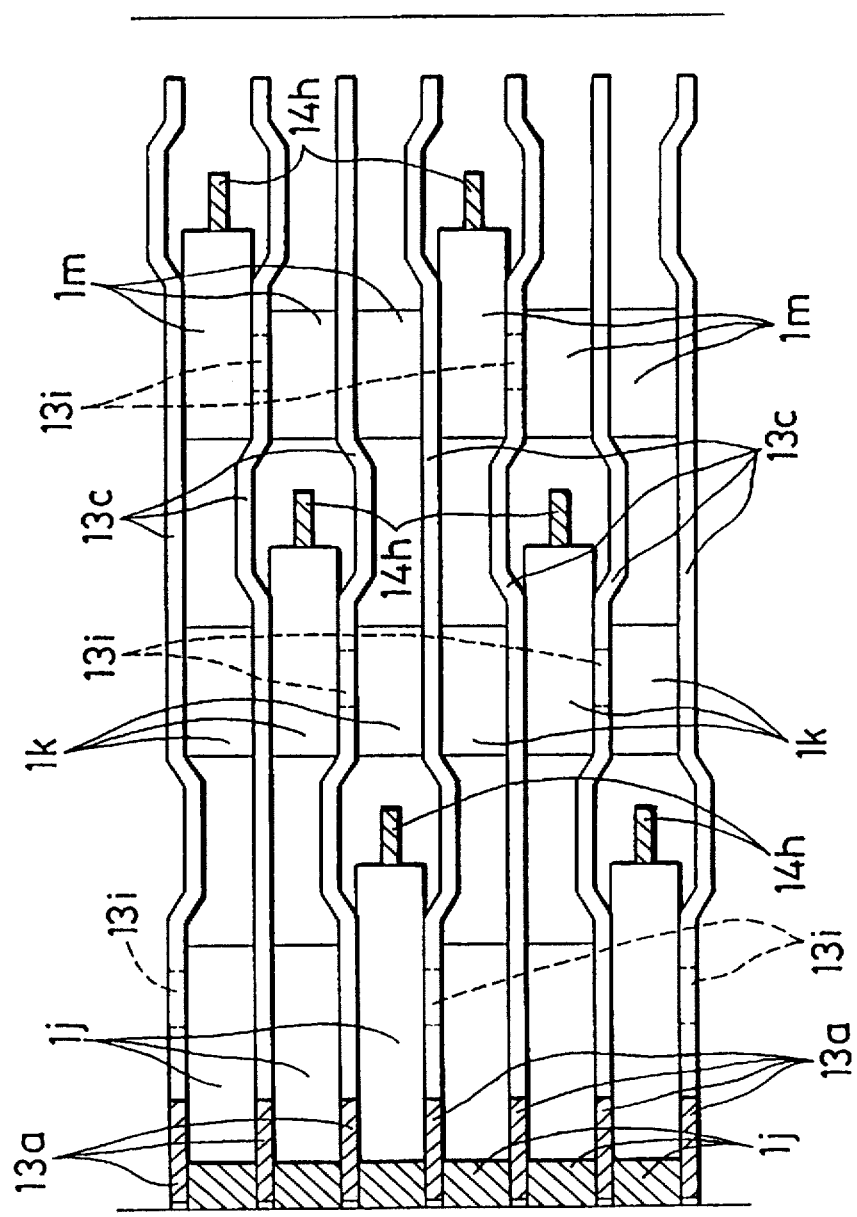
FIG. 20 is an enlarged view as an analogue of FIG. 13, while showing contact pins having different shapes.

FIG. 20 is a sectional view similar to FIG. 13, illustrating a modified shape of the leg 13c of the first contact pins 13. This structure allows the legs 13c of the first contact pins 13 to steadily avoid contact with the conneting terminals 14h of the second contact pins 14.

Although it may be apparent from the foregoing explanations, loading/removing operation of TAB packages according to the present embodiment will be described briefly. In reference to FIG. 2, when the hook member 2C is pushed from upside against the spring 2A2, the hook portions 1c and 2C1 are disengaged, and the cover 2 is made swing counterclockwise by force of the spring not shown about the shaft 1b. Then, the TAB package can be taken out of the IC socket manually or by some machine.

To load the TAB package, at first the TAB package is placed on the socket body 1 so that the notches formed in the frame (carrier) CA is aligned to the pins 1e, and then the cover 2 is closed to cause the pressing section 2B3 of the pressing plate 2B to press the IC chip T on the movable stage 6 as well as to cause the auxiliary pressing plate 2D to press the printed wiring film PCB to the inner floating member 10 and the outer floating member 11 through pushing the frame CA. Force via the pressing plate 2B acts on the IC chip T substantially in a vertical direction as a result of relationship between the shaft 1b and the slot 2B3 and relationship between the end section 2B1 of the pressing plate 2B and the hole 2A3.

As the movable stage 6 moves downward against the springs 7 by the pushing via the pressing section 2B3, the high heat transfer pins 8 are bent and the ends thereof are steadily brought into contact with the IC chip T, whereby heat radiating from the IC chip T during the inspection is transferred to the printed circuit board. On the other hand, as the inner floating member 10 and the outer floating member 11 are pushed, the inner floating member 10 moves downward against the springs 10b and the outer floating member 11 also moves downward against springs not shown in the drawings, whereby the lead terminals formed on the printed wiring film PCB are brought into contact with the contact portions 13h, 14g of the contact pins 13, 14.

After the lead terminals formed on the printed wiring film PCB are brought into contact with the contact pins 13, 14, the inner floating member 10 and the outer floating member 11 are further pushed until an appropriate contact force is applied to every contact point to assure connection. Finally, the hook section 2C1 of the hook memer 2c is engaged with the hook section 1c of the socket body 1, to assume the state shown in FIG. 2.

During the operation described above, the separator member 12 also moves downward along with the contact portions 13h, 14h of the contact pins 13, 14, which is an advantageous feature. That is, even if relationship between the contact pins 13 and the ribs 12e or relationship between the contact pins 14 and the ribs 12f involves slight inconvenience for engagement, all the contact portions 13h, 14g are moved downward, without excessive force being applied thereto, via the separator member 12 as the abutting portions 13f, 14e of some of the plurality of contact pins push the upwardly directed faces 12a, 12b of the separator member.

Conventionally, a floating member is structured as a zonal-square-shaped single assembly having a plurality of holes formed along each of its four sides, and contact portions 13h, 14g of contact pins so arranged as in the present embodiment are fitted in these holes. In this configuration, however, friction is caused between the floating member and the contact pins 13, 14, because the floating member moves vertically while the contact portions 13h, 14g move upon the engagement portions 13d, 14d functioning as fulcrums. In contrast, according to this embodiment, the inner floating member 10 and the outer floating member 11 are not brought into contact with the contact pins 13, 14, and moreover, the separator member 12 moves in accordance with the contact pins 13, 14 to cause very little friction; this embodiment is sperior in view of durability.

Although the foregoing descriptions on this embodiment have referred to the TAB package as an IC device to be loaded in the IC socket, the present invention is applicable also to an IC socket for devices having lead terminals arranged on two sides of the IC chip, not limited to this example. Furthermore, while in this embodiment, the contact portions 13h of the contact pins 13 and the the contact portions 14g of the contact pins 14 are arranged in separate rows, it is needless to say that these contact pins may be arranged in a single row by extending one of the rows of the contact portions to be aligned to the other row of the contact portions, because the separator member 12 can be made more compact so that the ribs 12e and the ribs 12f are located closer to each other.

Figure 21:
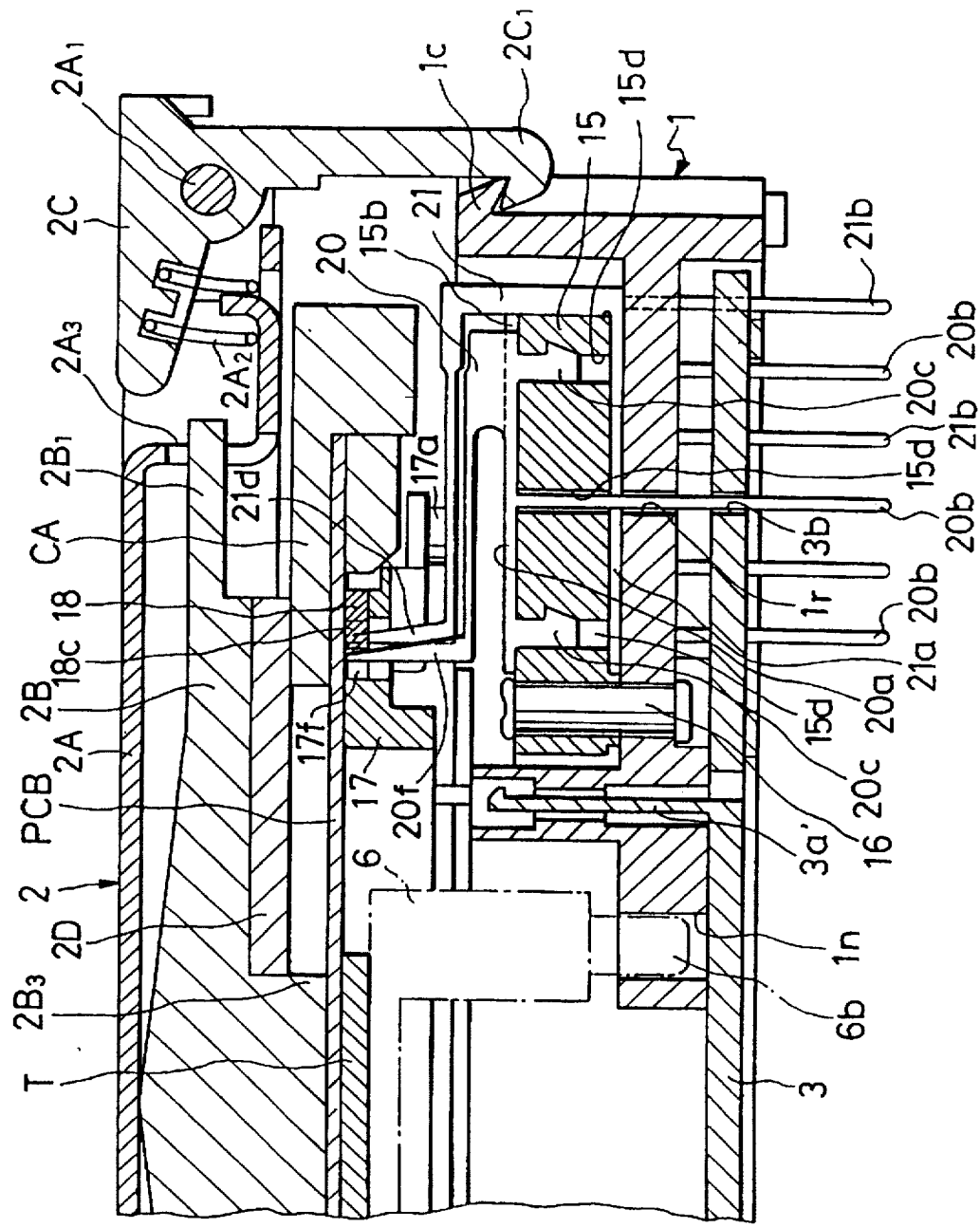
FIG. 21 is a sectional view, as an analogue of FIG. 2, of an IC socket according to another embodiment of the present invention, illustrating a state where its cover is closed upon loading of an IC device.

Next, refering to FIG. 21 through FIGS. 36A–36F, another embodiment of the present invention will be described. As shown in FIG. 21, a known locating board 3 is movably mounted to a socket body 1 with an elastic hook portion 3', to be located on the lower side of the socket body 1. A movable stage 6 (drawn with the single dot & dash line) is movably mounted to the socket body 1 as well known in the art. The movable stage 6 has four pins 6b which are made fitted in four holes in shown in FIG. 22 of the socket body 1 and is urged upward by springs not shown in the drawings. The upper limit position of the movable state 6 is regulated by a structure not shown in the drawings but similar to the hook portion 3a' of the locating board 3. Additionally, a plurality of high heat tranfer pins (25 pins, for example) not shown in the drawings are provided between the movable stage 6 and the locating board 3 as having already been described.

Figure 22:
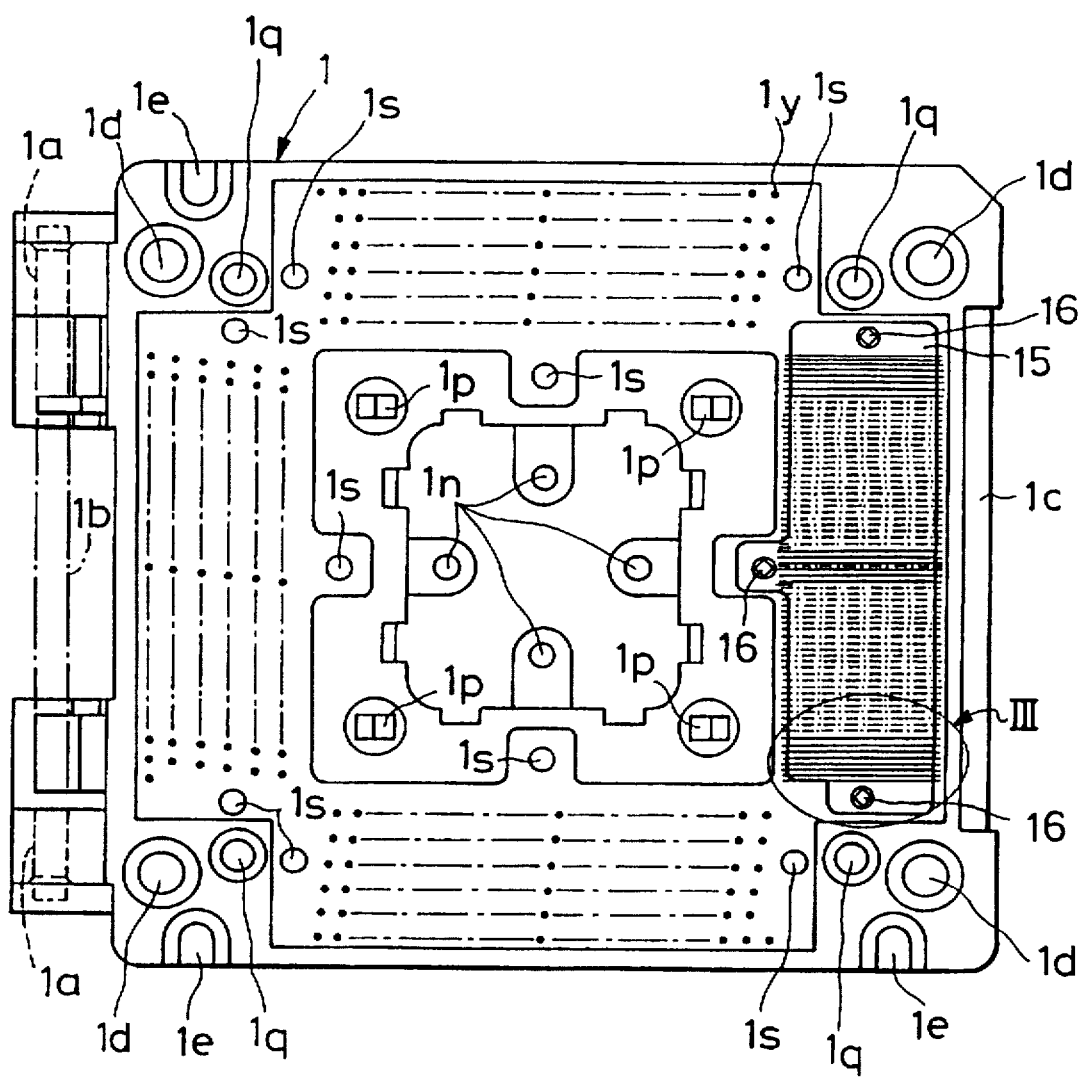
FIG. 22 is a plan view of a socket body according to the FIG. 21 embodiment, showing only one of core blocks being fixed thereto.

As shown in FIG. 22, four holes Id are formed on the socket body 1 to be used for attachment to the printed circuit board. D type pins 1e are to be fitted in the notches, which are formed on the frame CA of the TAB package for preventing the TAB package from erroneous loading as mentioned before. Holes 1p arranged at four positions are to be engaged with hook portions 17b of a first floating member 17 which will be described later herewith. Four non-through holes, or recesses 1q are formed on the socket body 1 to act as guide holes by receiving pins 17a of a first floating member 17, which will be described later, to allow vertical movement of the first floating member 17.

Along four sides of the socket body 1, a plurality of perforations 1r are arranged at an uniform pitch in six rows per side so that phases of the pitch are shifted between the rows. These perforations 1r are used to have connecting terminals of contact pins, which will be described later, to pierce the socket body 1. Holes 1s are arranged at three positions per side of the socekt body 1 to be used for fixing core blocks 15, which will be described next, by caulking. FIG. 22 shows a state where a core block 15 is fixed to only one side of the socket body by caulking with rivets 16.

Figure 23:
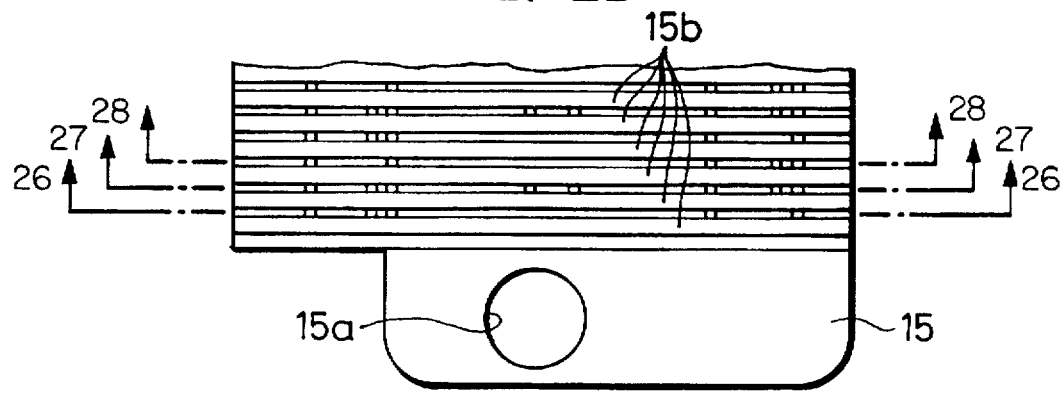
FIG. 23 is an enlarged view of the part enclosed in the ellipse III of FIG. 22.
Figure 24:
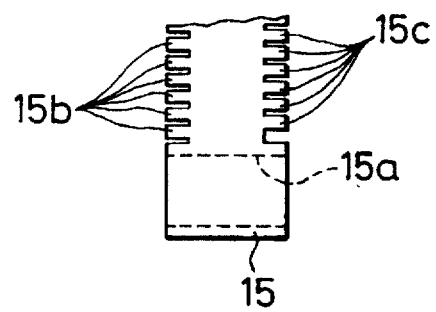
FIG. 24 is a right-side view of the core block shown in FIG. 23.
Figure 25:
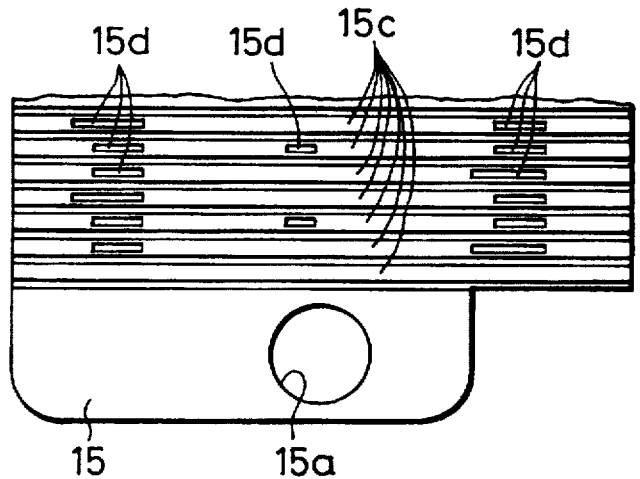
FIG. 25 is a bottom plan view of the core block shown in FIG. 23.

Now, description will be made on a structure of the core blocks 15. Since all the four core blocks have an identical structure, the following explanation refers to only one of them. FIG. 23 is an enlarged view of a selected part of the core block 15 indicated by the ellipse III of FIG. 22, FIG. 24 is a right-side view of the selected part shown in FIG. 23, FIG. 25 is a bottom plan view of the selected part shown in FIG. 23, and FIGS. 26 through 28 are sectional views taken respectively along the lines 26—26 through 28—28 of FIG. 23. The core block 15 forms three holes 15a at positions at its two longitudinal ends and its longitudinal center corresponding to three holes 1s on one side of the socket body 1 so that it is fixed to the socket body 1 by caulking with the rivets 16 at these positions (In FIGS. 23–25, only one of the holes 15a is shown).

Figure 26:
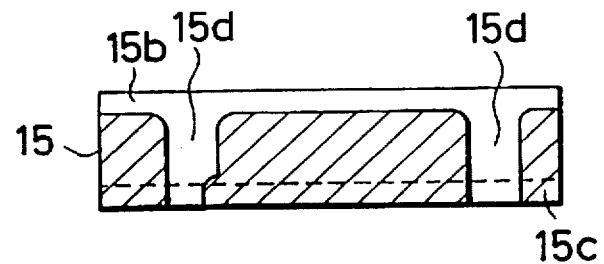
FIG. 26 is a sectional view of the core block taken along the line 26—26 of FIG. 23.
Figure 27:
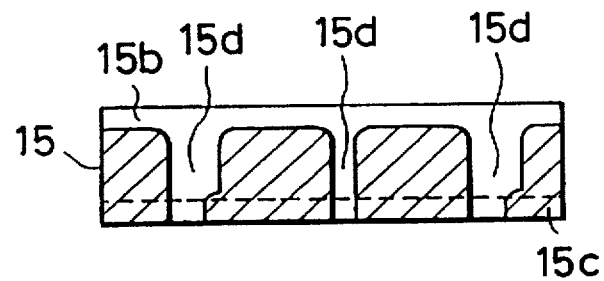
FIG. 27 is a sectional view of the core block taken along the line 27—27 of FIG. 23.
Figure 28:
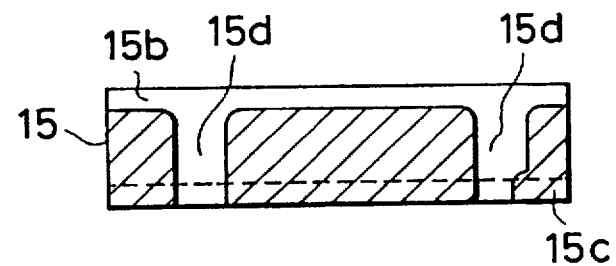
FIG. 28 is a sectional view of the core block taken along the line 28—28 of FIG. 23.

A plurality of ribs 15b and a plurality of ribs 15c are formed to be arranged at regular intervals respectively on a top surface and a bottom surface of the core block 15 made of synthetic resin. As apparently seen in FIG. 24, the ribs 15b (on the top surface) and the ribs 15c (on the bottom surface) are alternately positioned. In the core block 15, through holes 15d are formed at two or three positions on each groove between the ribs 15b through their corresponding positions on each rib 15c, so that the contact pins are fitted therein. As shown in FIGS. 26–28, the holes 15 are formed to orderly have three types of shape among the grooves between the ribs 15b.

Figure 29:
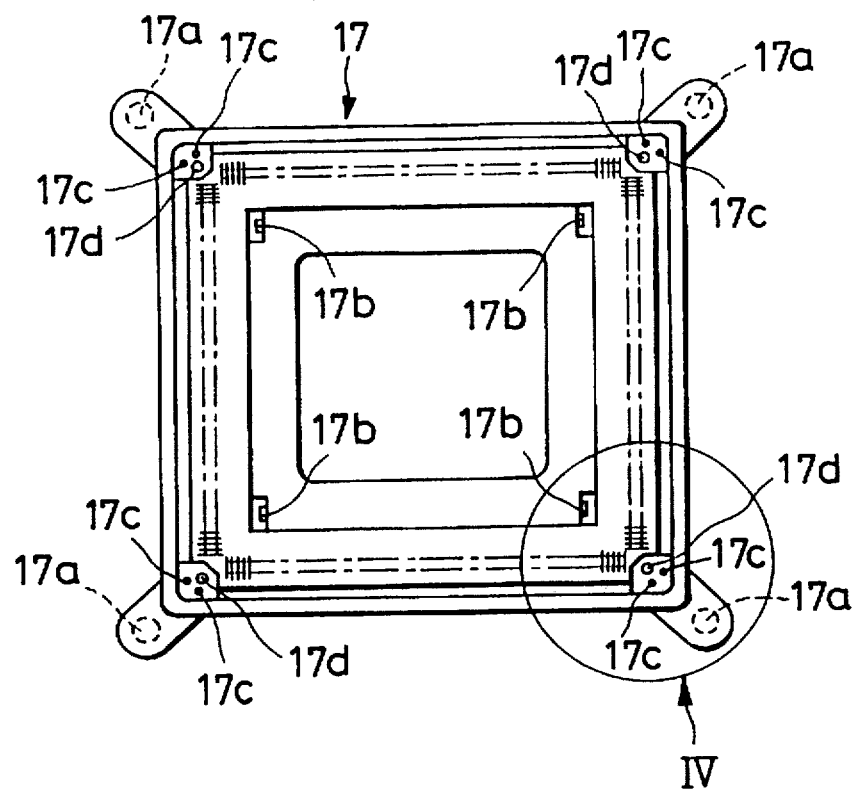
FIG. 29 is a plan view of a first floating member according to the FIG. 21 embodiment.
Figure 30:
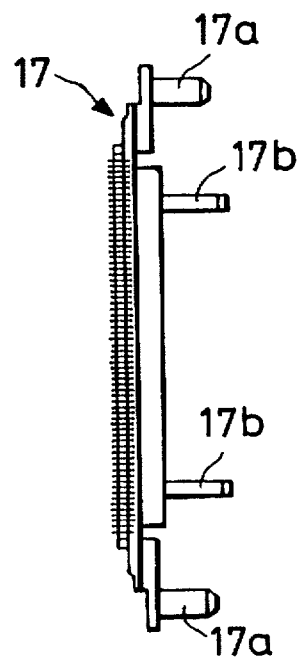
FIG. 30 is a right-side view of the first floating member shown in FIG. 29.

Now, description will be made on the first floating member 17 and the second floating member 18 mainly using FIGS. 29–34. FIG. 29 is a plan view of the first floating member 17 and FIG. 30 is a right-side view of the same. The first floating member 17 is provided with guide pins 17a which are located at four positions on a lower side thereof and are fitted in the holes 1q of the socket body 1. At another four positions on the lower side, elastic hook portions 17b are provided to be fitted in the holes 1p of the socket body 1 so as to have their ends engaged with the holes 1p. The first floating member 17 is urged upward by springs not shown in the drawings but wound around the guide pins 17a in the state of FIG. 21, while its upper limit position is regulated by the engagement between the end of the hook portions 17b and the holes 1p. On each corner of the first floating member 17, two non-through holes 17c and one non-through hole 17d are formed. Ribs formed on the first floating member 17 will be detailed later.

Figure 31:
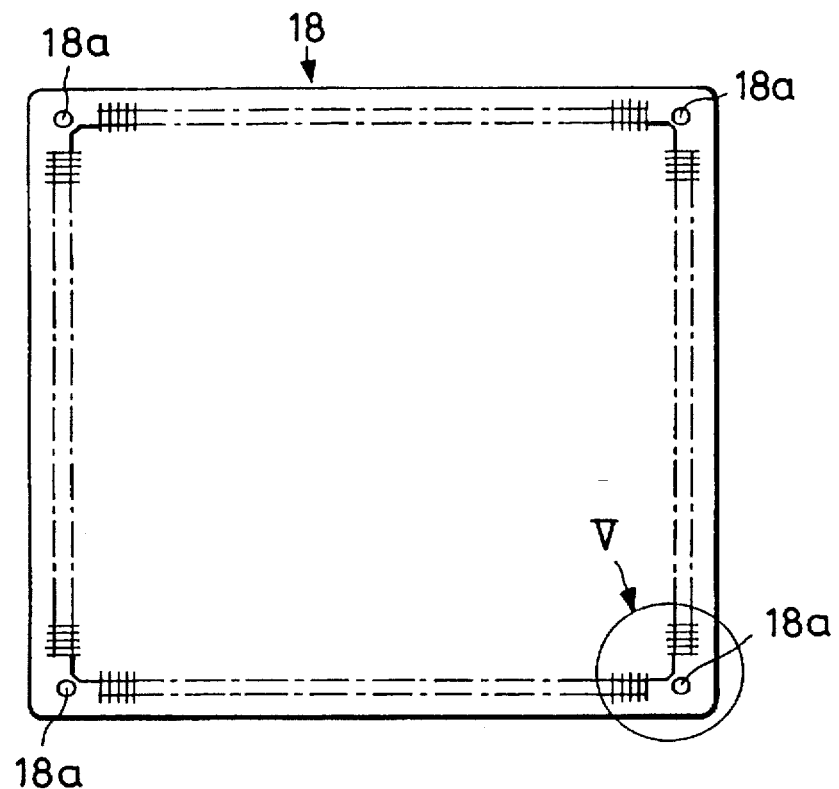
FIG. 31 is a plan view of a second floating member according to the FIG. 21 embodiment.
Figure 32:
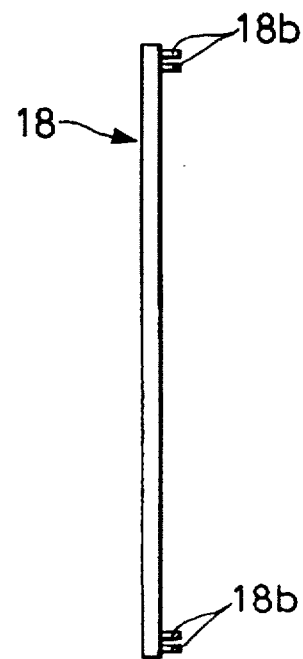
FIG. 32 is a right-side view of the second floating member shown in FIG. 31.
Figure 33:
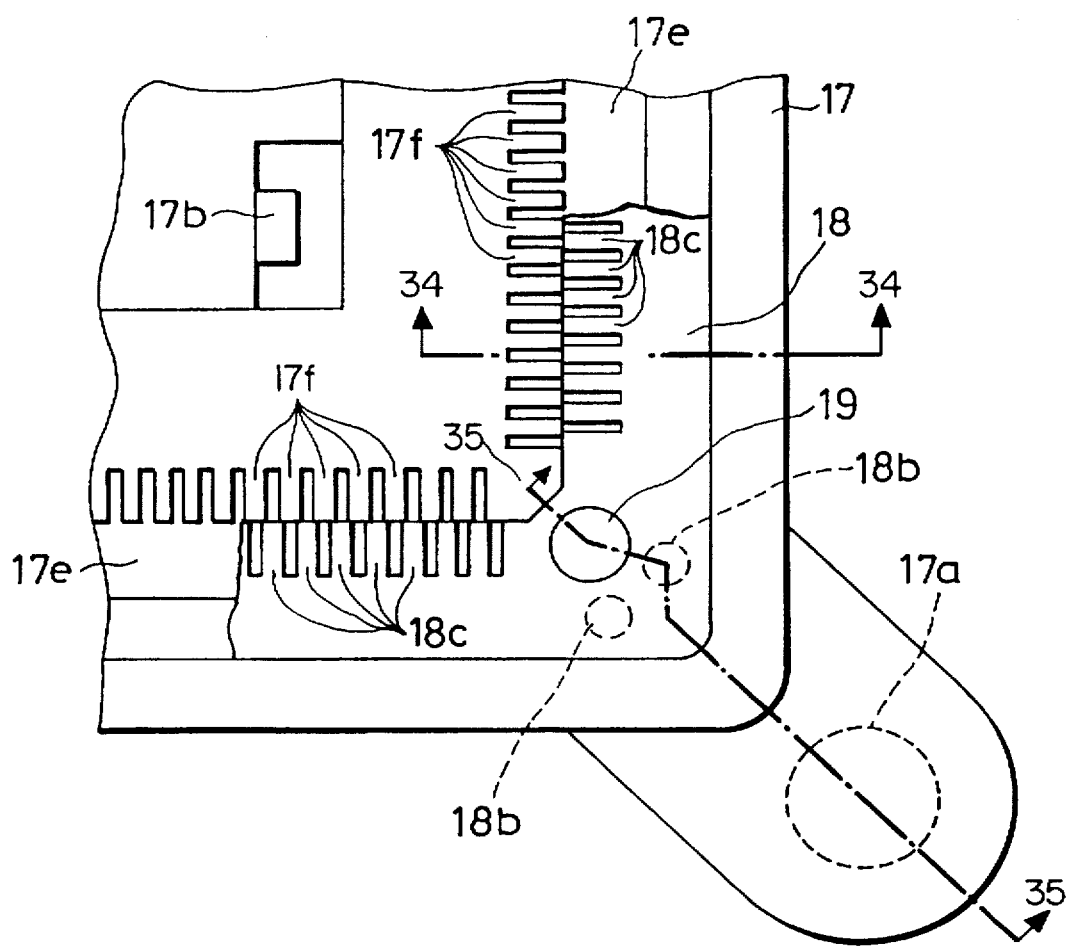
FIG. 33 is an enlarged partial plan view illustrating the first floating member and the second floating member of the FIG. 21 embodiment integrally fixed to each other.
Figure 35:
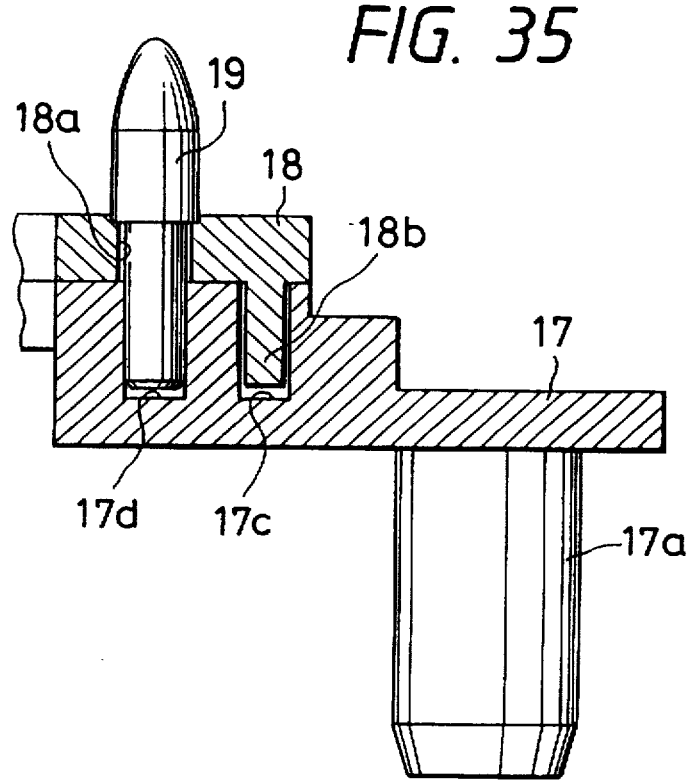
FIG. 35 is a sectional view taken along the line 35—35 of FIG. 33.

FIG. 31 is a plan view of the second floating member 18 and FIG. 32 is a right-side view of the same. The second floating member 18 is zonal-square-shaped and has four through holes 18a formed on four corners thereof. On a lower side of the second floating member 18, two pins 18b are formed at four substantial corners. FIG. 33 shows a state where the first floating member 17 and the second floating member 18 are integrally fixed to each other by a reference pin 19, upon the pins 18b being fitted in the holes 17c. As shown in FIG. 35, the reference pin 19 passes through the hole 18a of the second floating member 18 and is thrust into the hole 17d of the first floating member 17. The reference pin 19 is provided to be fitted in a hole formed on the printed wiring film PCB of the TAB package.

Figure 34:
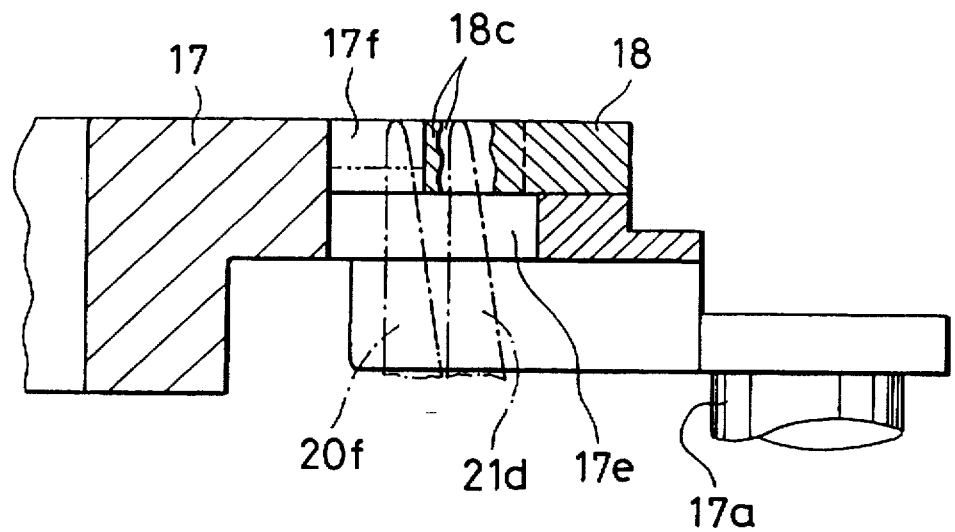
FIG. 34 is a sectional view taken along the line 34—34 of FIG. 33.

FIG. 33 corresponds to superposition of the part indicated by the circle V of FIG. 31 over the part indicated by the circle IV of FIG. 29. As shown in FIG. 33, a slot 17e is formed along each of four sides of the first floating member 17, and as shown in FIG. 34, has ribs 17f formed on an upper portion of its inner edge. The ribs 17f are arranged along each of the four sides at regular intervals as shown in FIG. 33, to oppose the ribs 15b of the core blocks 15 each to each when the floating members are mounted to the socket body 1. On the other hand, ribs 18c are formed on inner circumferential four sides of the second floating member 18. The ribs 18c are arranged along each of the four sides at regular intervals as shown in FIG. 33, to correspond to the ribs 15c of the core blocks 15 each to each when the floating members are mounted to the socket body 1.

Figure 36A:
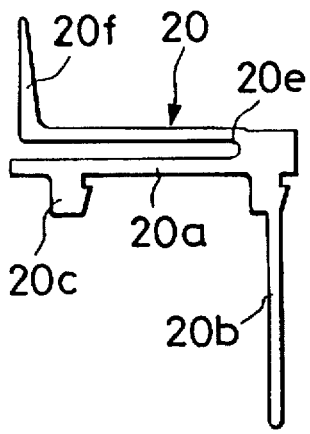
FIGS. 36A–36F are side views of types of contact pins used for the FIG. 21 embodiment to show their shapes.
Figure 36B:
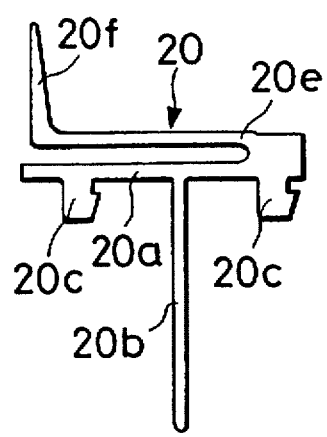
Figure 36C:
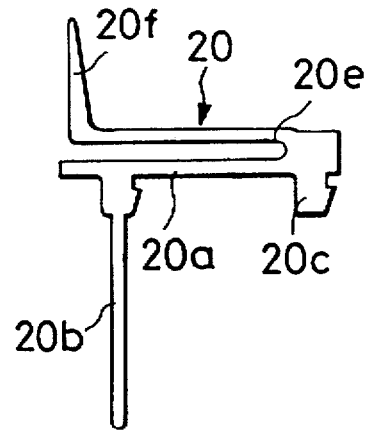

Now, shapes of the contact pins and engagement relationship between these contact pins and respective ribs will be detailed. FIGS. 36A, 36B, 36C show three types of first contact pins 20, and FIGS. 37A, 37B, 37C show three types of second contact pins 21. Both of the contact pins 20, 21 are substantially U-shaped, but the first contact pins 20 have a larger U shape than that of the second contact pins 21. These contact pins 20, 21 are alternately arranged in the socket body so as to lie on their lateral side of U shape.

On base sections 20a of the first contact pins 20, connecting terminals 20b and protrusions 20c are formed. Positions of the connecting terminals and the protrusion 20c are different among the three types of the first contact pins 20 shown in FIGS. 36A, 36B, 36C, and differnce among them exist also in that the first contact pin 20 shown in FIG. 36B has two protrusions 20c. Each of the first contact pins 20 has a spring section 20e and a free end section 20f which rises vertically to form its end as a contact portion. On a base section 21a of each of the second contact pins 21, a connecting terminal 21b is formed. Difference among the three types of the second contact pins 21 shown in FIGS. 36D, 36E, 36F exists only in the position of the connecting terminal 21b. Each of the second contact pins 21 has a spring section 21c and a free end section 21d which rises vertically to form its end as a contact portion.

Figure 36D:
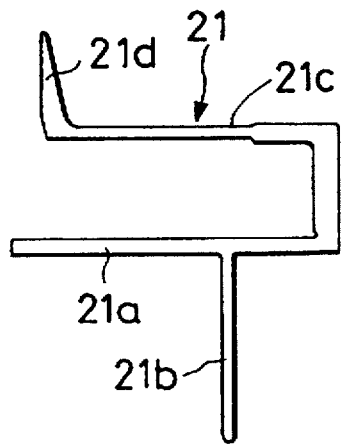
Figure 36E:
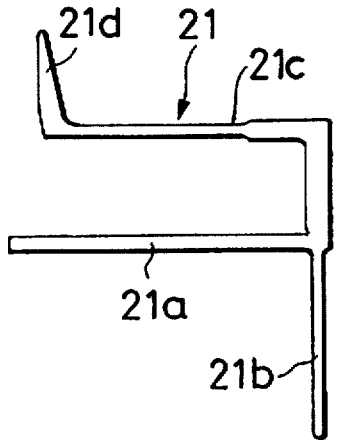
Figure 36F:
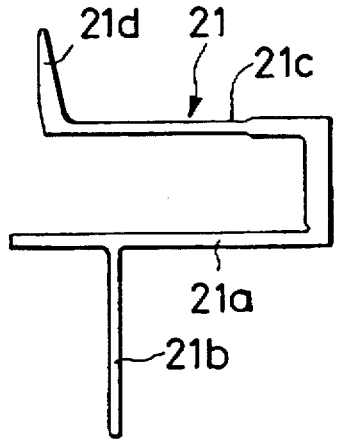

Now, assembling processes concerning the contact pins 20, 21 will be described. The contact pins 20, 21 are fixed to the core blocks 15 one by one. The order of fixing is explained mainly using FIGS. 26–28 and FIGS. 36A–36F. To begin with, a first contact pin 20 shown in FIG. 36A is fixed such that its base section 20a is fitted in a groove between the ribs 15b with a connecting terminal 20b and a protrusion 20c formed thereon made inserted into the holes 15d shown in FIG. 26. Next, a second contact pin 21 shown in FIG. 36D is fixed so that its base section 21a is inserted in a groove between the rib 15c shown in FIG. 26 and the rib 15c shown in FIG. 27. Then, in the similar manner, a first contact pin 20 shown in FIG. 36B is fixed so that a connecting terminal 20b and two protrusions 20c are inserted in the holes 15d shown in FIG. 27, that is, the base section 20a is fitted in a groove between the rib 15b indicated in FIG. 26 and the rib 15b indicated in FIG. 27. This type of fixing is shown in FIG. 21. Next, a second contact pin 21 shown in FIG. 36E is fixed so that its base section 21a is inserted in a groove between the rib 15c shown in FIG. 27 and the rib 15c shown in FIG. 28. After that, a first contact pin 20 shown in FIG. 36C is fixed so that a connecting terminal 20b and a protrusion 20c are inserted in the holes 15d shown in FIG. 28, that is, the base section 20a is fitted in a groove between the rib 15b indicated in FIG. 27 and the rib 15b indicated in FIG. 28. At an end of the order, a second contact pin 21 shown in FIG. 36F is fixed so that its base section 21a is inserted in a groove between the rib 15c shown in FIG. 28 and an adjacent rib 15c behind it. As stated above, the contact pins 20, 21 are fixed to the core blocks 15 by turns with appearence of these six types shown in FIGS. 36A–36F as one cycle of repetition. Consequently, in the state where the fixing of the contact pins 20, 21 to one core block 15 is completed, the contact portions of the first contact pins 20 and the contact portions of the second contact pins are arranged in respective single rows along the longitudinal direction of the core block 15.

After the fixing of the contact pins 20, 21 to the core block 15, connecting terminals 20b, 21b of the contact pins 20, 21 are made pass through the perforations 1r in the socket body 1 and through perforations 3b correspondently arranged in the locating board 3. Then, the core block 15 is fixed to the socket body 1 by caulking with the rivets 16. The state shown in FIG. 22 where only one of the core blocks 15 is fixed by caulking with rivets 16 is illustrated in FIG. 21 also as a sectional view. In the configuration shown in FIG. 21, the first contact pin 20 are stable in spite of vertical movement of their contact portions, or of their free end sections 20f. This is not only because the connecting terminals 20b are inserted in the holes 15d so that the base sections 20a are thrust into the grooves between the ribs 15b, but also because the first contact pins 20 are provided with the protrusions 20c inserted in the holes 15d. On the other hand, the base sections 21a of the second contact pins 21 are held by the core block 15 and the socket body 1 therebetween, to be in a considerably stable condition. However, the second contact pins may be structured to have protrusions similar to those of the first contact pins 20 to be fitted in holes formed in the core block 15 or in the socket body 1, or may have their base sections 21a held between ribs formed on the socket body 1. Of course, some cases only requires that the base sections 21a are thrust into the grooves between the ribs 15c. In other words, according to this embodiment, it is not a necessary configuration that the base sections 21a is held by the core block 15 and the socket body 1 therebetween; an airspace may be provided between the base sections 21a and the socket body 1.

In the next assembling stage, the integral body including the first floating member 17 and the second floating member 18 preliminarily fixed together with the reference pins 19 is set in its position with the hook portions 17b of the first floating member 17 being engaged with the holes 1p of the socket body 1. On this occasion, the contact portions at the ends of the free end sections 20f of the first contact pins 20 are made fitted between the ribs 17f and the contact portions at the free end sections 21d of the second contact pins 21 are made fitted between the ribs 18c. Of course, another order of assembling is possible, where, at first, the first floating member 17 is set in its place to make the contact portions of the contact pins 20 fitted between the ribs 17f, then the second floating member 18 is placed upon the first floating member 17 to make the contact portions of the contact pins 21 fitted between the ribs 18c, and at last, the first floating member 17 and the second floating member 18 are integrally fixed together with the reference pins 19. As understood from the above discussion, this embodiment allows a body including the first floating member 17 and the second floating member 18, or a body including the first floating member 17, the second floating member 18 and the reference pins 19, to be integrally formed of synthetic resin.

In the IC socket of this embodiment assembled as described above, the first contact pins 20 and the second contact pins 21 are sufficiently spaced among their respective selves to avoid mutual contact. Furthermore, since the first contact pins 20 and the second contact pins 21 are different in size of their U shape, and positional relationship between the vicinity of the free end sections 20f and the vicinity of the free end sections 21d, which relationship should be of the greatest concern, is steadily regulated by the ribs 17f and the ribs 18c arranged closed to each other, mutual contact of adjacent contact pins 20 and 21 is impossible even if the contact pins bend owing to the spring sections 20e, 21c.

Therefore, this configuration is applicable also to an IC socket for IC devices having lead terminals arranged in one row, not limited to the socket for IC devices having lead terminals set in a zigzag array. In such a case, this embodiment is modified, for example, so that the upper surfaces of the ribs 17f are lowered to the level indicated by the double dot & dash line of FIG. 34 and the free end sections 21d of the second contact pins 21 are bent over the ribs 17f so that the contact portions of the second contact pins 21 are aligned to the row of the contact portions of the first contact pins 20.

Also, while this embodiment adopts the configuration in which the base sections 20a of the first contact pins 20 are thrust into the grooves between the ribs 15b formed on the upper surface of the core block 15 and the base sections 21a of the second contact pins 21 are thrust into the grooves between the ribs 15c on the lower surface of the core block 15, another configuration is possible in which two core blocks are spacedly arranged one above the other so that the base sections 20a of the first contact pins 20 and the base sections 21a of the second contact pins 21 are thrust from upside in the same attitude into grooves between ribs formed on their respective corresponding core blocks. Of course, if condition allows types of the contact pins to be increased, this configuration is allowed to be further modified so that larger number of core blocks are spacedly arranged one above another. Also, the contact pins are allowed to be thrust either into grooves between ribs formed on the respective upper surfaces of the core blocks, or into grooves between ribs formed on the respective lower surfaces of the core blocks.

To load the TAB package, at first the TAB package is placed on the socket body 1 so that the notches formed in the frame (carrier) CA is aligned to the pins 1e, and then the cover 2 is closed to cause the pressing section 2B3 of the pressing plate 2B to press the IC chip T on the movable stage 6 as well as to cause the auxiliary pressing plate 2D to press the printed wiring film PCB to the first floating member 17 and the second floating member 18 through pushing the frame CA. Force via the pressing plate 2B acts on the IC chip T substantially in a vertical direction as a result of the configuration of the pressing blate 2B pivotably supported by the shaft 1b with a play as well as relationship between the end section 2B1 of the pressing plate 2B and the hole 2A3.

As the movable stage 6 moves downward against the springs 7 by the pushing via the pressing section 2B3, ends of known high heat transfer pins 8 are steadily brought into contact with the IC chip T, whereby heat radiating from the IC chip T during the inspection is transferred to the printed circuit board. On the other hand, as the first floating member 17 and the second floating member 18 are pushed, they move downward against the springs not shown in the drawings but wound around the guide pins 17a, whereby the lead terminals formed on the printed wiring film PCB are brought into contact with the contact portions formed on the ends of the free end sections 20f, 21d of the contact pins 20, 21.

After the lead terminals formed on the printed wiring film PCB are brought into contact with the contact pins 20, 21, the first floating member 17 and the second floating member 18 are further pushed until an appropriate contact force is applied to every contact point to assure electrical connection. Finally, the hook section 2C1 of the hook member 2c is engaged with the hook section 1c of the socket body 1, to assume the state shown in FIG. 21.

Figures 44A, 44B:
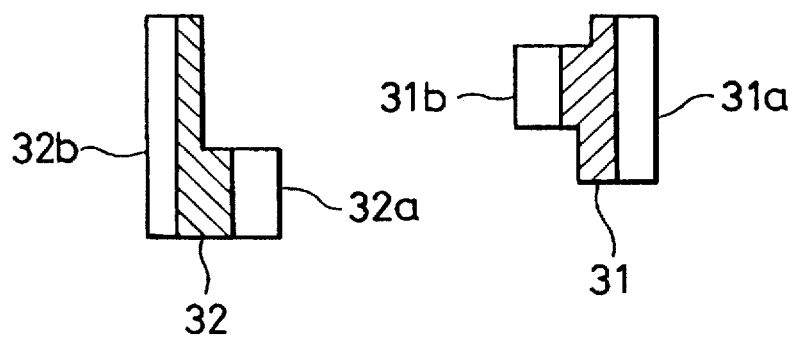
FIG. 44A is a sectional view taken along the line 44a—44a of FIG. 43A.
FIG. 44B is a sectional view taken along the line 44b—44b of FIG. 43B.
Figure 45:
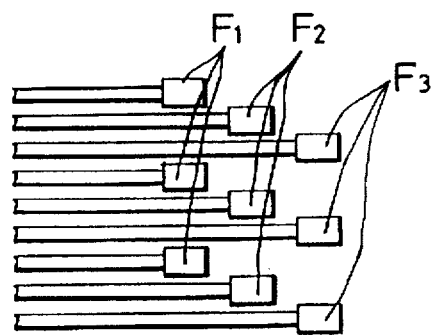
FIG. 45 shows one arrangement example of lead terminals of TAB package.

Next, refering to FIG. 37 through FIG. 51, still another embodiment of the present invention will be described. This embodiment is configured to be applied to TAB packages whose lead terminals are arranged in three rows to form a zigzag array as shown in FIG. 45.

Figure 41:
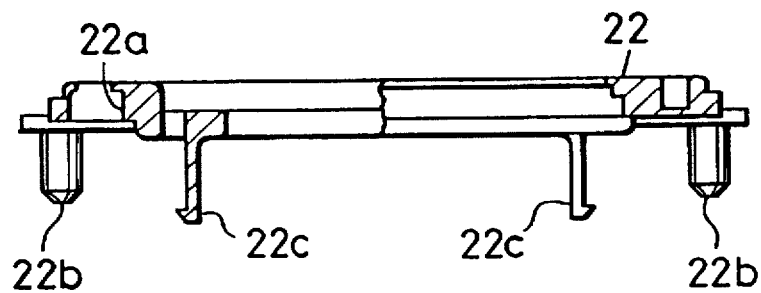
FIG. 41 is a sectional view taken along the line 41—41 of FIG. 40.

As understood from FIGS. 37–41, above a base plate of a socket body 1, a floating member 22 is mounted to the socket body 1 so as to be vertically displaceable relative thereto. The floating member 22 has four openings 22a corresponding to regions of the TAB package where lead terminals F1, F2, F3 (shown in FIG. 45) are set in a zigzag array. As shown in FIG. 41, on each corner section of the floating member 22, a guide pin 22b is formed to protrude downward. The guide pins 22 are slidably fitted in boss portions (not shown in the drawing) formed on the base plate of the socket body 1. The floating member 22 is urged upward by coil springs 23 (shown in FIG. 37) fitted on the guide pins 22b. Furthermore, at each substantial corner of the floating member 22, a hook portion 22c is formed to protrude downward. Upward movement of the floating member 22 is limited by engagement of ends of the hook portions 22c with lock portions formed on the base plate of the socket body 1.

Figure 42A:
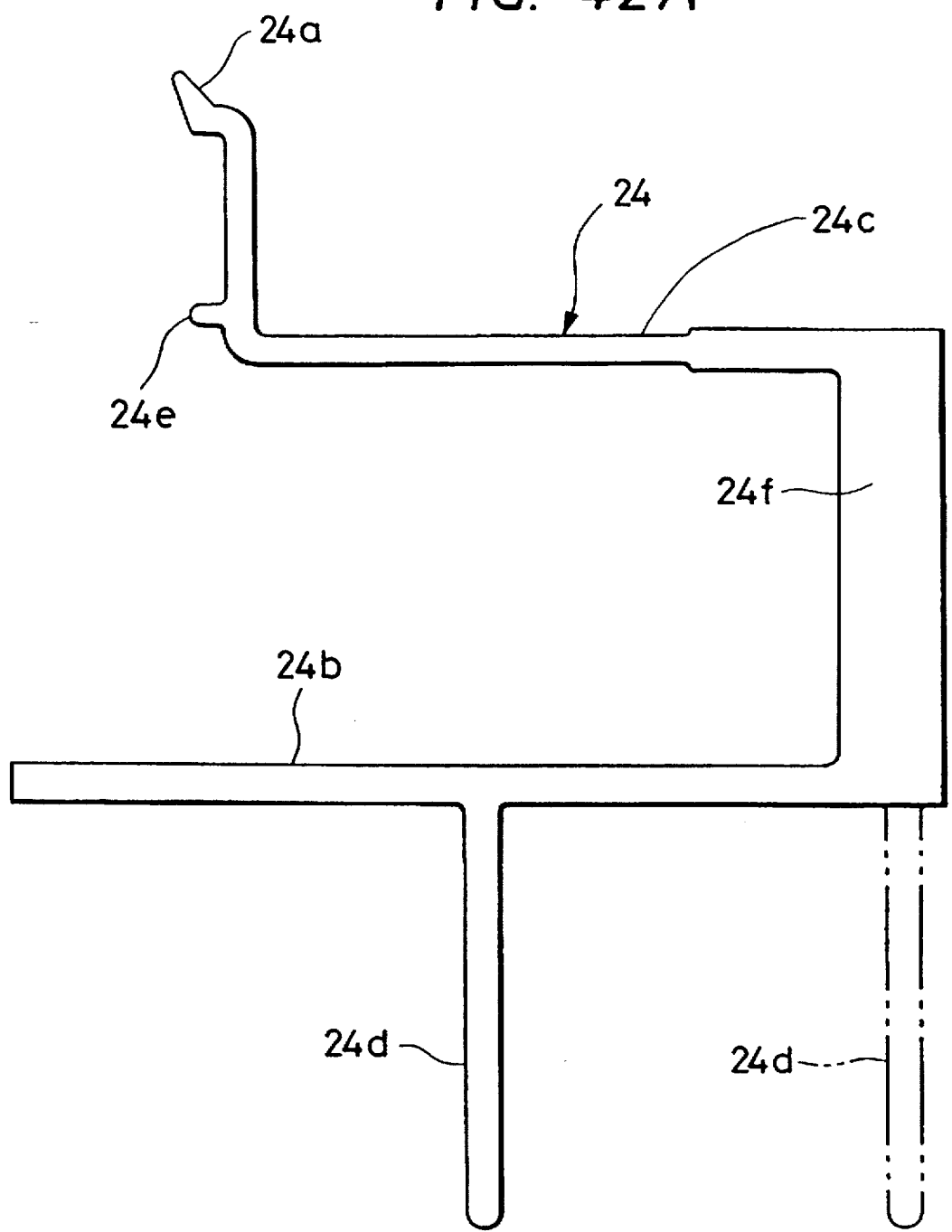
Figure 42C:
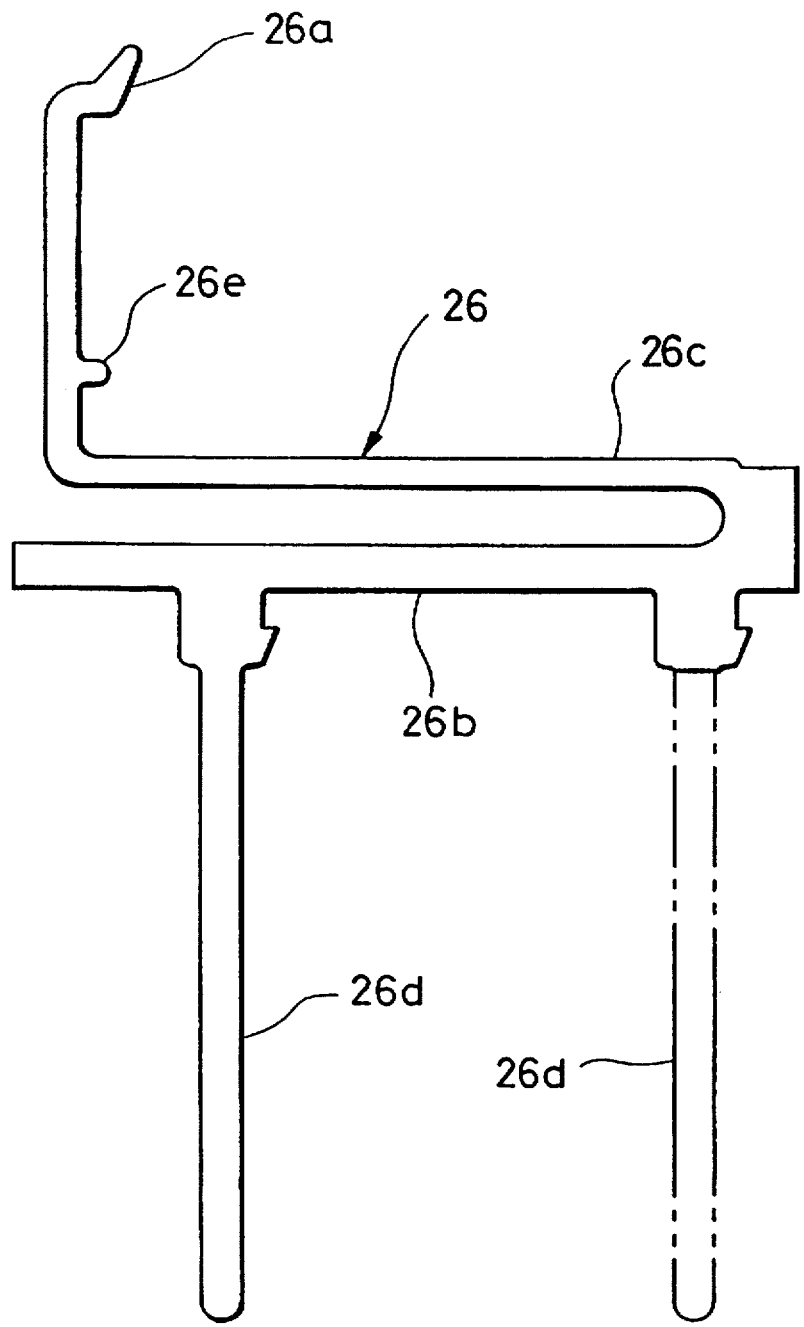

To the socket body 1, a plurality of outer contact pins 24 shown in FIG. 42A, a plurality of middle contact pins 25 shown in FIG. 42B, and a plurality of inner contact pins 26 shown in FIG. 42C are fixed. The contact pins 24, 25, 26 are structured to have spring sections 24c, 25c, 26c between free end sections having contact portions 24a, 25a, 26a to be brought into contact with the lead terminals F1, F2, F3 of the TAB package via the openings 22a of the floating member and base sections 24b, 25b, 26b.

Figure 37:
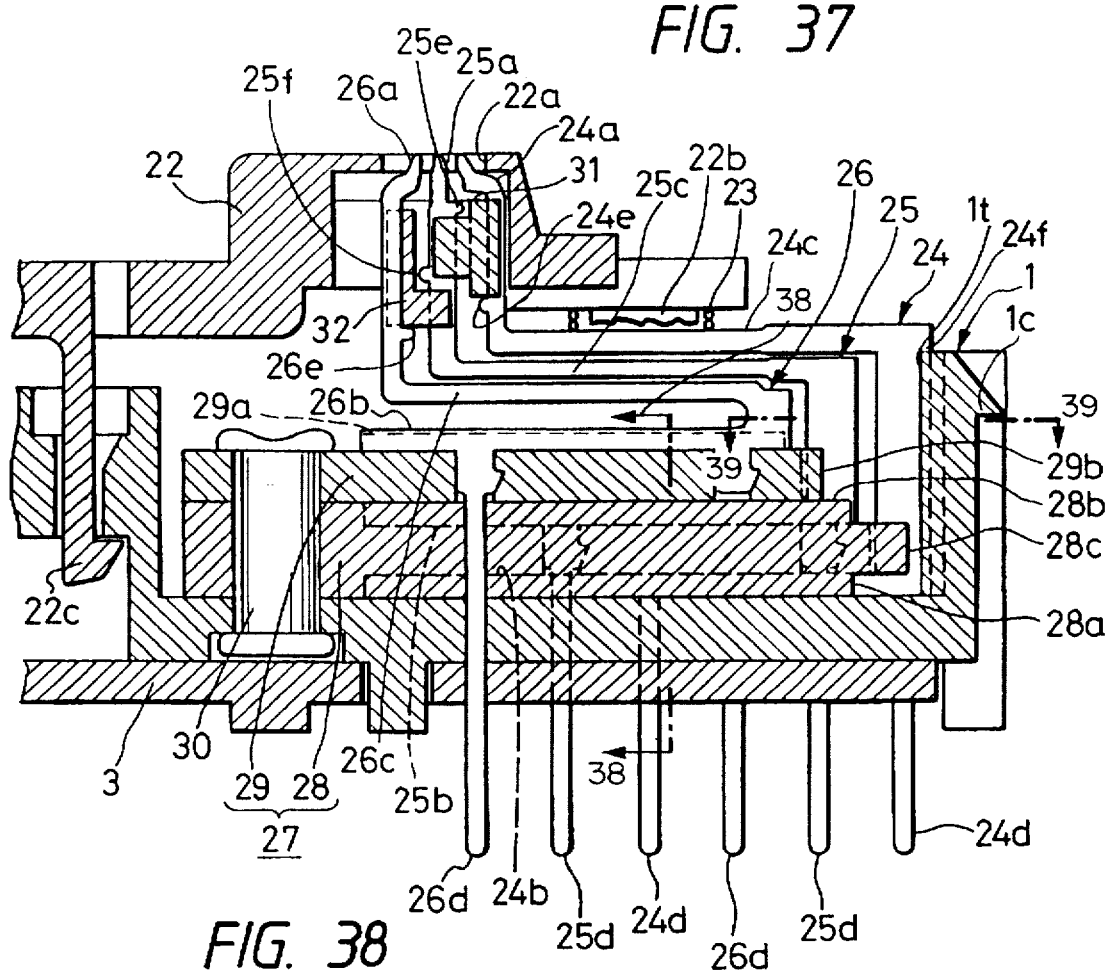
FIG. 37 is a sectional view, as an analogue of FIG. 2, of an IC socket according to still another embodiment of the present invention, illustrating a state where its cover is closed upon loading of an IC device.

Each of the spring sections 24c, 25c, 26c of the contact pins 24, 25, 26 has a vertical piece extending substantially vertically in an upward direction from an outer end of each of the base sections 24b, 25b, 26b and a horizontal piece extending substantially horizontally in an inward direction relative to the socket body 1 from an upper end of the vertical piece. As shown in FIG. 37, the spring section 24c of the outer contact pin 24 is located above the spring section 25c of the middle contact pin 25, and the spring section 26c of the inner contact pin 26 is located below the spring section 25c of the middle contact pin 25.

Figure 38:
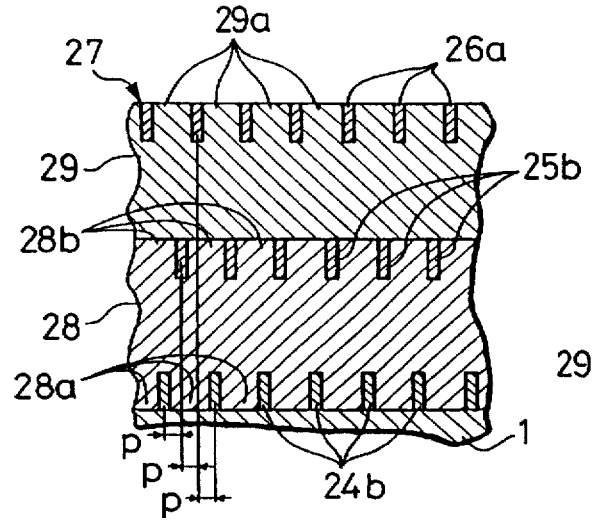
FIG. 38 is a sectional view taken along the line 38—38 of FIG. 37.
Figure 47:
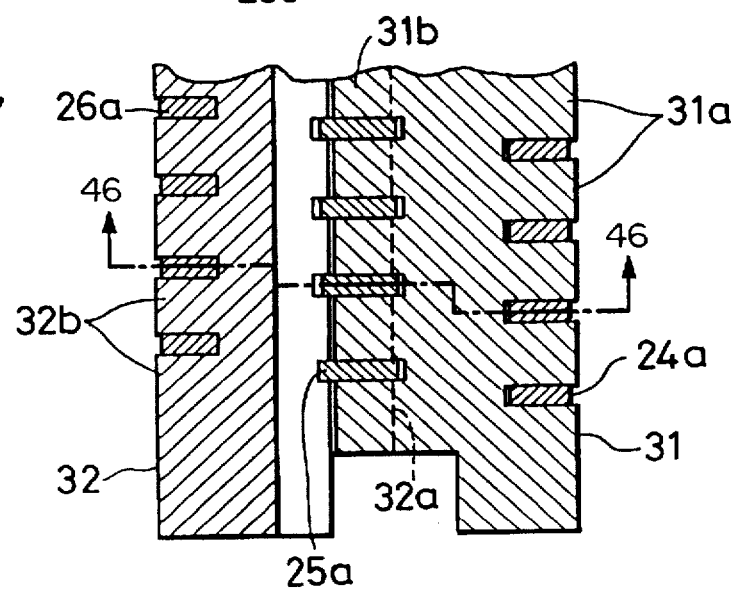
FIG. 47 is a sectional view taken along the line 47—47 of FIG. 46.

Each of the free end sections, which form contact portions 24a, 25a, 26a, of the contact pins 24, 25, 26 extends upward from an inner side end of each of the horizontal pieces of the spring sections 24c, 25c, 26c. To be precise, the free end section of the middle contact pin 25 extends substantially vertically in an upward direction from the inner side end of the horizontal piece of the spring section 25c to the top end of the contact portion 25a, while the free end sections of the outer and inner contact pins 24, 26 extend substantially vertically in an upward direction from the inner side ends of the horizontal pieces of the spring sections 24c, 26c to the points in the vicinity of the contact portions 24a, 26a but further extend in directions toward the top end of the contact portion 25a of the contact pin 25 from these points to their top ends of the contact portions 24a, 26a. Furthermore, the contact portions 24a, 25a, 26a of the contact pins 24, 25, 26 are arranged in three rows to form a zigzag array corresponding to the zigzag array of the lead terminals F1, F2, F3 of the TAB package. Specifically, as shown in FIG. 47 and FIG. 38, this embodiment adopts a zigzag array such that an inner contact pin 26 and an outer contact pin 24 are located adjacent to a middle contact pin 25 on respective sides of the middle contact pin 25. Consequently, contact pins included in one row keep a pitch width three times a pitch width p between adjacent contact pins.

Figure 39:
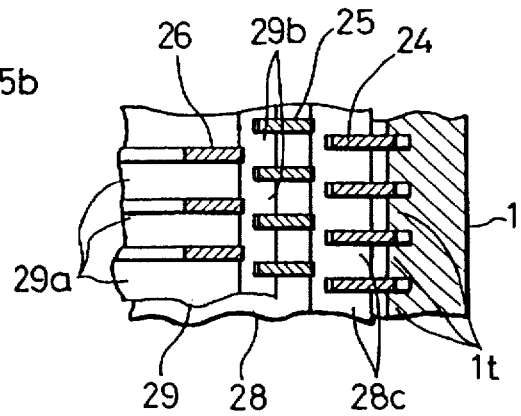
FIG. 39 is a sectional view taken along the line 39—39 of FIG. 37.
Figure 40:
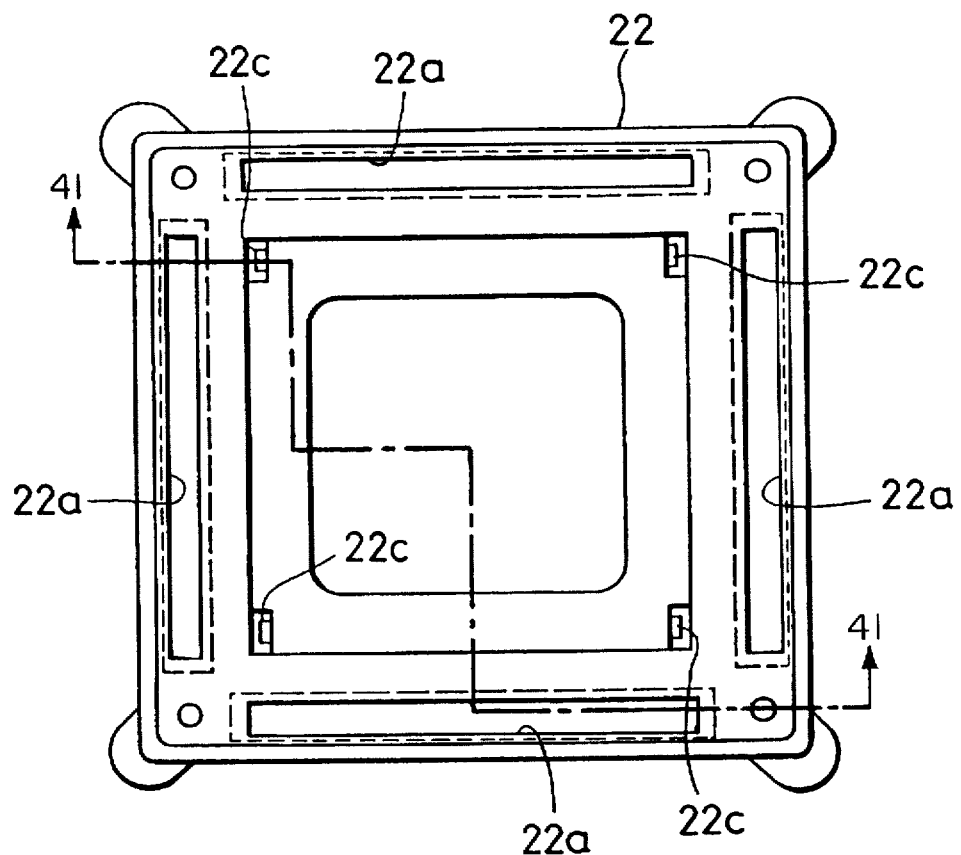
FIG. 40 is a plan view of a floating member according to the FIG. 37 embodiment.

As shown in FIGS. 37, 38, 39, a core block 27 including layers of a lower plate piece 28 and an upper plate piece 29, which are made of synthetic resin, is located under the floating member 22 and fixed on the base plate of the socket body 1 with a rivet 30. Although the plate pieces 28, 29 are layered without intervention of an airspace thus height of the entire core block 27 is minimized, airspaces are allowed to be formed between a plurality of plate pieces. As shown in FIG. 38, a plurality of horizontal ribs 28a for regulating intervals between the base sections 24b of the outer contact pins 24 in a row are integrally formed on a lower surface of the lower place piece 28 at a pitch width three times the pitch width p of an entire array of the contact pins 24, 25, 26, a plurality of horizontal ribs 28b for regulating intervals between the base sections 25b of the middle contact pins 25 in a row are integrally formed on an upper surface of the lower plate piece 28 at the pitch width three times the pitch width p of the entire array of the contact pins 24, 25, 26, and a plurality of horizontal ribs 29a for regulating intervals between the base sections 26b of the inner contact pins 26 in a row are integrally formed on an upper surface of the upper plate piece 29 at the pitch width three times the pitch width p of the entire array of the contact pins 24, 25, 26. As shown in FIG. 38, phases of the pitch of the horizontal ribs 28a, 28b, 29a are orderly shifted among the corresponding surfaces of the plate pieces 28, 29 by the pitch width p of the entire array of the contact pins 24, 25, 26 in accordance with the order of zigzag arrangement of the contact pins 24, 25, 26.

As shown in FIGS. 37–39 and FIG. 42A, on the base section 24b of each outer contact pin 24, integrally formed is a connecting terminal 24d for electrical connection to an external circuit board (not shown in the drawings). The connecting terminals 24d pierce the base plate of the socket body 1 and a locating board 3 mounted on a rear surface of the base plate through perforations formed therein, to protrude downward from the locating board 3. As shown in FIG. 42A, the outer contact pins 24 have their connecting terminals 24d selectively formed at an inner position indicated by the solid line or at an outer position indicated by the double dot & dash line, to be arranged by turns in a direction of the row of the outer contact pins 24. Similarly, each middle contact pin 25 has a connecting terminal 25d protruding downward from the base section 25b. The connecting terminals 25d pierce the lower plate piece 28, the base plate of the socket body 1 and the locating board 3 through perforations formed therein, to protrude downward from the locating board 3. As shown in FIG. 42B, the middle contact pins 25 also have their connecting terminals 25d selectively formed at an inner position indicated by the solid line or at an outer position indicated by the double dot & dash line, to be arranged by turns in a direction of the row of the middle contact pins 25. Also, each inner contact pin 26 has a connecting terminal 26d protruding downward from the base section 26b. The connecting terminals 26d pierce the upper plate piece 29, the lower plate piece 28, the base plate of the socket body 1 and the locating board 3 through perforations formed therein, to protrude downward from the locating board 3. As shown in FIG. 42C, the inner contact pins 26 also have their connecting terminals 26d selectively formed at an inner position indicated by the solid line or at an outer position indicated by the double dot & dash line, to be arranged by turns in a direction of the row of the inner contact pins 26. Consequently, according to this embodiment, the connecting terminals 24d, 25d, 26d of the contact pins 24, 25, 26 protrude downward from the locating board 3 to form a zigzag array in six rows. However, another configuration is allowable where the connecting terminals 24d, 25d, 26d of the contact pins 24, 25, 26 protrude downward from the locating board 3 simply forming a zigzag array in three rows.

As shown in FIGS. 37 and 39, on an outer side face of the lower plate piece 28, a plurality of vertical ribs 28c for regulating intervals between the spring sections 24c of the outer contact pins 24, which are to be held to this face, are integrally formed at the pitch width three times the pitch width p of the entire array of the contact pins 24, 25, 26; on an outer side face of the upper plate piece 29, a plurality of vertical ribs 29b for regulating intervals between the spring sections 25c of the middle contact pins 25, which are to be held to this face, are integrally formed at the pitch width three times the pitch width p of the entire array of the contact pins 24, 25, 26; and on an inside face of an enclosure wall of the socket body 1 also, a plurality of vertical ribs It for regulating intervals between the spring sections 24c of the outer contact pins 24, which are to be held to this face, are integrally formed at the pitch width three times the pitch width p of the entire array of the contact pins 24, 25, 26.

Figures 43A, 43B:
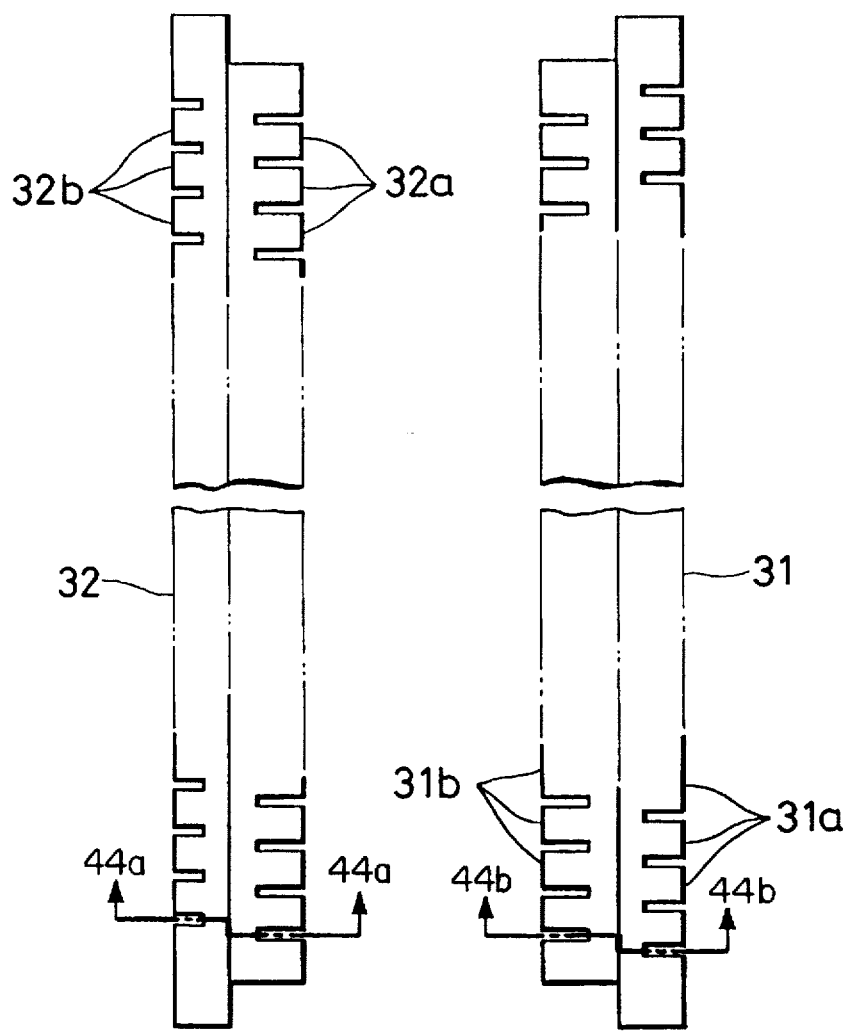
FIGS. 43A–43B are plan views of separator members used for the FIG. 37 embodiment.
Figure 46:
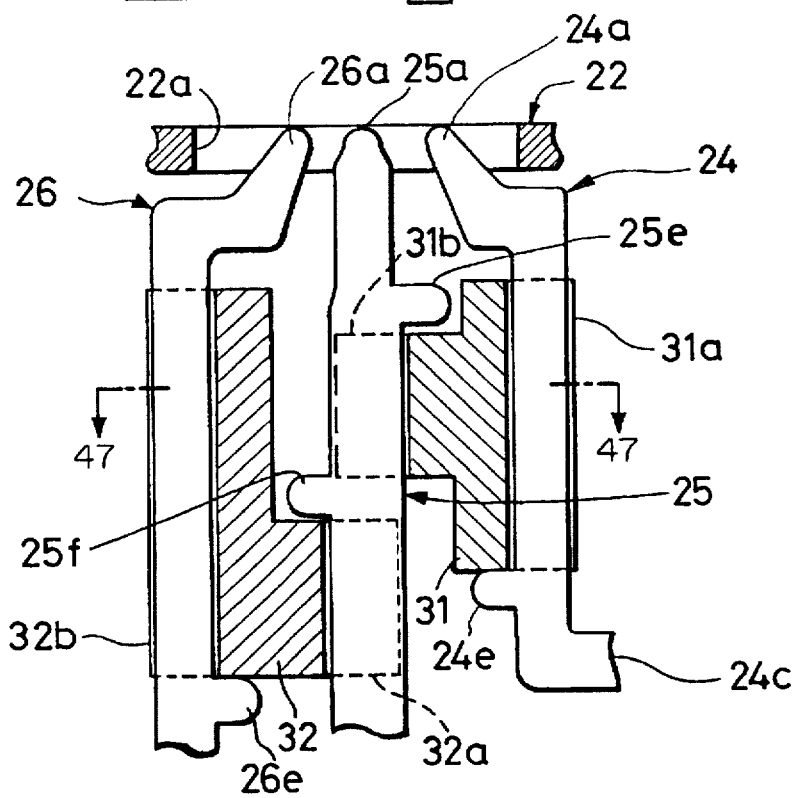
FIG. 46 is a sectional view taken along the line 46—46 of FIG. 47.

As shown in FIGS. 46 and 47, an outer separator member 31 is provided between the free end sections of the outer contact pins 24 and the free end sections of the middle contact pins 25, and an inner separator member 32 is provided between the free end sections of the middle contact pins 25 and the free end sections of the inner contact pins 26. As shown in FIGS. 43B, 44B, on an outer side face and an inner side face of the outer separator member 31 respectively, pluralities of vertical ribs 31a, 31b for regulating intervals of the free end sections of the outer and middle contact pins 24, 25 are integrally formed at the pitch width three times the pitch width p of the entire array of the contact pins 24, 25, 26. Also, as shown in FIGS. 43A, 44A, on an outer side face and an inner side face of the inner separator member 32 respectively, pluralities of vertical ribs 32a, 32b for regulating intervals of the free end sections of the middle and inner contact pins 25, 26 are integrally formed at the pitch width three times the pitch width p of the entire array of the contact pins 24, 25, 26. As shown in FIGS. 37 and 46, the vertical ribs 31b formed on the inner side face of the outer separator meber 31 are located above the vertical ribs 32a formed on the outer side face of the inner separator member 32, and the free end sections of the middle contact pins 25 are engaged with the vertical ribs 31b on the inner side face of the outer separator member 31 and with the vertical ribs 32a on the outer side face of the inner separator member 32. Consequently, horizontal locations of the outer separator member 31 and the inner separator member 32 are determined with respect to the direction along the rows in the zigzag array of the contact pins via the middle contact pins 25, with the further consequence that horizontal locations of the free end sections of the outer, middle and inner contact pins 24, 25, 26 are determined with respect to the direction along the rows in the zigzag array of the contact pins via the separator members 31, 32.

Furthermore, vertical location of the outer separator member 31 is regulated by lower side abutting portions 24e protruding from an inner side of the free end sections of the outer contact pins 24 and upper side abutting portions 25e protruding from an outer side of the free end sections of the middle contact pins 25. Also, vertical location of the inner separator member 32 is regulated by upper abutting portions 25f protruding from an inner side of the free end sections of the middle contact pins 25 and lower side abutting portions 26e protruding from an outer side of the free end sections of the inner contact pins 26.

Since the IC socket described above is configured so that a core block 27 including layers of a lower plate piece 28 and an upper plate piece 29 is fixed to the base plate of the socket body 1 at a location under the floating member 22, wherein a plurality of ribs (the horizontal ribs 28a) for regulating intervals of the base sections 24b of the outer contact pins 24 are integrally formed on a surface selected out of surfaces of the two plate pieces 28, 29 to correspond to the row of the outer contact pins 24 (the lower surface of the lower plate piece 28), a plurality of ribs (the horizontal ribs 28a) for regulating intervals of the base sections 25b of the middle contact pins 25 are integrally formed on a surface selected out of the surfaces of the two plate pieces 28, 29 to correspond to the row of the middle contact pins 25 (the upper surface of the lower plate piece 28), and a plurality of ribs (the horizontal ribs 29a) for regulating intervals of the base sections 26b of the inner contact pins 26 are integrally formed on a surface selected out of the surfaces of the two plate pieces 28, 29 to correspond to the row of the inner contact pins 26 (the upper surface of the upper plate piece 29), ribs 28a, 28b, 29a are allowed to have thickness greater than the pitch width p of the entire array of the contact pins 24, 25, 26. According to this embodiment, if the pitch width p of the entire array of the contact pins 24, 25, 26 is 0.2 mm and plate thickness of the pins is 0.1–0.12 mm for example, pitch width of the ribs 28a, 28b, 29a comes to 0.6 mm thus 0.48–0.5 mm thickness is secured for the ribs 28a, 28b, 29a. Since the base sections 24a, 25a, 26a of the contact pins 24, 25, 26 are steadily held by the ribs 28a, 28b, 29a having thickness greater than the pitch width p of the entire array of the contact pins 24, 25, 26, the contact pins 24, 25, 26 can be steadily fixed at a narrow pitch width not greater than 0.2 mm, free from problems concerning processing fineness or strength of the formed synthetic resin. Furthermore, since phases of the pitch of the ribs 28a, 28b, 29a are orderly shifted among the selected surfaces of the plate pieces 28, 29 by the pitch width p of the entire array of the contact pins 24, 25, 26 in accordance with the order of zigzag arrangement of the contact pins 24, 25, 26, uniform pitch width over the entire array of the contact pins 24, 25, 26 can be easily obtained.

Furthermore, in the IC socket configured as described above, since the core block 27 comprises layers of the lower plate piece 28 having the horizontal ribs 28a the horizontal ribs 28b respectively formed on the upper and lower surfaces thereof and the upper plate piece 29 having the horizontal ribs 29a formed on the upper surface thereof, number of the plate pieces required is less than number of rows in the zigzag array of the contact pins 24, 25, 26, thus number of parts and assemblies can be reduced. Also, the height of the entire core block 27 can be reduced to realize compact-sizing of the IC socket.

Furthermore, in the IC socket configured as described above, since the vertical ribs 28c, 29b for regulating respective intervals of the spring sections 24c, 25c in the rows of the contact pins 24, 25 are respectively formed on the outer side faces of the plate pieces 28, 29, to which the spring sections 24c, 25c are to be held, the spring sections 24c, 25c of the contact pins 24, 25 can be stably supported by the vertical ribs 28c, 29c on the outer side faces of the plate pieces 28, 29, upon thickness of the vertical ribs 28c, 29c being secured to be greater than the pitch width of the entire array of the contact pins 24, 25, 26. While the contact pins 24, 25 to be held to the outer side faces of the plate pieces 28, 29 are larger than the contact pins 26 in size of the spring section, specifically in length of the vertical piece and thus are more liable to warp horizontally, the vertical ribs 28c, 29b prevent such warp with great effect.

Furthermore, in the IC socket configured as described above, since the vertical ribs 1t for regulating intervals of the spring sections 24c in the row of the outer contact pins 24 are formed on the inside face of the enclosure wall of the socket body 1, to which vertical pieces 24f of the spring sections 24c are to be held, the vertical pieces 24f of the contact pins 24 can be stably supported by the vertical ribs it on the inside face of the enclosure wall of the socket body 1, upon thickness of the vertical ribs it being secured to be greater than the pitch width of the entire array of the contact pins 24, 25, 26. While the vertical pieces 24f of the outer contact pins 24 to be held to the inside face of the enclosure wall of the socket body 1 are longer than those of remaining contact pins 25, 26 and thus are more liable to walp horizontally, the vertical ribs It prevent such warp with great effect.

Furthermore, since the IC socket described above is configured so that separator members 31, 32 are respectively provided between the rows of the free end sections of the contact pins 24, 25, 26 arranged zigzag in three rows, wherein pluralities of vertical ribs 31a, 31b, 32a, 32b for regulating respective intervals of the free end sections of the contact pins 24, 25, 26 which are arranged in their respective single rows on respective two sides of the separator members 31, 32 are formed on respective two side faces of the separator members 31, 32, the free end sections of the contact pins 24, 25, 26 arranged zigzag in three rows can be stably supported, even if the pitch width p of the zigzag array is not greater than 0.2 mm, by the vertical ribs 31a, 31b, 32a, 32b formed on the side faces of the separator members 31, 32, upon thickness of the vertical ribs 31a, 31b, 32a, 32b being secured to be greater than the pitch width p of the entire array of the contact pins 24, 25, 26.

Furthermore, since the IC socket described above is configured so that upper side abutting portions (25e) are formed on ones of the free end sections of the contact pins 24, 25 arranged in their respective rows on respective sides of the outer separator member 31 while lower side abutting portions (24e) are formed on the others of the free end sections, thereby vertical location of the outer separator member 31 being regulated, and upper side abutting portions (25f) are formed on ones of the free end sections of the contact pins 25, 26 arranged in their respective rows on respective sides of the inner separator member 32 while lower side abutting portions (26e) are formed on the others of the free end sections, thereby vertial location of the inner seprator member 32 being regulated, the separator members 31, 32 can be easily set in their positions between the rows of the contact pins 24, 25, 26 arranged zigzag in three rows, and moreover, are allowed to be vertically displaced along with the free end sections of the contact pins 24, 25, 26.

Figure 48:
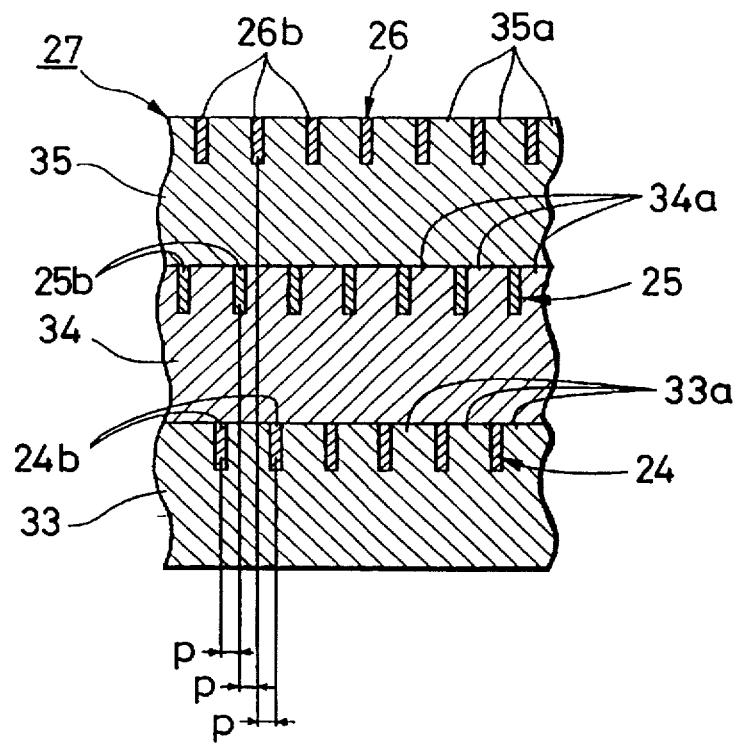
FIG. 48 is a sectional view as an analogue of FIG. 38, showing one example of core block modification according to the FIG. 37 embodiment.

FIG. 48 shows an example of another configuration of the core block 27 according to this embodiment. The core block 27 in the drawing comprises three layers of plate pieces 33, 34, 35. On an upper surface of the lower plate piece 33, a plurality of horizontal ribs 33a for regulating intervals of the base sections 24b of the outer contact pins 24, out of the contact pins 24, 25, 26 arranged zigzag in three rows, are integrally formed at a pitch width three times a pitch width p of the entire array of the contact pins 24, 25, 26; on an upper surface of the middle plate piece 34, a plurality of horizontal ribs 34a for regulating intervals of the base sections 25b of the middle contact pins 25 are integrally formed at the pitch width three times the pitch width p of the entire array of the contact pins 24, 25, 26; also, on an upper surface of the upper plate piece 35, a plurality of horizontal ribs 35a for regulating intervals of the base sections 26b of the inner contact pins 26 are integrally formed at the pitch width three times the pitch width p of the entire array of the contact pins 24, 25, 26. Phases of the pitch of the horizontal ribs 33a, 34a, 35a are orderly shifted among the selected surfaces of the plate pieces 33, 34, 35 by the pitch width p of the entire array of the contact pins 24, 25, 26 in accordance with the order of zigzag arrangement of the contact pins 24, 25, 26.

In the configuration of the core block 27 shown in FIG. 48 also, the base sections 24b, 25b, 26b of the contact pins 24, 25, 26 arranged zigzag in three rows can be stably supported at a narrow pitch width p not greater than 0.2 mm, upon thickness of the horizontal ribs 33a, 34a, 35a formed on the upper surfaces of the plate pieces 33, 34, 35, being secured to be greater than the narrow pitch width p of the zigzag array of the contact pins 24, 25, 26. Also in this configuration, while as many (three) plate pieces (33, 34, 35) as (three) rows of the zigzag array of the contact pins 24, 25, 26 are required, shape of each of the plate pieces is simplified thus is convenient for processing.

While this example according to the embodiment configures the horizontal ribs 33a, 34a, 35a to be formed on the upper surfaces of the plate pieces 33, 34, 35, another configuration where similar horizontal ribs are formed on lower surfaces of the plate pieces 33, 34, 35 is possible. Also, if the contact pins are to be arranged zigzag in four or more rows, the layers of the plate pieces could be increased accordingly.

Figure 49:
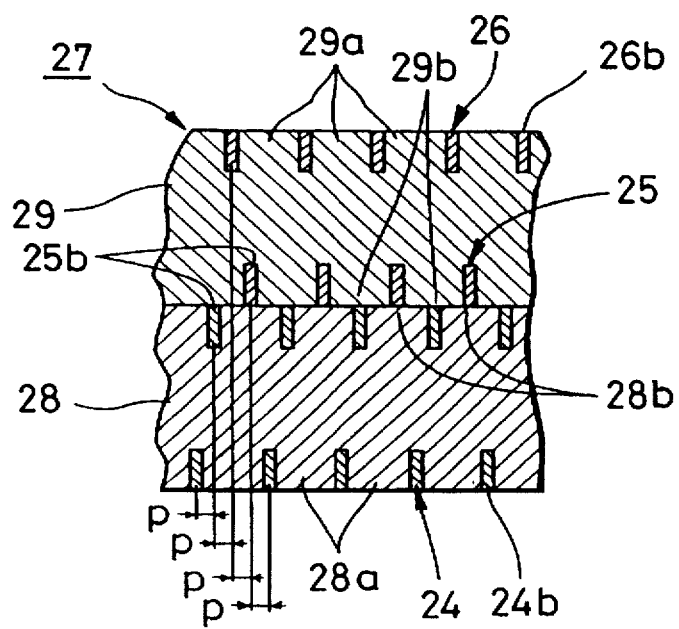
FIG. 49 is a sectional view as an analogue of FIG. 38, showing another example of core block modification according to FIG. 37 embodiment.

FIG. 49 shows another example of configuration of the core block 27 according to this embodiment. The core block 27 in the drawing comprises layers of a lower plate piece 28 and an upper plate piece 29. On a lower surface of the lower plate piece 28, a plurality of horizontal ribs 28a for regulating intervals of the base sections 24b of outer contact pins 24, out of the contact pins 24, 25, 26 arranged zigzag array in three rows, are integrally formed at a pitch width four times a pitch width p of the entire array of the contact pins 24, 25, 26; on an upper surface of the upper plate piece 29, a plurality of horizontal ribs 29a for regulating intervals of the base sections 26b of the inner contact pins 26 are integrally formed at the pitch width four times the pitch width p of the entire array of the contact pins 24, 25, 26; also, on an upper surface of the lower plate piece 28 and a lower surface of the upper plate piece 29, pluralities of horizontal ribs 28b, 29b for alternately regulating intervals of the base sections 25b of the middle contact pins 25 are integrally formed at the pitch width four times the pitch width p of the entire array of the contact pins 24, 25, 26. In short, two plate pieces 28, 29 each having vertical ribs formed on both surfaces thereof are used in this configuration. Phases of the pitch of the horizontal ribs 28a, 28b, 29a, 29b are orderly shifted among the corresponding surfaces of the plate pieces 28, 29 by the pitch width p of the entire array of the contact pins 24, 25, 26 in accordance with the order of zigzag arrangement of the contact pins 24, 25, 26.

In the configuration of the core block 27 shown in FIG. 49 also, the base sections 24b, 25b, 26b of the contact pins 24, 25, 26 arranged zigzag array in three rows can be stably supported at a narrow pitch width p not greater than 0.2 mm, upon thickness of the horizontal ribs 28a, 28b, 29a, 29b formed on respective surfaces of the plate pieces 28, 29 being secured to be greater than the narrow pitch width p of the zigzag array of the contact pins 24, 25, 26. If, for comparison, number of the contact pins in a zigzag array is supposed to be the same, greater thickness is secured for the ribs 28a, 29b shown in FIG. 49 than for the ribs 28a, 28b, 29a shown in FIG. 38 or the ribs 33a, 34a, 35a shown in FIG. 48. Therefore, this example of configuration allows specially fine pitch width of the contact pins 24, 25, 26. Additionally, the supporting structure of the base sections 24b, 25b, 26b shown in FIG. 49 does not prevent the contact portions 24a, 25a, 26a from being arranged as shown in FIG. 47.

Figure 50:
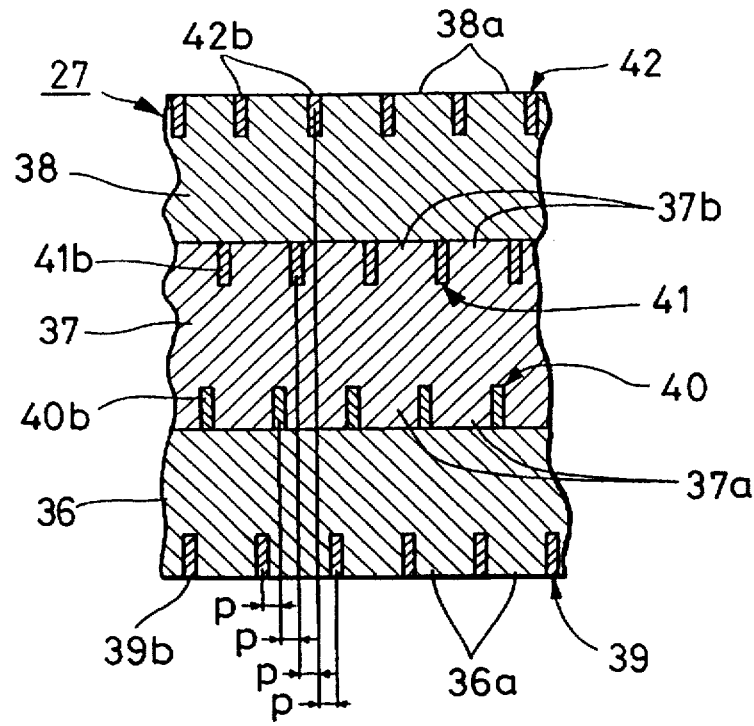
FIG. 50 is a sectional view as an analogue of FIG. 38, showing still another example of core block where contact pins are arranged in four rows to form a zigzag pattern.

FIG. 50 shows still another example of configuration of the core block 27 according to this embodiment, to be used with contact pins arranged zigzag in four rows. The core block 27 in the drawing comprises three layers of plate pieces 36, 37, 38. On a lower surface of the lower plate piece 36, a plurality of horizontal ribs 36a for regulating intervals of the base sections 39b of first contact pins 39 in an outermost row, out of contact pins 39, 40, 41, 42 arranged zigzag array in four rows, are integrally formed at a pitch width four times a pitch width p of the entire array of the contact pins 39, 40, 41, 42; on a lower surface of the middle plate piece 37, a plurality of horizontal ribs 37a for regulating intervals of the base sections 40b of the second contact pins 40 are integrally formed at the pitch width four times the pitch width p of the entire array of the contact pins 39, 40, 41, 42; on an upper surface of the middle plate piece 37, a plurality of horizontal ribs 37b for regulating intervals of the base sections 41b of the third contact pins 41 are integrally formed at the pitch width four times the pitch width p of the entire array of the contact pins 39, 40, 41, 42; and on an upper surface of the upper plate piece 38, a plurality of horizontal ribs 38a for regulating intervals of the base sections 42b of the fourth contact pins 41 in an innermost row are integrally formed at the pitch width four times the pitch width p of the entire array of the contact pins 39, 40, 41, 42. Phases of the pitch of the horizontal ribs 36a, 37a, 37b, 38a are orderly shifted among the selected surfaces of the plate pieces 36, 37, 38 by the pitch width p of the entire array of the contact pins in accordance with the order of zigzag arrangement of the contact pins 39–42.

In this configuration also, the base sections 39b–42b of the contact pins 39–42 arranged array in four rows can be stably supported at a narrow pitch width p not greater than 0.2 mm, upon thickness of the horizontal ribs 36a, 37a, 37b, 38a formed on the selected surfaces of the plate pieces 36, 37, 38 being secured to be greater than the narrow pitch width p of the zigzag array of the contact pins 39–42.

Figure 51:
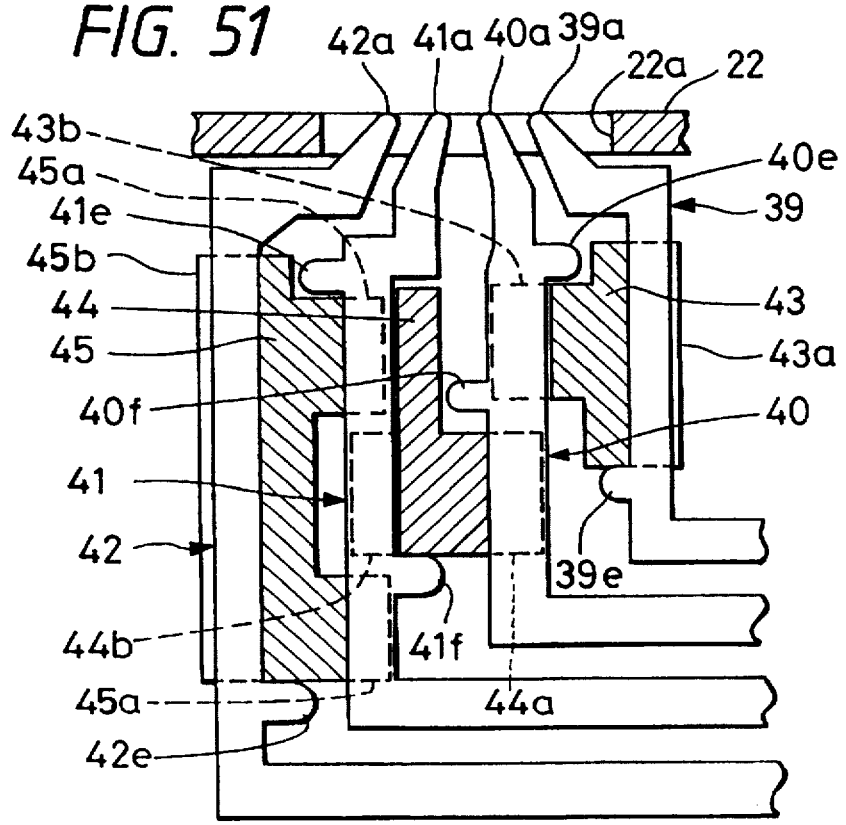
FIG. 51 is a sectional view as an analogue of FIG. 46, showing one example of separator member where contact pins are arranged in four rows to form a zigzag pattern.
Figure 52:
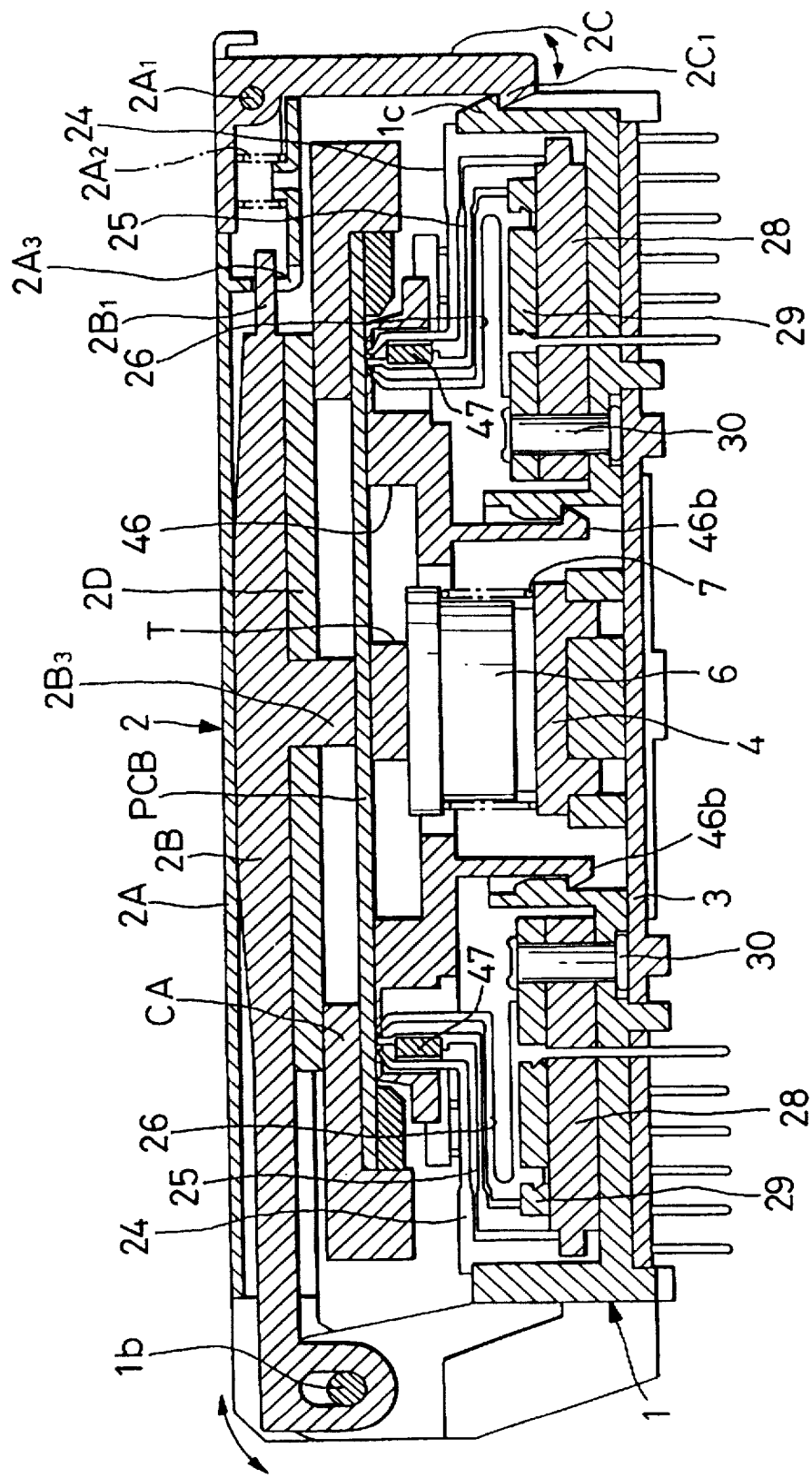
FIG. 52 is a sectional view, as an analogue of FIG. 2, of an IC socket according to a further additional embodiment of the present invention, illustrating a state where its cover is closed upon loading of an IC device.

FIG. 51 shows an example of configuration of supporting structure for the free end sections of the contact pins with the separator members in the case of the contact pins being arranged zigzag in four rows. As shown in the drawing, separator members 43, 44, 45 are respectively provided between the rows of the free end sections, which form contact portions 39a, 40a, 41a, 42a at ends thereof, of the contact pins 39, 40, 41, 42 arranged zigzag in four rows, and pluralities of vertical ribs 43a, 43b, 44a, 44b for regulating respective intervals of the free end sections of the contact pins 39, 40, 41, 42 which are arranged in their respective single rows on respective two sides of the separator members 43, 44, 45 are formed on respective two side faces of the separator members 43, 44, 45. Furthermore, upper side abutting portions 40e, 40f, 41e are formed on free end sections of contact pins arranged on one side of respective separator members 43, 44, 45 while lower side abutting portions 39e, 41f, 42e are formed on free end sections of contact pins arranged on the other, thereby vertical location of the outer separator members 43, 44, 45 being regulated. Therefore, the free end sections of the contact pins 39–42 arranged zigzag in four rows can be stably supported at a narrow pitch width p not greater than 0.2 mm, upon thickness of the vertical ribs 43a, 43b, 44a, 44b, 45a, 45b formed on the separator members 43, 44, 45 being secured to be greater than the narrow pitch width p of the zigzag array of the contact pins 39–42.

The foregoing description has been made only on some examples of the configurations according to this embodiment. It is to be understood that this embodiment can be variously modified in the scope of the invention, not limited to these configurations. For example, the core block is allowed to comprise three layers of plate pieces each forming pluralities of horizontal ribs on upper and lower surfaces thereof at a pitch width six times the pitch width of the contact pins arranged zigzag in four rows, for supporting the base sections of the contact pins.

Now, refering to FIG. 52 through FIG. 61, still another embodiment of the present invention will be described. This embodiment is different from the embodiment of FIG. 37–51 in the configuration of the floating member and the separator member.

Figure 53A:
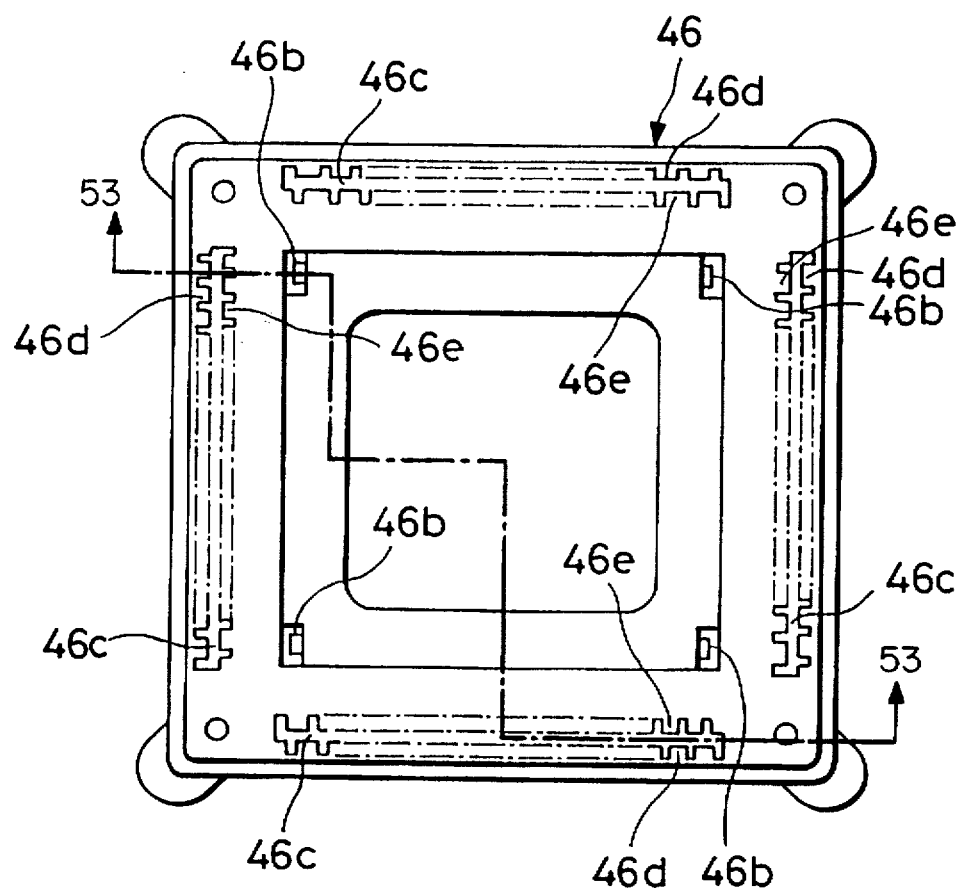
FIG. 53A is a plan view of a floating member according to the FIG. 52 embodiment.
Figure 53B:
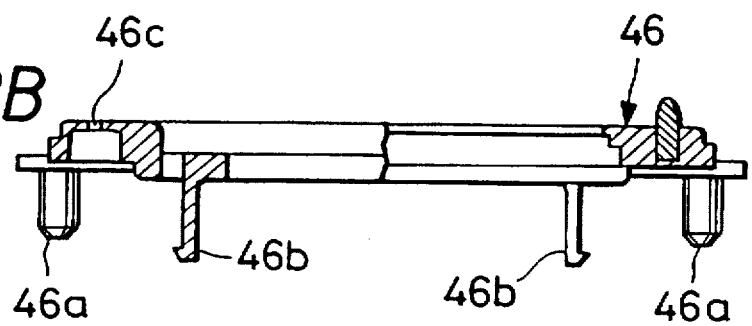
FIG. 53B is a sectional view taken along the line 53—53 of FIG. 53A.

The shape of the floating member 46 is illustrated in detail specifically in FIG. 53. On the lower side of the floating member 46, guide pins 41a are formed in the vicinity of overhangs provided at the four corners. The guide pins 46a are slidably fitted in guide holes not shown in the drawings but formed on the socket body 1 to make the floating member 46 movable vertically in the state shown in FIG. 52. The floating member 46 is urged upward by coil springs 23 partially appearing in FIG. 54, but its upward movement is limited by engagement of four flexible hook portions 46b with the socket body 1.

As shown in FIG. 53A, four through slots 46c are formed in the floating member 46 along four sides thereof. Each slot 46c has rows of ribs formed at regular intervals on both edges along its longitudinal direction. Phases of the regular arrangement of the ribs 46d formed on the outer edge and the ribs 46e formed on the inner edge are mutually shifted.

Figure 54:
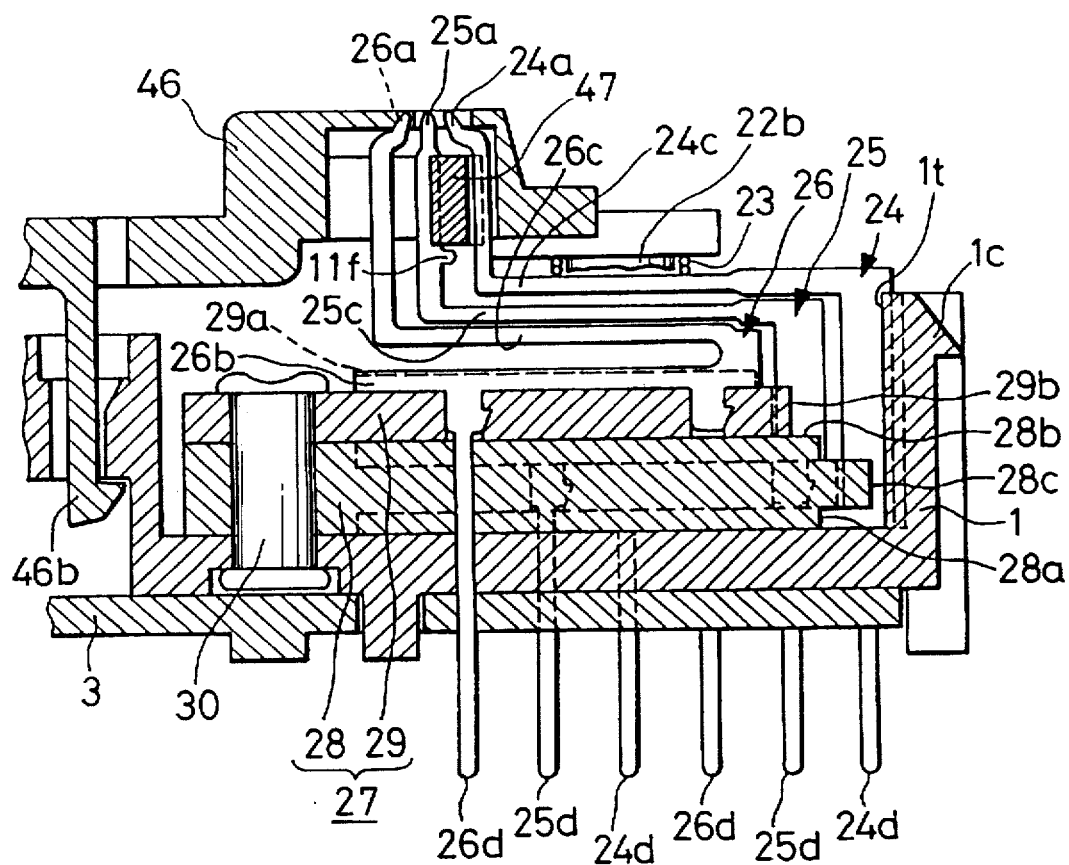
FIG. 54 is an enlarged sectional view of the main part of theIC socket according to the FIG. 52 embodiment.

The structure for supporting contact pins is shown in FIG. 54 utilizing the same symbols in FIGS. 37–39 for the same members. Since this structure has been detailed refering to FIGS. 37–39, explanation will be omitted to avoid redundancy.

Figure 55A:
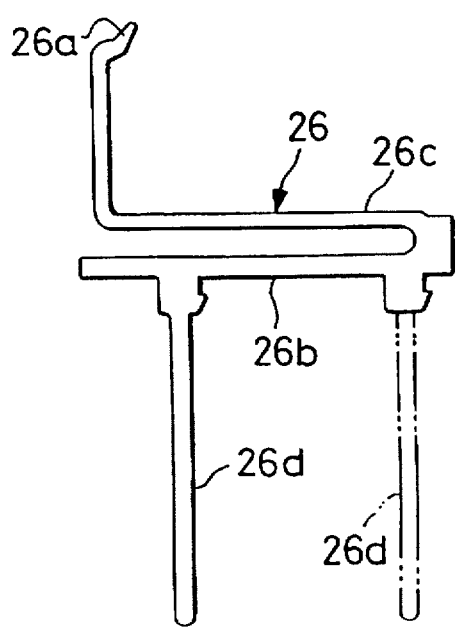
FIG. 55A–55C are side views of types of contact pins used for the FIG. 52 embodiment to show their shapes.
Figure 55B:
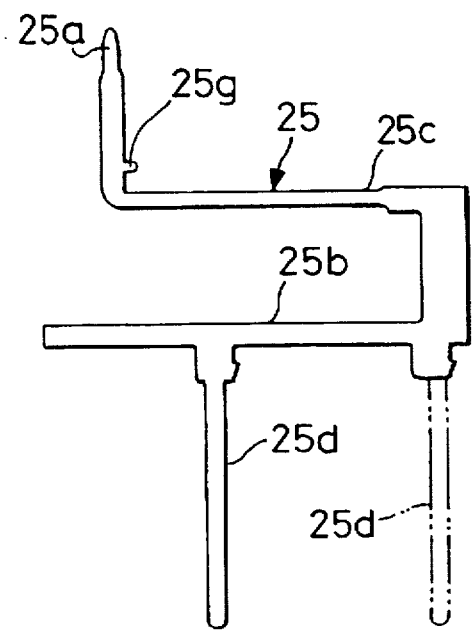
Figure 55C:
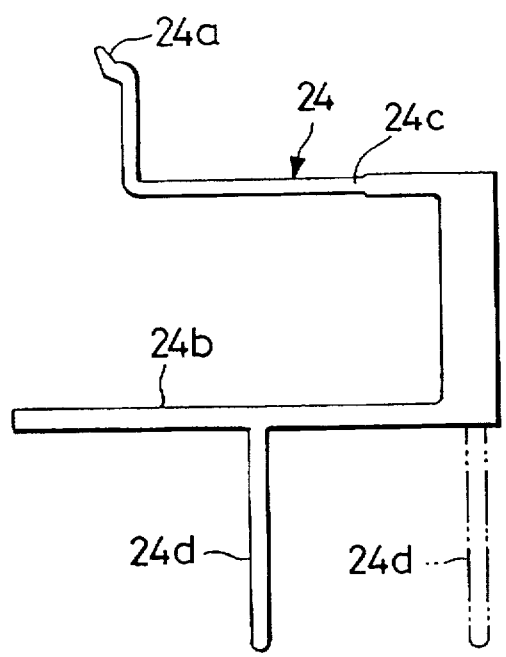

Now, referring to FIGS. 55A–55C, shapes of the contact pins will be described. An inner contact pin 26 shown in FIG. 55A has a connecting terminal 26d formed on a lower side of an L-shaped base section 26b thereof for connection with an external circuit, and a free end section, which has a contact portion 26a at an end thereof, formed on an upper side of the base section 26b with intervention of a spring section 26c which is vertically bending. There are two types of the inner contact pins 26; the connecting terminals 26d are selectively formed at an inner position indicated by the solid line or at an outer position indicated by the double dot & dash line. A middle contact pin 25 shown in FIG. 55B also has a connecting terminal 25d formed on a lower side of an L-shaped base section 25b thereof, and a spring section 25c and a free end section, which has a contact portion 25a at an end thereof, formed on an upper side of the base section 25b. On the free end section of the middle contact pin 25, a protrusion 25g also is formed. There are two types of the middle contact pins 25; the connecting terminals 25d are selectively formed at an inner position indicated by the solid line or at an outer position indicated by the double dot & dash line. An outer contact pin 24 shown in FIG. 55C has, similar to the inner contact pin 26, a base section 24b, a connecting terminal 24d, a spring section 24c and a free end section having a contact portion 24a at an end thereof. There are two types of the outer contact pins 24; the connecting terminals 24d are selectively formed at an inner position indicated by the solid line or at an outer position indicated by the double dot & dash line.

Since arrangement of the contact pins in relation to the plate pieces 28, 29 has already been described referring to FIGS. 37–39, explanation will be omitted.

Figure 56:
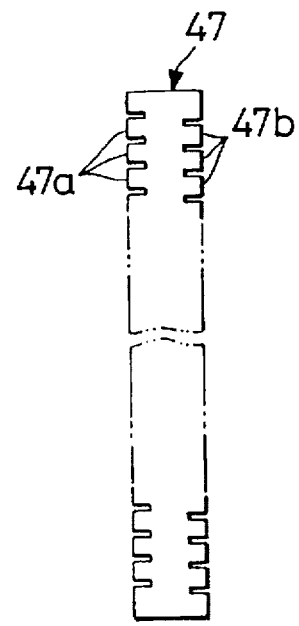
FIG. 56 shows a separator member according to the FIG. 52 embodiment.
Figure 57:
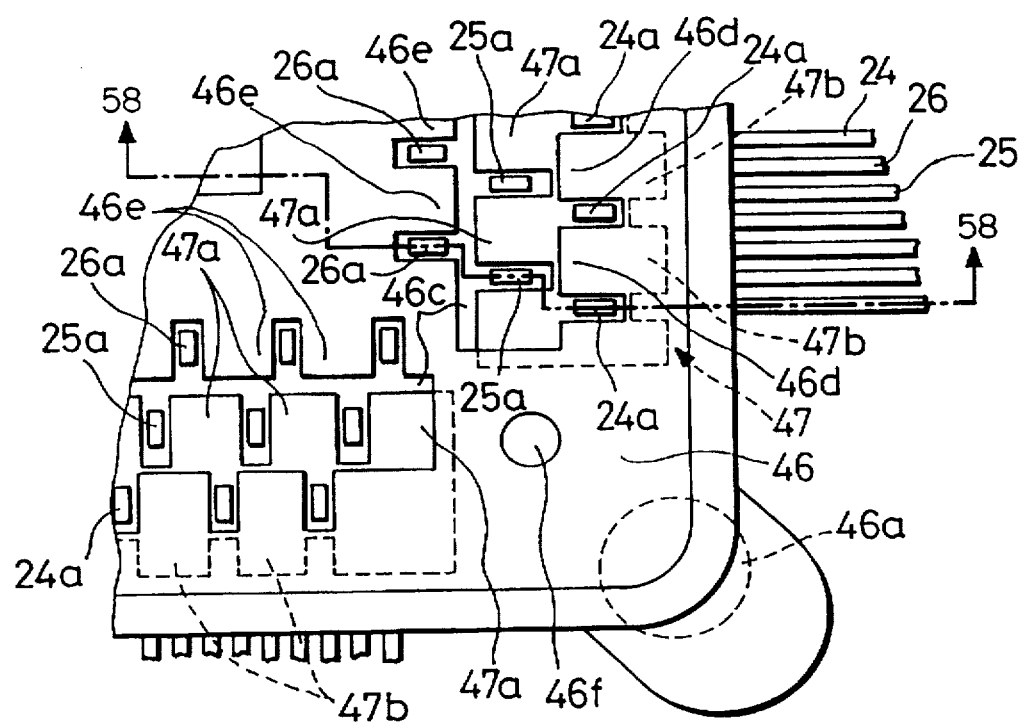
FIG. 57 illustrates relationship among a floating member, contact pins and a separator member according to the FIG. 52 embodiment.

Now, Referring to FIGS. 56–58, configuration for regulating locations of free end sections of the contact pins 26, 25, 24 using the floating member 46 will be described. FIG. 56 is a plan view of the separator member 47. As shown in the drawing, the separator member 47 forms ribs 47a arranged on a left side face thereof in one row at regular intervals, and ribs 47b regularly arranged on a right side face thereof in one row at the same pitch width as the ribs 46a with a phase of the pitch shifted by one third of the pitch width from the phase of the pitch of the ribs 47a. A row of the free end sections of the middle contact pins 25 are made engaged with the ribs 47a and a row of the free end sections of the outer contact pins 24 are made engaged with the ribs 47b, thereby the separator member 46 being held by and between the rows of the contact pins 24, 25. Therefore, as shown in FIG. 58, the protrusions 25g of the contact pins 25 are allowed to keep the separator member 47 from being displaced downward relative to the contact pins.

At the ends of the free end sections, the contact portions 26a of the inner contact pins 26 are engaged with the ribs 46e of the floating member 46 and the contact portions 24a of the outer contact pins 24 are engaged with the ribs 46d, while the middle contact pins 25a are just inserted into the slot 46c of the floating member without engagement with any ribs. As a result, all the contact pins are arranged so that the contact portions thereof are positioned at regular intervals in three rows with a phase of the pitch of one row being shifted from another row in a direction of the rows by one third of the pitch width of each row, to allow the IC socket to be applied to the TAB package having lead terminals F1, F2, F3 arranged zigzag in three rows as shown in FIG. 45.

Furthermore, since this configuration allows contact pins in each row to be sufficiently spaced among each other, mutual contact between adjacent pins in the row is impossible. Similarly, since this configuration does not require each row of ribs to have an extremely fine pitch, integral forming of each row of ribs out of synthetic resin is facilitated. Moreover, since no ribs for the contact portions 25a of the contact pins 25 are required to be formed on the floating member 46 as apparently seen in FIG. 57, this configuration is further advantageous with respect to the forming process of the floating member 46 also.

Figure 58:
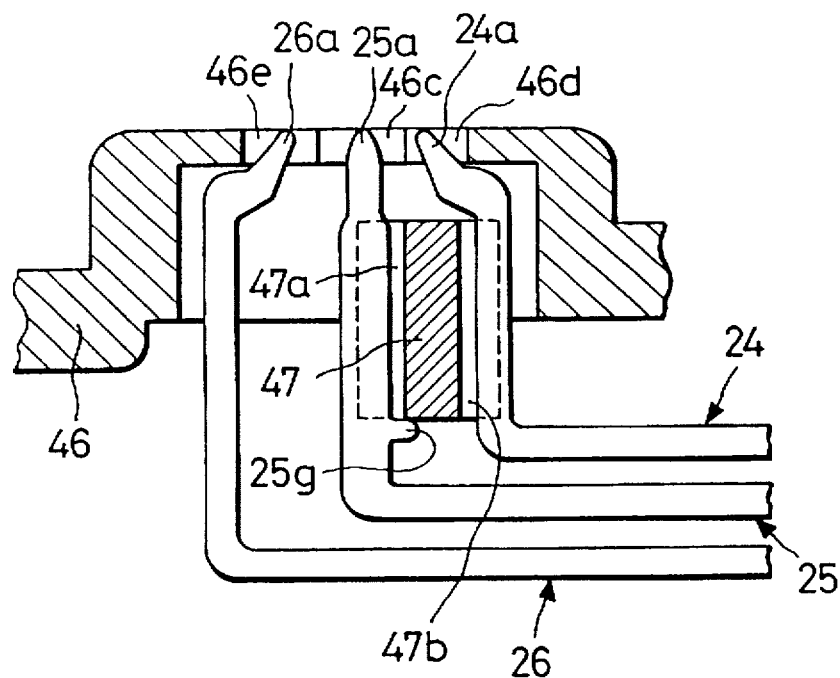
FIG. 58 is a sectional view taken along the line 58—58 of FIG. 57.

Since contact pins are made of thin plate material, force is often produced to warp them in a horizontal direction, i.e. direction perpendicular to the figure surface in FIG. 58 as the contact portions are pushed during loading of the TAB package. As for the contact pins 26, contact portions 26a are engaged with the ribs 46e to be less affected by the force. As for the contact pins 25, no row of ribs are provided to be engaged with the contact portions 25a, thus the force is applied to the contact portions 25a to shift them from their positions which correspond to the lead terminals F2 of the TAB package. However, according to this embodiment, locations of the rows of the contact pins 25, 26 are mutually regulated with intervention of the separator member 47, and the contact portions 24a of the contact pins 24 are engaged with the ribs 46d of the floating member 46. Therefore, the contact portions 25a are not substantially affected by the horizontal force.

As understood from the foregoing description, according to this embodiment as applied to the IC socket having contact pins arranged in a plurality of rows, contact portions of contact pins in one row are inserted into the slot of the floating member 46 without engagement with a row of ribs formed on the floating member, thereby minimizing a necessary number of rows of ribs formed on the floating member 46. Furthermore, the row of the contact pins not engaged with the ribs on the floating member 46 and a row of contact pins engagaed with a row of ribs on the floating member 46 are configured to hold the separator member 47 therebetween for the purpose of stably locating the contact portions in the slot. To attain the same purpose, the separator member 47 is allowed to be held between the contact pins 26 and the contact pins 25. In this alternative configuration, however, protrusions similar to the protrusions 25g have to be formed either on left sides of the contact pins 25 or on right sides of the contact pins 26.

Although in the foregoing, this embodiment is described as applied to the IC socket provided with three rows of contact pins, this is applicable to an IC socket having two rows of contact pins also by changing the configuration in FIG. 58 so that the contact pins 26 are removed. In this case, the ribs 36e are not necessary, but the phase shift between the rows of ribs formed on the separator member 27, plate pieces 28, 29, etc. should be modified to be one half of the pitch width of each row.

If this embodiment is to be applied to an IC socket having four rows of contact pins, the configuration shown in FIG. 58 will be changed so that one additional row of contact pins are provided between the row of the contct pin 26 and the row of the contact pins 25 to be inserted in the slot 46c. In this modified configuration, an additional separator member intervenes between the row of the contact pins 26 and the fourth row of the contact pins as a matter of course,. and in some cases, a third separator member may be further added to intervene between the fourth row of the contact pins and the row of the contact pins 25. Also, the phase shift between the ribs becomes one fourth of the pitch width of each rib.

Furthermore, if the above described two configurations are combined, IC socket having five rows of contact pins is realized. If the above mentioned configuration for the contact pins arranged in three rows is doubled, an IC socket having the contact pins arranged in six rows is realized. And if necessary, it is possible to arrange contact pins in more rows.

Figure 59:
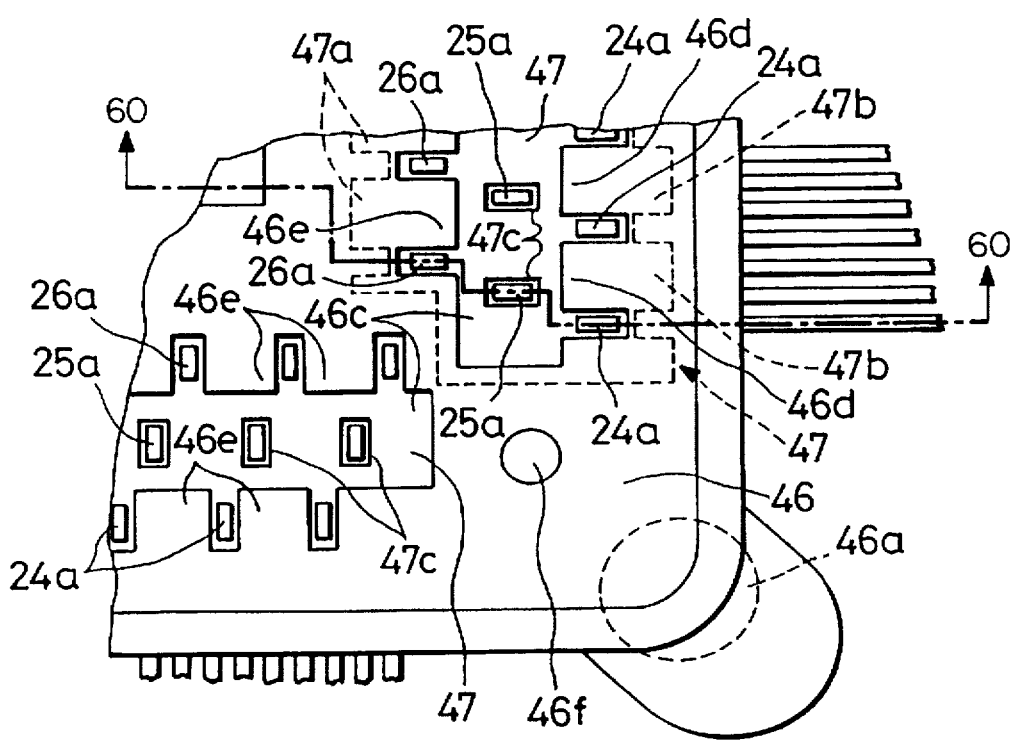
FIG. 59 illustrates relationship among a floating member, contact pins and a separator member according to an embodiment different from that of FIG. 52.
Figure 60:
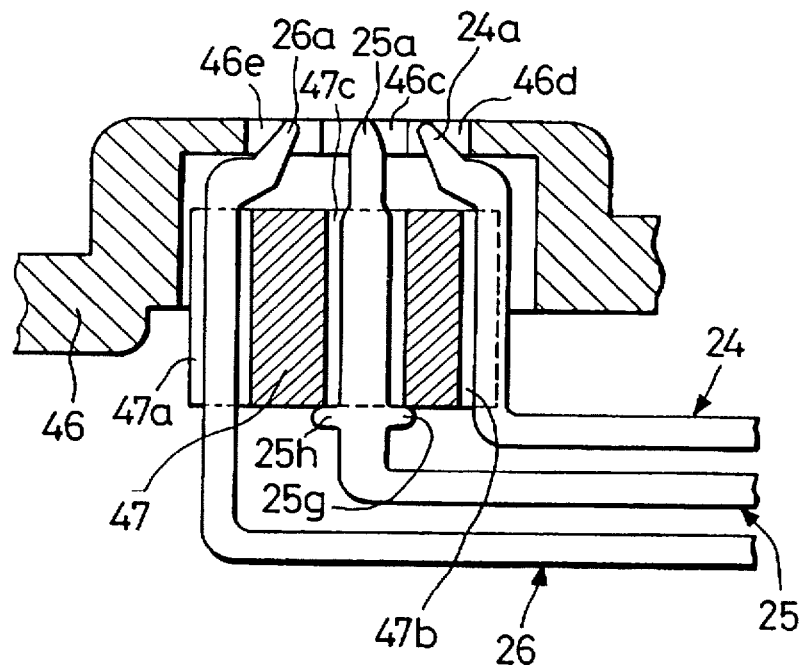
FIG. 60 is a sectional view taken along the line 60—60 of FIG. 59.

Next, the description will be made on an example of modification of this embodiment. This example is different only in relationship between the contact pins and the separator member. Thus, only this difference is explained using FIGS. 59–60. FIG. 59 is a view showing relationship among the floating member, contact pins and the separator member. FIG. 60 is a sectional view taken along the line 60—60 of FIG. 59. As shown in FIG. 59, on respective side faces of the separator member 47, a plurality of ribs 47a and a plurality of ribs 47b are formed at regular intervals, and in the center of the separator member, a plurality of through holes 47c are arranged in parallel with rows of the ribs 47a, 47b. Phase of the pitch of the holes 47b is shifted relative to the ribs 47a by one third of the pitch width in one direction and is shifted relative to the ribs 47b by one third of the pitch width in the opposite direction. The contact pins 25 are provided with protrusions 25h in addition to the protrusions 25g as shown in FIG. 60, because in using such a separator member 47, means for maintaining a positional relationship between the contact pins and the separator member to allow smooth sliding between the contact pins 26 and the rib 47a in engagement, between the contact pins 25 and the holes 47c in fitting condition, and between contact pins 24 and the ribs 47b in engagement is indispensable. The protrusions 25h are allowed to be replaced by similar protrusions formed on the contact pins 26 as a matter of course.

Although in this modified embodiment, the contact portions 26a, 24a of the contact pins 26, 24 are engaged with the rows of ribs 46e, 46d of the floating member 46 respectively, some cases allow one of the rows of the contact portions 26a, 24a to be just inserted into the slit 46c with only the other row of the contact portions engaged with one row of the ribs on the floating member. In such a case, the floating member 46 is structured to have only one row of ribs formed on one edge of the slot 46c along its longitudinal direction. Furthermore, this modified embodiment also is applicable to an IC socket having contact pins arranged in five or six rows.

Figure 61:
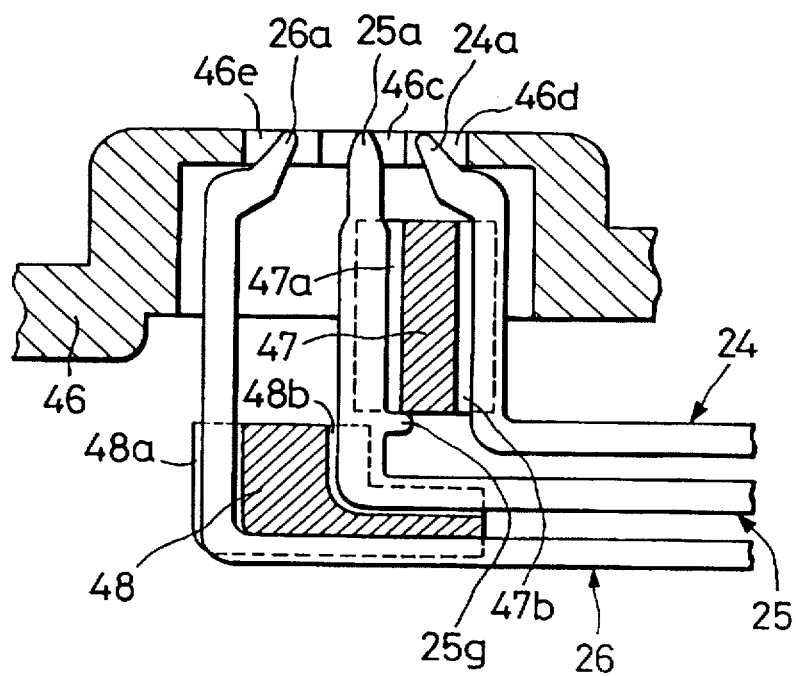
FIG. 61 is a sectional view as an analogue of FIG. 60, illustrating relationship among a floating member, contact pins and separator members according to an embodiment different from those of FIG. 52 and FIG. 59.

Next, another example of modification of this embodiment will be described using FIG. 61. In the drawing, the contact pins 26 and the contact pins 25 hold a separator member 48 having an L-shaped transverse section therebetween. On respective sides of the separator member 48, a plurality of L shaped ribs 48a and a plurality of ribs 48b are regularly arranged. The ribs 48b and the ribs 47a of the separator member 47 are to have the same phase of arrangement in the assembled condition. Phases of the pitch of the ribs 48a, the ribs 47a (or the ribs 48b), and the ribs 47b are orderly shifted by one third of the pitch width.

Since the separator member 48 has an L-shaped transverse section and is held by correspondingly shaped portions of the contact pins 25, 26 therebetween, means such as protusions 25h are not necessary. Of course, no reason prevents the L-shaped transverse section from being applied to the separator member 47 instead of the separator member 48, or from being applied to both of the separator members 47, 48.

Although in this modified embodiment the contact portions 26a, 24a of the contact pins 26, 24 are engaged with the rows of ribs 46e, 46d of the floating member 46 respectively, some cases allow one of the rows of the contact portions 26a, 24a to be just inserted into the slit 46c with only the other row of the contact portions engaged with one row of the ribs on the floating member, as in the above described modified embodiment.

In the foregoing descriptions on this embodiment and its modifications, explanation has been made based on the configuration in which at least one row of the contact portions of the contact pins are engaged with the ribs formed on the floating member. However, instead of the row of ribs, rows of holes are allowed to be formed on the floating member 46, so that the contact portions are fitted therein. Furthermore, this embodiment is applicable not only to the IC socket for the TAB packages having lead terminals arranged on its four sides, but also to IC sockets for verious electronic devices such as IC, LSI devices.

Figure 62A:
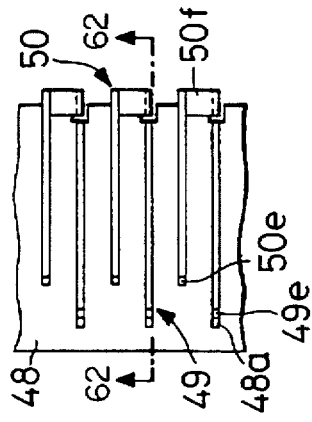
FIG. 62A is a plan view of a main part of a block body mounting contact pins according to an embodiment which has a mounting configuration different from that of the FIG. 21 embodiment.
Figures 62B, 62C:
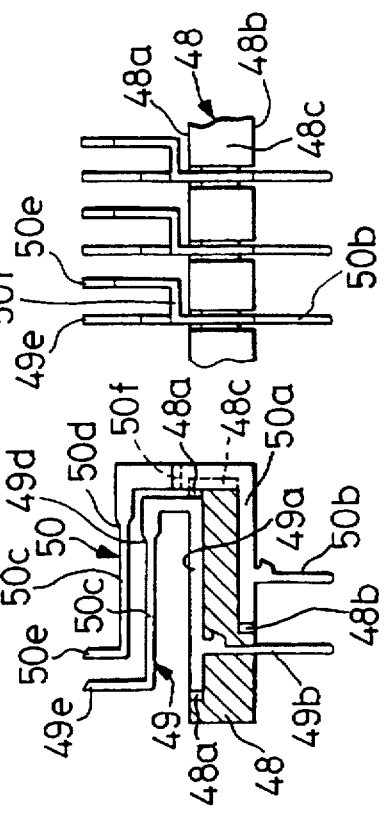
FIG. 62B is a sectional view taken along the line 62—62 of FIG. 62A.
FIG. 62C is a right-side view of the configuration shown in FIG. 62B.

Next, description will be made on an example of modification of the embodiment which has been described referring to FIGS. 21–36F. FIG. 62A shows a main part of this modified configuration, FIG. 62B is a sectional view taken along 62—62 of FIG. 62A, and FIG. 62C is a right-side view of FIG. 62B.

According to this modified embodiment, pluralities of ribs 48a, 48b are arranged at regular intervals on upper and lower surfaces of the core block 48 respectively. However, positional relationship between the upper side ribs 48a and the lower side ribs 48b is different from that according to the configuration already described; phases of pitch of the ribs 48a, 48b are not shifted from each other . Moreover, on an outer side face of the core block 48, ribs 48c are formed at regular intervals so that the ribs 48a and the ribs 48b are continuously linked with intervention of these ribs 48c.

Each first contact pin 49 of this modified embodiment has a connecting terminal 49b which is arranged on a substantially J-shaped base section 49a formed as one leg. Between the base section 49a and a free end section 49c formed as the other leg, a spring section 49d is formed. At an end of a vertically rising piece of the free end section 49c, a contact portion 49e is formed. Each second contact pin 50 has a connecting terminal 50b arranged on a substantially J-shaped base section 50a formed as one leg. Between the base section 50a and a free end section 50c formed as the other leg, a spring section 50d is formed. At an end of a vertically rising piece of the free end section 50c, a contact portion 50c is formed. Also, as shown in the drawings, a rising piece of the base section 50a forms a cranked portion 50f.

The first contact pins 49 are fixed to the core block 48 in such a manner that the base sections 49a are fitted in grooves between the ribs 48a with the connecting terminals 49b being inserted into holes formed in the core block 48. The second contact pins 50 are fixed to the core block 48 in such a manner that the base section 50a are fitted in grooves between continuous ribs including the ribs 48b, 48c with the connecting terminals 50b being inserted into perforations formed in the socket body 1. Consequently, the contact portions 49e, 50e form an zigzag array as shown in FIG. 62A, while the ribs 48a and the ribs 48b are arranged without phase shift. Since the free end sections 49c, 50c of the contact pins 49, 50 are located at different levels as shown in FIG. 62B, mutual contact between these contact pins is not caused even if the contact pins are warped or distorted.

Figure 63A:
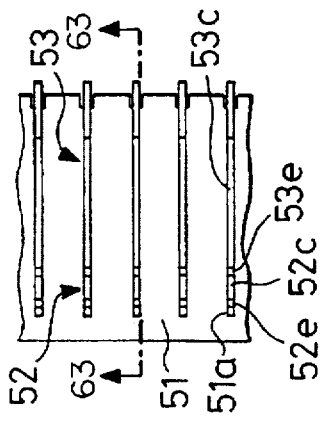
FIG. 63A is a plan view of a main part of a block body mounting contact pins according to an embodiment which has a mounting configuration different from those of the FIG. 21 and FIG. 62 embodiments.
Figures 63B, 63C:
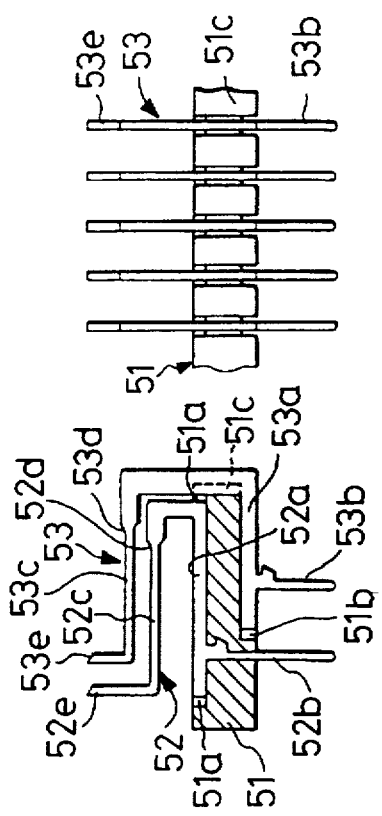
FIG. 63B is a sectional view taken along the line 63—63 of FIG. 63A.
FIG. 63C is a right-side view of the configuration shown in FIG. 63B.

Next, referring to FIGS. 63A–63C, another example of modification of the embodiment of FIGS. 21–36F will be explained. This modification is, as well as the above described example, unique in the configuration with respect to the contact pins and the core block to which the contact pins are fixed. Other configurations of this modification is identical to those of the embodiment already described using 21–36F, thus will not be detailed. FIG. 63A shows a main part of this modified configuration, FIG. 63B is a sectional view taken along 63—63 of FIG. 63A, and FIG. 63C is a right-side view of FIG. 63B.

According to this modified embodiment, pluralities of ribs 51a, 51b are arranged at regular intervals on upper and lower surfaces of the core block 51 respectively. Positional relationship between the upper side ribs 51a and the lower side ribs 51b is the same as the configuration according to the above described example; phases of pitch of the ribs 51a, 51b. are not shifted from each other. Also, on an outer side face of the core block 51, ribs 51c are formed at regular intervals so that the ribs 51a and the ribs 51b are continuously linked with intervention of these ribs 51c.

According to this modified embodiment, first contact pins 52 have a same shape as that of the first contact pins 49 of the above described example, while second contact pins 53 are not provided with such cranked portions as found in the second contact pins 50 of the above described example. The contact pins 52, 53 are provided with base sections 52a, 53a, connecting terminals 52b, 53b, free end sections 52c, 53c, spring sections 52d, 53d, and contact portions 52e, 53e also.

The first contact pins 52 and the second contact pins 53 are fixed to the core block 51 in the same manner as described for the example above. Consequently, the contact portions 52e, 53e are arranged not alternately but in parallel as shown in FIG. 63A. Since the free end sections 52c, 53c of the contact pins 52, 53 are located at different levels as shown in FIG. 63B, mutual contact between these contact pins is not caused even if the contact pins are warped or distorted. Furthermore, according to this example of modified embodiment, intervals between the first contact pins 52 in themselves and intervals between the second contact pins 53 in themselves are allowed to be twice as wide as the interval between adjacent first and second contact pins 49, 50 according to the above example. Therefore, mutual contact in the first contact pins 52 and mutual contact in the second contact pins 53 can be avoided with finer arrangement of the contact portions being attained.

Figure 64A:
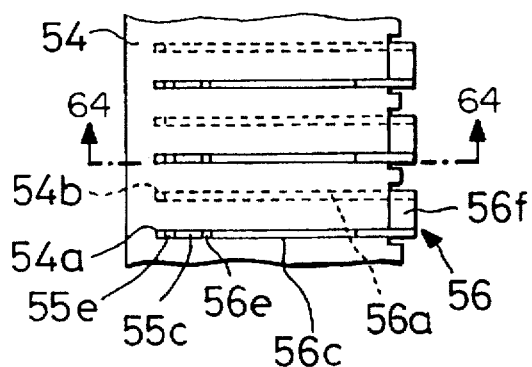
FIG. 64A is a plan view of a main part of a block body mouning contact pins according to an embodiment which has a mounting configuration different from those of the FIG. 21, FIG. 62A and FIG. 63A embodiments.
Figure 64B:
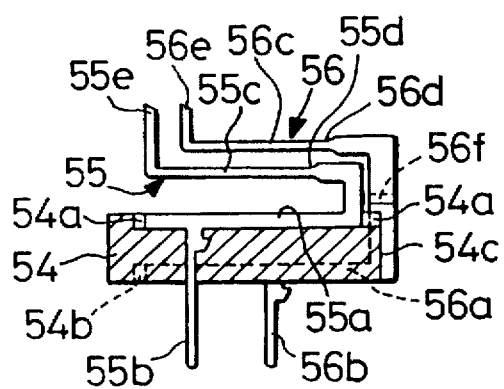
FIG. 64B is a sectional view taken along the line 64—64 of FIG. 64A.
Figure 64C:
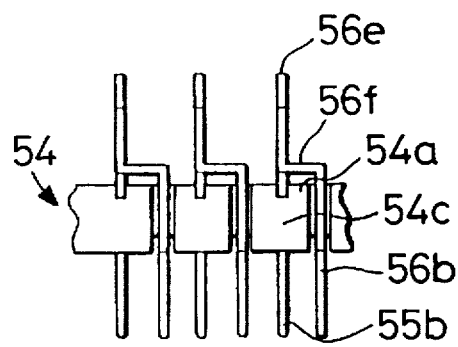
FIG. 64C is a right-side view of the configuration shown in FIG. 64B.

Next, referring to FIGS. 64A–64C, still another example of modification of the embodiment of FIGS. 21-36F will be explained. This modification is, as well as the above described examples, unique in the configuration with respect to the contact pins and the core block to which the contact pins are fixed. Other configurations of this modification is identical to those of the embodiment already described using 21–36F, thus will not be detailed. FIG. 64A shows a main part of this modified configuration. FIG. 64B is a sectional view taken along 64—64 of FIG. 64A, and FIG. 64C is a right-side view of FIG. 64B.

According to this modified embodiment, pluralities of ribs 54a, 54b are arranged at regular intervals on upper and lower surfaces of the core block 54 respectively. Positional relationship between the upper side ribs 54a and the lower side ribs 54b is the same as the configuration of the embodiment of FIGS. 21–36F; phases of pitch of the ribs 51a, 51b are shifted by one half of the pitch width from each other. Also, on an outer side face of the core block 54, ribs 54c are formed at regular intervals to be continuously linked to the ribs 54b.

According to this modified embodiment, first contact pins 55 have a same shape as that of the first contact pins 49, 52 of the above described examples, while second contact pins 56 are provided with cranked portions 56f formed by bending in a direction opposite to the bending direction of the cranked portions 50f of the second contact pin 50 of the first example described above. The contact pins 55, 56 are provided with base sections 55a, 56a, connecting terminals 55b, 56b, free end sections 55c, 56c, spring sections 55d, 56d, and contact portions 55e, 56e also.

The first contact pins 55 are fixed to the core block 54 in the same manner as described for the above examples. The second contact pins 56 are fixed to the core block 54 in such a manner that the base section 56a are fitted in grooves between continuous ribs including the ribs 54b, 54c. Consequently, the contact portions 55e, 56e are arranged not alternately but in parallel as shown in FIG. 64A in spite that the phases of the pitch of the ribs 54a, 54b are shifted from each other. Since the free end sections 55c, 56c of the contact pins 55, 56 are located at different levels as shown in FIG. 64B, mutual contact between these contact pins is not caused even if the contact pins are warped or distorted.

Through the foregoing descriptions on the embodiments and their modifications according to the present invention, the TAB package has been referred to as an IC device to be loaded in the IC socket of the present invention. However, not limited to the TAB package, the present invention is also applicable to IC sockets for QFP type IC device, verious kinds of IC packages, and such a device as has lead terminals arranged on two sides of its IC chip. Furthermore, althrough the foregoing discussions have been made based on the condition that the IC device to be loaded in the IC socket has finely arranged lead terminals, it is needless to say that the present invention can be reduced to embody IC sockets for IC devices having lead terminals arranged at an ordinary pitch width.

What is claimed is:

1. An IC socket comprising:

a socket body having a substantially quadrangular shape as viewed from a top;

a cover combinable with said socket body for loading an IC device at a predetermined position in said socket body;

a plurality of separator members arranged along at least two mutually opposite sides of the quadrangular shape of said socket body such that one separator member is assigned to one side of the quadrangular shape, each of said plurality of separator members having a first ribs-row formed on one side face thereof and a second ribs-row formed on an opposite side face thereof, said first ribs-row including a multitude of ribs arranged at regular intervals, said second ribs-row including a multitude of ribs arranged at same regular intervals as inter-rib intervals of said first ribs-row with a phase shifted from the ribs in said first ribs-row;

a plurality of first contact pins each having elasticity and assuming a substantially U shape, each of said plurality of first contact pins having a free end section with a contact portion at an end thereof, said free end section of each of said first contact pins being engaged between the ribs in said first ribs-row of each of said separator members; and a plurality of second contact pins each having elasticity and assuming a substantially U shape, each of said plurality of second contact pins having a free end section with a contact portion at an end thereof, said free end section of each of said second contact pins being engaged between the ribs in said second ribs-row of each of said separator members, wherein each of said separator members is floatingly held by and between said first contact pins and said second contact pins.

2. An IC socket according to claim 1, further comprising a plurality of core members arranged along said at least two mutually opposite sides of the quadrangular shape such that one core member is assigned to one side of the quadrangular shape, each of said plurality of core members having a third ribs-row and a fourth ribs-row formed on each of two surfaces thereof opposite to each other, said third ribs-row including a multitude of ribs arranged at regular intervals, said fourth ribs-row including a multitude of ribs arranged at same regular intervals as inter-rib intervals of said third ribs-row with a phase shifted from the ribs in said third ribs-row, wherein said first contact pins include engagement portions to be engaged between the ribs in the third ribs-rows of said core members and connecting terminals protruding outward from said socket body, and said second contact pins include engagement portions to be engaged between the ribs in the fourth ribs-rows of said core members and connecting terminals protruding outward from said socket body.

3. An IC socket according to claim 2, wherein said first contact pins and said second contact pins are arranged in said socket body so as to lie on a lateral side of the U shape thereof, each of the ribs in said first and second ribs-rows extends vertically, and the free end section of each of said first and second contact pins is provided with abutting portions which are allowed to meet a top surface and a bottom surface of each of said separator members.

4. an IC socket according to claim 3, wherein the U-shape of said first contact pins is formed larger than the U-shape of said second contact pins, and said third ribs-row and said fourth ribs-row are formed close to each other on each of the surfaces opposite to each other of each of said core members.

5. An IC socket according to claims 2, wherein the U-shape of said first contact pins is formed larger than the U-shape of said second contact pins, and said third ribs-row and said fourth ribs-row are formed close to each other on each of the surfaces opposite to each other of each of said core members.

6. An IC socket according to claims 1, wherein said first contact pins and said second contact pins are arranged in said socket body so as to lie on a lateral side of the U shape thereof, each of the ribs in said first and second ribs-rows extends vertically, and the free end section of each of said first and second contact pins is provided with abutting portions which are allowed to meet a top surface and a bottom surface of each of said separator members.

7. An IC socket according to claim 6, wherein the U-shape of said first contact pins is formed larger than the U-shape of said second contact pins, and said third ribs-row and said fourth ribs-row are formed close to each other on each of the surfaces opposite to each other of each of said core members.

8. An IC socket according to any one of claims 2, 5, 3, 7 or 4, wherein said socket body is provided with at least one of a ribs-row to be engaged with the lower sections of said first contact pins and a ribs-row to be engaged with the lower sections of said second contact pins.

9. An IC socket comprising:
a socket body having a substantially quadrangular shape as viewed from a top;
a cover combinable with said socket body for loading an IC device at a predetermined position in said socket body;
a floating member mounted to said socket body so as to be vertically displaceable relative thereto and having a plurality of slots which are arranged along at least two mutually opposite sides of the quadrangular shape of said socket body such that one slot is assigned to one side of the quadrangular shape, a first ribs-row being formed along at least one side edge of each of said plurality of slots;
a plurality of contact pins, each of which has a free end section having a contact portion, a base section having a connecting terminal for an external circuit, and a spring section formed between said free end section and said base section, mounted to said socket body such that the contact portions thereof are arranged in separate rows to form a plurality of pins-rows along each of said at least two mutually opposite sides of the quadrangular shape; and
a plurality of separator members arranged along said at least two mutually opposite sides of the quadrangular shape such that at least one separator member is assigned to one side of the quadrangular shape, each separator member having a second ribs-row and a third ribs-row, which are arranged with phases thereof mutually shifted and respectively engaged with two of the pins-rows so that said separator member is held by the two pin-rows therebetween, wherein the contact portions of the contact pins in at least one of the two pins-row holding said separator member therebetween are engaged with the first ribs-row and the contact portions of the contact pins in at least one of remaining pins-rows are inserted in said slot of said floating member.

10. An IC socket comprising:
a socket body having a substantially quadrangular shape as viewed from a top;
a cover combinable with said socket body for loading an IC device at a predetermined position in said socket body;
a floating member mounted to said socket body so as to be vertically displaceable relative thereto and having a plurality of slots which are arranged along at least two mutually opposite sides of the quadrangular shape of said socket body such that one slot is assigned to one side of the quadrangular shape, a first ribs-row being formed along one side edge of each of said plurality of slots;
a plurality of contact pins, each of which has a free end section having a contact portion, a base section having a connecting terminal for an external circuit, and a spring section formed between said free end section and said base section, mounted to said socket body such that the contact portions thereof are arranged in separate rows to form a first pins-row and a second pins-row along each of said at least two mutually opposite sides of the quadrangular shape; and
a plurality of first separator members arranged along said at least two mutually opposite sides of the quadrangular shape such that one first separator member is assigned to one side of the quadrangular shape, each first separator member having a second ribs-row and a third ribs-row, which are arranged with phases thereof mutually shifted and respectively engaged with the first pins-row and the second pins-row so that said first separator member is held by the first pins-row and the second pins-row therebetween, wherein the contact portions of the contact pins in the first pins-row are engaged with the first ribs-row and the contact portions of the contact pins in the second pins-row are inserted in said slot of said floating member.

11. An IC socket according to claim 10, wherein said floating member further forms a fourth ribs-row arranged along an opposite side edge of each of said plurality of slots so that phases of said first ribs-row and said fourth ribs-row are mutually shifted, said IC socket further comprises another plurality of contact pins, each of which has a free end section having a contact portion, a base section having a connecting terminal for the external circuit, and a spring section formed between said free end section and said base section thereof, mounted to said socket body such that the contact portions thereof are arranged in separate rows to form a third pins-row and a fourth pins-row along each of said at least two mutually opposite sides of the quadrangular shape, said IC socket further comprises a plurality of second separator members arranged along said at least two mutually opposite sides of the quadrangular shape such that one second separator member is assigned to one side of the quadrangular shape, each second separator member having a fifth ribs-row and a sixth ribs-row, which are arranged with phases thereof mutually shifted and respectively engaged with the third pins-row and the fourth pins-row so that said second separator member is held by the third pins-row and the fourth pins-row therebetween, and the contact portions of the contact pins in the third pins-row are engaged with the fourth ribs-row and the contact portions of the contact pins in the fourth pins-row are inserted in said slot of said floating member.

12. An IC socket according to claim 11, further comprising a plurality of third separator members arranged along said at least two mutually opposite sides of the quadrangular shape such that one third separator member is assigned to one side of the quadrangular shape, each third separator member having a seventh ribs-row and an eighth ribs-row, which are arranged with phases thereof mutually shifted and respectively engaged with the second pins-row and the fourth pins-row.

13. An IC socket according to claim 10, wherein each of said first separator members has a plurality of holes arranged in a row between said second ribs-row and said third ribs-row with a phase shifted from said second ribs-row and said third ribs-row, and said IC socket further comprises another plurality of contact pins, each of which has a free end section having a contact portion, a base section having a connecting terminal for the external circuit, and a spring section formed between said free end section and said base section thereof, mounted to said socket body and inserted through into said holes of each first separator member so that contact portions thereof are arranged in a row to form a third pins-row between said first pins-row and said second pins-row along each of said at least two mutually opposite sides of the quadrangular shape.

14. An IC socket according to claim 13, wherein said floating member further forms a fourth ribs-row arranged along an opposite side edge of each of said plurality of slots so that phases of said first ribs-row and said fourth ribs-row are mutually shifted.

15. An IC socket comprising:
a socket body having a substantially quadrangular shape as viewed from a top;
a cover combinable with said socket body for loading an IC device at a predetermined position in said socket body;
a floating member mounted to said socket body so as to be vertically displaceable relative thereto and having a plurality of slots which are arranged along at least two mutually opposite sides of the quadrangular shape of said socket body such that one slot is assigned to one side of the quadrangular shape, a first ribs-row and a second ribs-row being respectively formed on along two mutually opposite side edges of each of said plurality of slots so as to be arranged with phases thereof mutually shifted;
a plurality of contact pins, each of which has a free end section having a contact portion, a base section having a connecting terminal for an external circuit, and a spring section formed between said free end section and said base section, mounted to said socket body such that the contact portions thereof are arranged in separate rows to form a first pins-row, a second pins-row and a third pins-row along each of said at least two mutually opposite sides of the quadrangular shape; and
a plurality of first separator members arranged along said at least two mutually opposite sides of said quadrangular shape such that one first separator member is assigned to one side of the quadrangular shape, each first separator member having a third ribs-row and a fourth ribs-row, which are arranged with phases thereof mutually shifted and respectively engaged with one of the first pins-row and the third pins-row and the second pins-row so that said first separator member is held by one of the first pins-row and the third pins-row and the second pins-row therebetween,
wherein the contact portions of the contact pins in the first pins-row are engaged with the first ribs-row, the contact portions of the contact pins in the second pins-rows are inserted in said slot of said floating member, and the contact portions of the contact pins in the third pins-row are engaged with the second ribs-row.

16. An IC socket according to claim 15, further including a plurality of second separator members arranged along said at least two mutually opposite sides of the quadrangular shape such that one second separator member is assigned to one side of the quadrangular shape, each second separator member having a fifth ribs-row and a sixth ribs-row, which are arranged with phases thereof mutually shifted, and held by the other of the first pins-row and the third pins-row and the second pins-row therebetween.

17. An IC socket according to any one of claims 9, 10, 11, 12, 15 or 16, wherein each of the free end sections of the contact pins has a cranked portion, and at least one of the separator members assigned to each side of the quadrangular shape is held by the cranked portions of the contact pins in two pin-rows therebetween.

18. An IC socket comprising:
a socket body having a substantially quadrangular shape as viewed from a top;
a cover combinable with said socket body for loading an IC device at a predetermined position in said socket body;
a plurality of separator members arranged along at least two mutually opposite sides of the quadrangular shape of said socket body such that at least one separator member is assigned to one side of the quadrangular shape, a ribs-row constructed of a plurality of ribs which are arranged at regular intervals being formed on each of mutually opposite side faces of each separator member; and
a plural sets of elastic contact pins, each of the sets including one plurality of contact pins, said plural sets of contact pins being fixed to said socket body such that each of the sets is arranged along said at least two mutually opposite sides of the square shape, each contact pin having a contact portion at a tip of a free end section thereof,
each ribs-row of said at least one separator member arranged along each of said at least two mutually opposite sides of the quadrangular shape being engaged with the free end sections of contact pins included in one of the sets so that each of said at least one separator member is floatingly held by and between contact pins included in two of the sets on each of said at least two mutually opposite sides of the quadrangular shape.

* * * * *

UNITED STATES PATENT AND TRADEMARK OFFICE
CERTIFICATE OF CORRECTION

| | |
|---|---|
| PATENT NO. | : 5,788,513 |
| DATED | : August 4, 1998 |
| INVENTOR(S) | : Kajiwara et al. |

It is certified that error appears in the above-identified patent and that said Letters Patent is hereby corrected as shown below:

Column 33,
Line 47, (claim 8, line 1) change "claims 2, 5, 3, 7" to -- claims 2, 6, 5, 3, 7 --.

Signed and Sealed this

Twenty-third Day of October, 2001

Attest:

*Nicholas P. Godici*

NICHOLAS P. GODICI
*Attesting Officer*   *Acting Director of the United States Patent and Trademark Office*